(12) United States Patent
Carlson

(10) Patent No.: US 10,644,105 B2
(45) Date of Patent: May 5, 2020

(54) MEMORY DEVICE INCLUDING VOIDS BETWEEN CONTROL GATES

(71) Applicant: Micron Technology, Inc., Boise, ID (US)

(72) Inventor: Chris M. Carlson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/197,217

(22) Filed: Nov. 20, 2018

(65) Prior Publication Data

US 2019/0109190 A1    Apr. 11, 2019

Related U.S. Application Data

(62) Division of application No. 15/675,130, filed on Aug. 11, 2017, now Pat. No. 10,164,009.

(51) Int. Cl.

| | |
|---|---|
| *H01L 29/06* | (2006.01) |
| *H01L 27/11521* | (2017.01) |
| *H01L 27/11556* | (2017.01) |
| *H01L 27/11568* | (2017.01) |
| *H01L 27/11582* | (2017.01) |
| *H01L 21/764* | (2006.01) |

(Continued)

(52) U.S. Cl.
CPC ........ *H01L 29/0649* (2013.01); *H01L 21/764* (2013.01); *H01L 27/11521* (2013.01); *H01L 27/11556* (2013.01); *H01L 27/11568* (2013.01); *H01L 27/11582* (2013.01); *G11C 16/0483* (2013.01); *G11C 16/06* (2013.01)

(58) Field of Classification Search
CPC ............... H01L 29/0649; H01L 21/764; H01L 21/8221; H01L 27/11521; H01L 27/11556; H01L 27/11568; H01L 27/11582; G11C 16/0483; G11C 16/06
USPC ........................................................ 257/314
See application file for complete search history.

(56) References Cited

U.S. PATENT DOCUMENTS

| | | |
|---|---|---|
| 6,674,138 B1 | 1/2004 | Halliyal et al. |
| 7,052,967 B2 | 5/2006 | Lee et al. |

(Continued)

FOREIGN PATENT DOCUMENTS

| | | |
|---|---|---|
| KR | 101017713 B1 | 2/2011 |
| KR | 20110034816 A | 4/2011 |

(Continued)

OTHER PUBLICATIONS

"International Application Serial No. PCT/US2018/044353, International Search Report dated Nov. 14, 2018", 3 pgs.

(Continued)

*Primary Examiner* — Tu-Tu V Ho
(74) *Attorney, Agent, or Firm* — Schwegman Lundberg & Woessner, P.A.

(57) ABSTRACT

Some embodiments include apparatuses and methods of forming the apparatuses. One of the apparatuses includes a channel to conduct current, the channel including a first channel portion and a second channel portion, a first memory cell structure located between a first gate and the first channel portion, a second memory cell structure located between a second gate and the second channel portion, and a void located between the first and second gates and between the first and second memory cell structures.

18 Claims, 60 Drawing Sheets

(51) Int. Cl.
  *G11C 16/06* (2006.01)
  *G11C 16/04* (2006.01)

(56) References Cited

U.S. PATENT DOCUMENTS

| | | |
|---|---|---|
| 7,804,120 B2 | 9/2010 | Lee et al. |
| 7,999,304 B2 | 8/2011 | Ozawa et al. |
| 8,034,693 B2 | 10/2011 | Shibata et al. |
| 8,148,789 B2 | 4/2012 | Kito et al. |
| 9,136,128 B2 | 9/2015 | Lee et al. |
| 9,177,966 B1 | 11/2015 | Rabkin et al. |
| 9,343,316 B2 | 5/2016 | Lee et al. |
| 9,406,694 B1 | 8/2016 | Ikeno et al. |
| 9,679,778 B2 | 6/2017 | Lee et al. |
| 9,679,907 B1 | 6/2017 | Kaneko |
| 9,748,262 B1 | 8/2017 | Lai et al. |
| 9,997,533 B2 * | 6/2018 | Yoshimizu ........ H01L 27/11582 |
| 10,134,597 B2 | 11/2018 | Lee et al. |
| 10,164,009 B1 | 12/2018 | Carlson |
| 10,446,572 B2 | 10/2019 | Carlson |
| 10,453,855 B2 | 10/2019 | Carlson et al. |
| 2002/0008261 A1 | 1/2002 | Nishiyama |
| 2007/0184615 A1 | 8/2007 | Brazzelli et al. |
| 2007/0257305 A1 | 11/2007 | Sasago et al. |
| 2007/0296016 A1 | 12/2007 | Nagano et al. |
| 2008/0012061 A1 | 1/2008 | Ichige et al. |
| 2008/0054341 A1 | 3/2008 | Natori et al. |
| 2008/0197403 A1 | 8/2008 | Ozawa et al. |
| 2008/0246078 A1 | 10/2008 | Huo et al. |
| 2008/0283898 A1 | 11/2008 | Kuniya |
| 2009/0101883 A1 | 4/2009 | Lai et al. |
| 2009/0302367 A1 | 12/2009 | Nagano |
| 2010/0003795 A1 | 1/2010 | Park et al. |
| 2010/0019311 A1 | 1/2010 | Sato et al. |
| 2010/0044772 A1 | 2/2010 | Yonemochi et al. |
| 2010/0078758 A1 | 4/2010 | Sekar et al. |
| 2010/0133525 A1 | 6/2010 | Arai et al. |
| 2010/0176368 A1 | 7/2010 | Ko et al. |
| 2010/0176438 A1 | 7/2010 | Lue et al. |
| 2010/0187593 A1 | 7/2010 | Morikado |
| 2010/0190330 A1 | 7/2010 | Yonemochi et al. |
| 2010/0213537 A1 | 8/2010 | Fukuzumi et al. |
| 2010/0295113 A1 | 11/2010 | Kang et al. |
| 2011/0097887 A1 | 4/2011 | Aoyama et al. |
| 2011/0104883 A1 | 5/2011 | Nagano |
| 2011/0108905 A1 | 5/2011 | Ichige et al. |
| 2011/0193153 A1 | 8/2011 | Higuchi et al. |
| 2011/0298013 A1 | 12/2011 | Hwang et al. |
| 2011/0300703 A1 | 12/2011 | Sato et al. |
| 2011/0303967 A1 | 12/2011 | Harari et al. |
| 2011/0309425 A1 | 12/2011 | Purayath et al. |
| 2011/0309426 A1 | 12/2011 | Purayath et al. |
| 2011/0309430 A1 | 12/2011 | Purayath et al. |
| 2012/0001252 A1 | 1/2012 | Alsmeier et al. |
| 2012/0012920 A1 | 1/2012 | Shin et al. |
| 2012/0049268 A1 | 3/2012 | Chang et al. |
| 2012/0126302 A1 | 5/2012 | Noda et al. |
| 2012/0126303 A1 | 5/2012 | Arai et al. |
| 2012/0213006 A1 | 8/2012 | Isomura et al. |
| 2012/0256247 A1 | 10/2012 | Alsmeier |
| 2012/0280303 A1 | 11/2012 | Kiyotoshi et al. |
| 2012/0319172 A1 | 12/2012 | Ramaswamy et al. |
| 2013/0049093 A1 | 2/2013 | Lee et al. |
| 2013/0056819 A1 | 3/2013 | Matsushita et al. |
| 2013/0134493 A1 | 5/2013 | Eom et al. |
| 2015/0069494 A1 | 3/2015 | Makala et al. |
| 2015/0091078 A1 | 4/2015 | Jang et al. |
| 2015/0137062 A1 | 5/2015 | Ananthan et al. |
| 2015/0243675 A1 | 8/2015 | Lim et al. |
| 2015/0348790 A1 | 12/2015 | Lee et al. |
| 2015/0380431 A1 | 12/2015 | Kanamori et al. |
| 2016/0093636 A1 | 3/2016 | Pang et al. |
| 2016/0254159 A1 | 9/2016 | Lee |
| 2016/0351582 A1 | 12/2016 | Kim et al. |
| 2017/0069637 A1 | 3/2017 | Son et al. |
| 2017/0098659 A1 | 4/2017 | Yoshimizu et al. |
| 2017/0117290 A1 | 4/2017 | Lee et al. |
| 2017/0141122 A1 | 5/2017 | Yoshimizu et al. |
| 2017/0200737 A1 | 7/2017 | Sun et al. |
| 2017/0229474 A1 | 8/2017 | Shimizu et al. |
| 2017/0278851 A1 | 9/2017 | Fujii et al. |
| 2017/0287719 A1 | 10/2017 | Lee et al. |
| 2019/0051656 A1 | 2/2019 | Carlson et al. |
| 2019/0051660 A1 | 2/2019 | Carlson |
| 2019/0051661 A1 | 2/2019 | Carlson |
| 2019/0312058 A1 | 10/2019 | Carlson |

FOREIGN PATENT DOCUMENTS

| | | |
|---|---|---|
| KR | 20130116607 A | 10/2013 |
| TW | 486773 | 5/2002 |
| TW | 201244007 A | 11/2012 |
| TW | 201705451 A | 2/2017 |
| TW | 201911581 A | 3/2019 |
| TW | 201921639 A | 6/2019 |
| TW | 201921652 A | 6/2019 |
| TW | 201921654 A | 6/2019 |
| WO | WO-2019032323 A1 | 2/2019 |
| WO | WO-2019032326 A1 | 2/2019 |
| WO | WO-2019032373 A1 | 2/2019 |
| WO | WO-2019032376 A1 | 2/2019 |

OTHER PUBLICATIONS

"International Application Serial No. PCT/US2018/044353, Written Opinion dated Nov. 14, 2018", 6 pgs.

Daycock, David A, et al., "U.S. Appl. No. 15/422,335, Memory Arrays, and Methods of Forming Memory Arrays filed Feb. 1, 2017.",39 pgs.

Kanarik, Keren J, et al., "Overview of atomic layer etching in the semiconductor industry", J Vac Sci Technol. A, vol. 33 No. 2, (2015), 14 pgs.

Lee, Younghee, et al., "Atomic Layer Etching of Al2O3 Using Sequential Self-Limiting Thermal Reactions with Sn acac2 and Hydrogen Fluoride", American Chemical Society vol. 9 No. 2, (2015), 2061-2070.

Lee, Younghee, et al., "Atomic Layer Etching of HfO2 Using Sequential, Self-Limiting Thermal Reactions with Sn acac2 and HF", ECS Journal of Solid Science and Technology 4 (6), (Mar. 12, 2015), 20 pgs.

Tsukamoto, Keisuke, et al., "Advanced Air Gap Process for Multi-Level-Cell Flash Memories Reducing Threshold Voltage Interference and Realizing High Reliability", Jpn. J. Appl. Phys. 46, (2007), 1.

U.S. Appl. No. 15/675,223, filed Aug. 11, 2017, Charge Trap Structure With Barrier to Blocking Region.

U.S. Appl. No. 15/675,197, filed Aug. 11, 2017, Void Formation for Charge Trap Structures.

U.S. Appl. No. 15/675,265, filed Aug. 11, 2017, Void Formation in Charge Trap Structures.

U.S. Appl. No. 15/675,130, filed Aug. 11, 2017, Memory Device Including Voids Between Control Gates.

U.S. Appl. No. 15/675,197, Notice of Allowance dated Dec. 5, 2018, 8 pgs.

U.S. Appl. No. 15/675,197, Notice of Allowance dated Feb. 21, 2019, 7 pgs.

U.S. Appl. No. 15/675,223, Response filed Feb. 18, 2019 to Non Final Office Action dated Nov. 16, 2018, 10 pgs.

U.S. Appl. No. 15/675,223, Final Office Action dated May 8, 2019, 13 pgs.

U.S. Appl. No. 15/675,265, Response filed Feb. 8, 2019 to Non Final Office Action dated Nov. 8, 2018, 13 pgs.

U.S. Appl. No. 15/675,265, Final Office Action dated May 3, 2019, 14 pgs.

U.S. Appl. No. 15/675,265, Response filed May 17, 2019 to Final Office Action dated May 3, 2019, 14 pgs.

"International Application Serial No. PCT/US2018/044375, International Search Report dated Nov. 16, 2018", 3 pgs.

(56) References Cited

OTHER PUBLICATIONS

"International Application Serial No. PCT/US2018/044375, Written Opinion dated Nov. 16, 2018", 14 pgs.
"International Application Serial No. PCT/US2018/044990, International Search Report dated Dec. 7, 2018", 3 pgs.
"International Application Serial No. PCT/US2018/044990, Written Opinion dated Dec. 7, 2018", 9 pgs.
"International Application Serial No. PCT/US2018/045015, International Search Report dated Nov. 23, 2018", 3 pgs.
"International Application Serial No. PCT/US2018/045015, Written Opinion dated Nov. 23, 2018", 10 pgs.
"Taiwanese Application Serial No. 107127913, Office Action dated May 3, 2019", W/ Concise Statement of Relevance, 8 pgs.
"Taiwanese Application Serial No. 107127922, First Office Action dated Apr. 19, 2019", W/ Concise Statement of Relevance, 20 pgs.
"Taiwanese Application Serial No. 107127000, Office Action dated Aug. 29, 2019", w/o English Translation, 9 pgs.
"Taiwanese Application Serial No. 107127922, Response filed Jul. 18, 2019 to First Office Action dated Apr. 19, 2019", w/ English Claims, 38 pgs.
"Taiwanese Application Serial No. 107127992, Office Action dated Aug. 29, 2019", w/ English Translation, 18 pgs.
U.S. Appl. No. 16/452,292, filed Jun. 25, 2019, Void Formation for Charge Trap Structures.
U.S. Appl. No. 16/580,751, filed Sep. 24, 2019, Void Formation in Charge Trap Structures.

\* cited by examiner

MEMORY DEVICE INCLUDING VOIDS BETWEEN CONTROL GATES

BACKGROUND

Memory devices are widely used in computers and many other electronic items to store information. A memory device usually has numerous memory cells. Some conventional memory devices (e.g., three-dimensional (3D) flash memory devices) have memory cells arranged in tiers, in which the tiers are vertically stacked over a semiconductor substrate. Storage capacity and performance are key features of such memory devices. However, the structures of many conventional memory cells and tiers make improvements associated with device storage capacity and performance difficult. As described in more detail below, the memory devices presented herein include structures that allow them to have improvements over some conventional memory devices.

DETAILED DESCRIPTION

Figure 1:
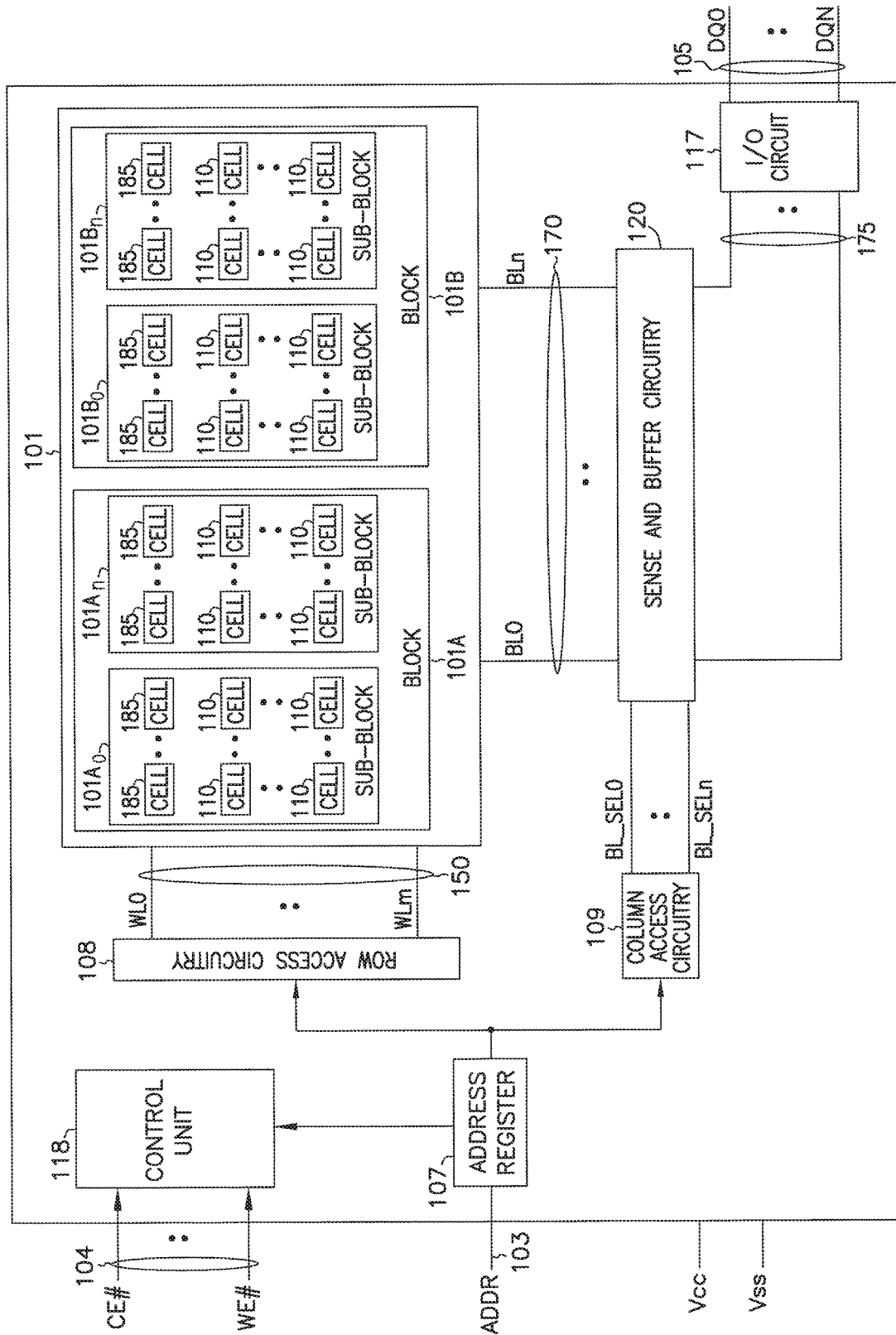
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a memory array (or multiple memory arrays) 101 containing memory cells 110. In the physical structure of memory device 100, memory cells 110 can be arranged vertically (e.g., stacked over each other) over a substrate of memory device 100 (e.g., a semiconductor substrate of an IC chip that includes memory device 100). Memory cells 110 can include non-volatile cells. Memory cells 110 can have different non-volatile memory cell types. For example, memory cells 110 can be charge trap memory cells (e.g., charge trap flash), floating gate memory cells, or other types of non-volatile memory cells.

As shown in FIG. 1, memory cells 110 can be arranged in blocks (memory cell blocks), such as blocks 101A and 101B. Each of blocks 101A and 101B can include sub-blocks. For example, block 101A can include sub-blocks 101A$_0$ and 101A$_n$, and block 101B can include sub-blocks 101B$_0$ and 101B$_n$. Each of sub-blocks 101A$_0$, 101A$_n$, 101B$_0$, and 101B$_n$ can include multiple memory cells 110. FIG. 1 shows memory device 100 having two blocks 101A and 101B and two sub-blocks in each of the blocks as an example. Memory device 100 can have more than two blocks and more than two sub-blocks in each of the blocks.

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access sub-blocks 101A$_0$, 101A$_n$, 101B$_0$, and 101B$_n$ of blocks 101A and 101B and data lines 170 to selectively exchange information (e.g., data) with memory cells 110 of blocks 101A and 101B.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 110 of which sub-blocks of blocks 101A and 101B are to be accessed during a memory operation. Memory device 100 can perform a read operation to read (e.g., sense) information (e.g., previously stored information) in memory cells 110, or a write (e.g., program) operation to store (e.g., program) information in memory cells 110. Memory device 100 can use data lines 170 associated with signals BL0 through BLn to provide information to be stored in memory cells 110 or obtain information read (e.g., sensed) from memory cells 110. Memory device 100 can also perform an erase operation to erase information from some or all of memory cells 110 of blocks 101A and 101B.

Memory device 100 can include a control unit 118 (which can include components such as a state machine (e.g., finite state machine), register circuits, and other components) configured to control memory operations (e.g., read, write, and erase operations) of memory device 100 based on control signals on lines 104. Examples of the control signals on lines 104 include one or more clock signals and other signals (e.g., a chip enable signal CE #, a write enable signal WE #) to indicate which operation (e.g., read, write, or erase operation) memory device 100 can perform.

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 110 (e.g., during a read operation) of blocks 101A and 101B and provide the value of the information to lines (e.g., global data lines) 175. Sense and buffer circuitry 120 can also can be configured to use signals on lines 175 to determine the value of information to be stored (e.g., programmed) in memory cells 110 of blocks 101A and 101B (e.g., during a write operation) based on the values (e.g., voltage values) of signals on lines 175 (e.g., during a write operation).

Memory device 100 can include input/output (I/O) circuitry 117 to exchange information between memory cells 110 of blocks 101A and 101B and lines (e.g., I/O lines) 105. Signals DQ0 through DQN on lines 105 can represent information read from or stored in memory cells 110 of blocks 101A and 101B. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 110 can be programmed to store information representing a value of at most one bit (e.g., a single bit), or a value of multiple bits such as two, three, four, or another number of bits. For example, each of memory cells 110 can be programmed to store information representing a binary value "0" or "1" of a single bit. The single bit per cell is sometimes called a single-level cell. In another example, each of memory cells 110 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, such that memory cells 110 can retain information stored thereon when power (e.g., voltage Vcc, Vss, or both) is disconnected from memory device 100. For example, memory device 100 can be a flash memory device, such as a NAND flash (e.g., 3-dimensional (3-D) NAND (e.g., vertical NAND)) or a NOR flash memory device, or another kind of memory device, such as a variable resistance memory device (e.g., a phase change memory device or a resistive RAM (Random Access Memory) device). One of ordinary skill in the art may recognize that memory device 100 may include other components, several of which are not shown in FIG. 1 so as not to obscure the example embodiments described herein.

At least a portion of memory device 100 (e.g., a portion of memory array 101) can include structures similar to or identical to the any of the memory devices described below with reference to FIG. 2A through FIG. 14.

Figure 2A:
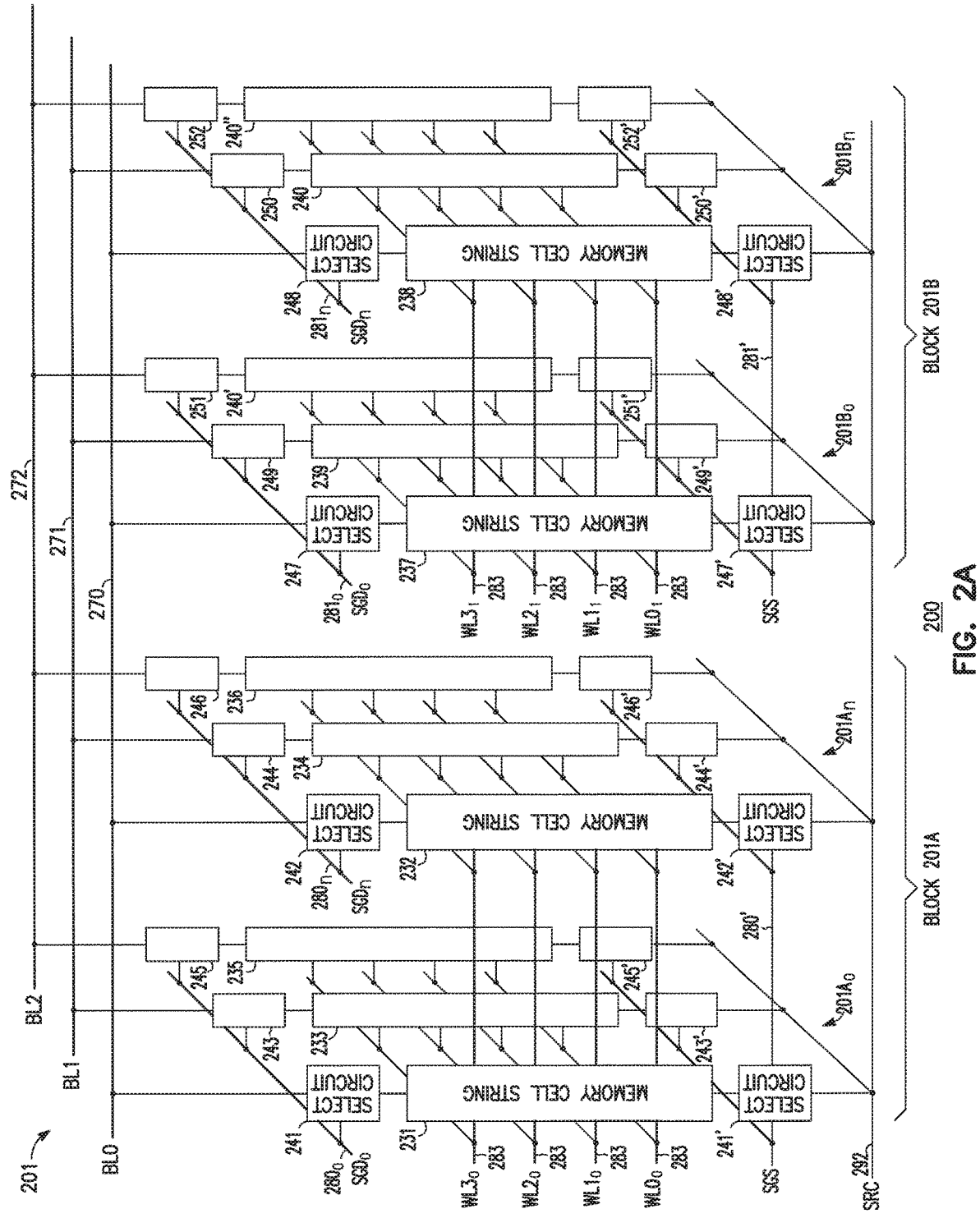
FIG. 2A shows a block diagram of a portion of a memory device, according to some embodiments described herein.

FIG. 2A shows a block diagram of a portion of a memory device 200 including a memory array 201 having memory cell strings 231 through 240, 240', and 240", select circuits 241 through 252 and 241' through 252', according to some embodiments described herein. Memory device 200 can correspond to memory device 100 of FIG. 1. For example, memory array 201 can form part of memory array 101 of FIG. 1.

As shown in FIG. 2A, memory device 200 can include blocks (memory cell blocks) 201A and 201B. Two blocks are shown as an example. Memory device 200 can include many blocks (e.g., up to thousands or more blocks). Each of blocks 201A and 201B can have sub-blocks. For example, block 201A has sub-block $201A_0$ and $201A_n$, and block 201B has sub-block $201B_0$ and $201B_n$. Two sub-blocks (e.g., index n=1) are shown in each of blocks 201A and 201B as an example. Each of blocks 201A and 201B can have more than two sub-blocks (e.g., n>1).

As shown in FIG. 2A, block 201A can include memory cell strings 231 through 236, select circuits 241 through 246 and 241' through 246'. Block 201B can include memory cell strings 237 through 240, 240', and 240", and select circuits 247 through 252 and 247' through 252'. Each of memory cell strings 231 through 240, 240', and 240" has memory cells (e.g., memory cells 210, 211, 212, and 213 shown in FIG. 2B) that are arranged in a string (e.g., memory cells coupled in series among each other) to store information. During an operation (e.g., write or read) of memory device 200, memory cell strings 231 through 240, 240', and 240" and their associated select circuits can be individually selected to access the memory cells (e.g., memory cells 210, 211, 212, and 213 shown in FIG. 2B) in the selected memory cell string in order to store information in or read information from the selected memory cell string. During an erase operation, all of the memory cell strings in a particular sub-block (or in particular sub-blocks) can be selected (e.g., concurrently selected) to erase information from them.

As shown in FIG. 2A, each of the memory cell strings 231 through 240, 240', and 240" can be associated with (e.g., coupled to) two select circuits. For example, memory cell string 231 is associated with select circuit (e.g., top select circuit) 241 and select circuit (e.g., bottom select circuit)

241'. FIG. 2A shows an example of six memory cell strings (e.g., strings 231 through 236, or strings 237 through 240, and 240' and 240") and their associated circuits (e.g., top and bottom select circuits) in each of blocks 201A and 201B. The number of memory cell strings and their associated select circuits in each of blocks 201A and 201B can vary.

As shown in FIG. 2A, memory device 200 can include data lines 270, 271, and 272 that carry signals BL0, BL1, and BL2, respectively. Each of data lines 270, 271, and 272 can be structured as a conductive line that can include bit lines of memory device 200. The memory cell strings of blocks 201A and 201B can share data lines 270, 271, and 272. For example, memory cell strings 231, 232 (of block 201A), 237, 238 (of block 201B) can share data line 270. Memory cell strings 233, 234 (of block 201A), 239, 240 (of block 201B) can share data line 271. Memory cell strings 235, 236 (of block 201A), 240', 240" (of block 201B) can share data line 272. FIG. 2A shows three lines (e.g., data lines) 270, 271, and 272 as an example. The number of data lines of memory device 200 can vary.

Memory device 200 can include a line 292 that can carry a signal SRC (e.g., source line signal). Line 292 can be structured as a conductive line (or a conductive region (e.g., source region)) and can form part of a source (e.g., a source line or a source region) of memory device 200. As shown in FIG. 2A, blocks 201A and 201B can share line 292.

Memory device 200 can include separate gates (e.g., control gates) in blocks 201A and 201B. For example, memory device 200 can include gates 283 in block 201A that can carry corresponding signals (e.g., word line signals) $WL0_0$, $WL1_0$, $WL2_0$, and $WL3_0$; and gates 283 in block 201B that can carry corresponding signals (e.g., word line signals) $WL0_1$, $WL1_1$, $WL2_1$, and $WL3_1$. Gates 283 of block 201A are not electrically coupled to each other. Gates 283 of block 201B are not electrically coupled to each other. Gates 283 of block 201A are not electrically coupled to gates 283 of block 201B. FIG. 2A shows four gates 283 in each of blocks 201A and 201B as an example. The number of gates of memory device 200 can vary.

Each of gates 283 of block 201A and 201B can be structured as a conductive gate. Gates 283 can form part of respective access lines (e.g., part of word lines) of memory device 200 to access memory cells of memory cell strings 231 through 240, 240', and 240" in a respective block. For example, during a read or write operation to store information in or read information from a memory cell (or memory cells) in block 201A, gates 283 of block 201A can be activated (e.g., provided with positive voltages) to access a selected memory cell (or selected memory cells) in block 201A. In the example here, gates 283 of block 201B can be deactivated (e.g., provided with zero volts (e.g., ground)) when gates 283 of block 201A are activated. In memory device 200, blocks 201A and 201B (which share the same data lines 270, 271, and 272) can be accessed (e.g., accessed during a read or write operation) one block at a time.

As shown in FIG. 2A, memory device 200 can include select lines (e.g., drain select lines) $280_0$ and $280_n$ in block 201A and select lines (e.g., drain select lines) $281_0$ and $281_n$ in block 201B. Each of select lines $280_0$, $280_n$, $281_0$, and $281_n$ can carry a different signal ($SGD_0$ or $SGD_n$). FIG. 2A shows blocks 201A and 201B having signals with the same names (e.g., $SGD_0$ or $SGD_n$) for simplicity. However, signals $SGD_0$ and $SGD_n$ of one block (e.g., block 201A) are different from signals $SGD_0$ and $SGD_n$ of another block (e.g., block 201B).

In block 201A, select circuits 241, 243, and 245 can share select line $280_0$, and select circuits 242, 244, and 246 can share select line $280_n$. In block 201B, select circuits 247, 249, and 251 can share select line $281_0$, and select circuits 248, 250, and 252 can share select line $281_n$. Each of select circuits 241 through 252 in blocks 201A and 201B can include a select transistor (shown in FIG. 2B) that can be controlled (e.g., turned on or turned off) by a respective select line (e.g., select line $280_0$, $280_n$, $281_0$, or $281_n$).

Memory device 200 can include a select line (e.g., source select line) 280' in block 201A, and a select line (e.g., source select line) 281' in block 201B. Each of select lines 280' and 281' can carry a signal SGS. Signal SGS of one block (e.g., block 201A) can be different from signal SGS of another block (e.g., block 201B). FIG. 2A shows select lines 280' and 281' separated from each other as an example. However, select lines 280' and 281' can be coupled to each other, such that blocks 201A and 201B can share signal SGS.

In block 201A, select circuits 241', 242', 243', 244', 245', and 246' can share select line 280'. In block 201B, select circuits 247', 248', 249', 250', 251', and 252' can share select line 281'. Each of select circuits 241' through 252' in blocks 201A and 201B can include a select transistor (shown in FIG. 2B) that can be controlled (e.g., turned on or turned off) by a respective select line (e.g., select line 280' or 281').

During an operation of memory device 200, one or both select circuits associated with a selected memory cell string can be activated (e.g., by turning on the transistors in the select circuits), depending on which operation memory device 200 performs on the selected memory cell string. During a write operation of memory device 200, memory device 200 can concurrently select memory cells of memory cell strings of sub-blocks of a selected block in order to store information in (e.g., during a write operation) the selected memory cells. During a read operation of memory device 200, memory device 200 can select a block as a selected block to read information from memory cells of the selected block. During an erase operation, memory device 200 can select a block as a selected block to erase information from memory cells in a portion (e.g., a sub-block or multiple sub-blocks) of the selected block or memory cells from the entire selected block.

Activating a particular select circuit among select circuits 241 through 252 during an operation of memory device 200 can include providing (e.g., applying) voltages having certain values to signals $SGD_0$ and $SGD_n$ associated with that particular select circuit. Activating a particular select circuit among select circuits 241' through 252' can include providing (e.g., applying) voltages having certain values to signal SGS associated with that particular select circuit.

Figure 2B:
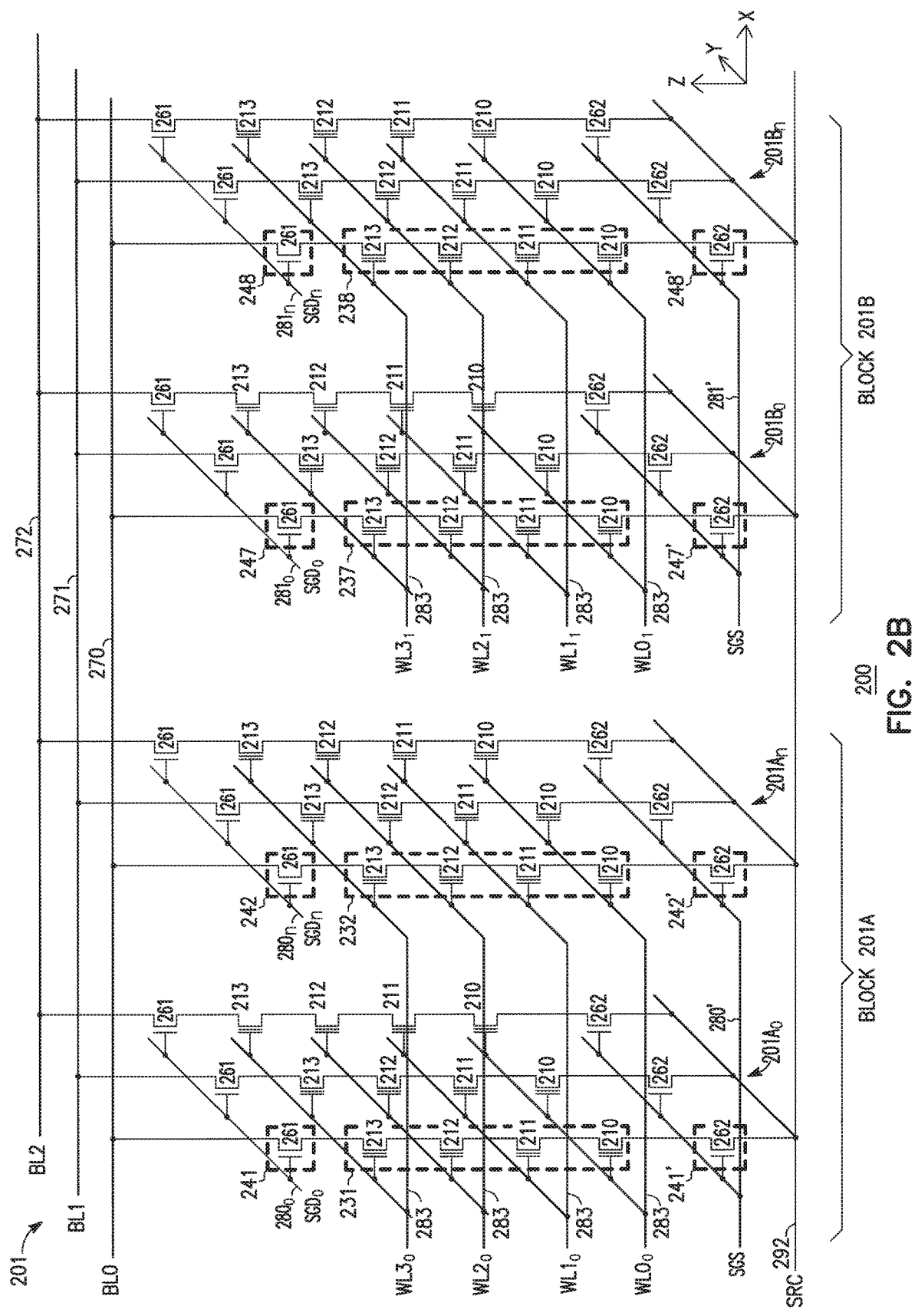
FIG. 2B shows a schematic diagram of the portion of the memory device of FIG. 2A, according to some embodiments described herein.

FIG. 2B shows a schematic diagram of a portion of memory device 200 of FIG. 2A, according to some embodiments described herein. For simplicity, only four of the memory cell strings (memory cell strings 231, 232, 237 and 238) are labeled, only four of the top select circuits (241, 242, 247, and 248) are labeled, and only four of the bottom select circuits (241', 242', 247', and 248') are labeled.

As shown in FIG. 2B, memory device 200 can include memory cells 210, 211, 212, and 213 that can be physically arranged in three dimensions (3-D), such as x, y, and z dimensions of memory device 200. Memory cells 210, 211, 212, and 213 can correspond to memory cells 110 of FIG. 1. Thus, memory cells 210, 211, 212, and 213 can include non-volatile memory cells (e.g., charge trap memory cells, floating gate memory cells, or other types of non-volatile memory cells). Each of the memory cell strings (e.g., strings 231, 232, 237 and 238) can include one of memory cells 210, one of memory cells 211, one of memory cells 212, and one of memory cells 213 coupled in series among each other.

FIG. 2B shows an example where memory device 200 has four levels (e.g., four tiers) of respective memory cells 210, 211, 212, and 213, and four memory cells in each of the memory cell strings. The number of levels (e.g., tiers) of memory cells, and the number of memory cells in each memory cell string, can vary.

As shown in FIG. 2B, memory device 200 can include select transistors (e.g., drain select transistors) 261 and select transistors (e.g., source select transistors) 262 associated with select lines $280_0$, $280_n$, $281_0$, $281_n$, 280', and 281'. In memory device 200, a select line (e.g., select line $280_0$, $280_n$, $281_0$, $281_n$, 280', or 281') can include a conductive material to carry a signal (e.g., signal $SGD_0$, $SGD_n$, or SGS). A select line (e.g., select line $280_0$, $280_n$, $281_0$, $281_n$, 280', or 281') does not operate like a switch (e.g., a transistor). A select transistor (e.g., select transistor 261 or 262) can receive a signal from a respective select line and can operate like a switch.

Select transistor 261 or select transistor 262, or both, can include a structure that is similar to or identical to the structure of memory cells 210, 211, 212, and 213. Alternatively, select transistor 261 or 262, or both, can include a structure different from the structure of memory cells 210, 211, 212, and 213. For example, select transistor 261 or 262, or both, can have a field-effect transistor (EFT) structure, such as metal-oxide semiconductor (MOS) structure.

FIG. 2B shows each of the top select circuits (e.g., select circuits 241, 242, 247, and 248) and each of bottom select circuits (e.g., select circuits 241', 242', 247', and 248') of memory device 200 as including one transistor (e.g., select transistor 261 or 262) as an example. However, each of the top and bottom select circuits of memory device 200 can include multiple series-connected transistors. Further, the number of transistors (e.g., either multiple transistors or a single transistor) in each of the top select circuits can be different from the number of transistors (e.g., either multiple transistors or a single transistor) in each of the bottom select circuits.

Figure 2C:
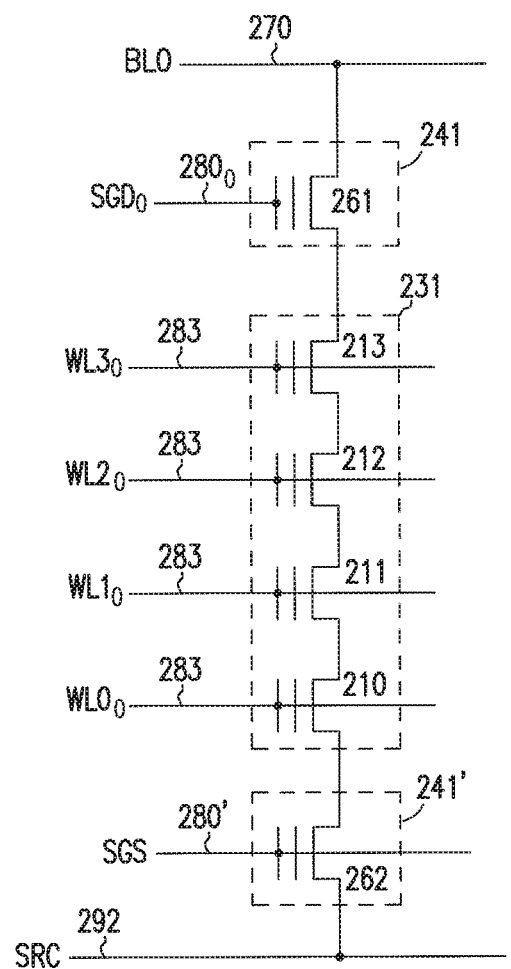
FIG. 2C shows a schematic diagram of a portion of memory device of FIG. 2A and FIG. 2B, according to some embodiments described herein.

FIG. 2C shows a schematic diagram of a portion of memory device 200 of FIG. 2A and including memory cell string 231 and associated select circuits (e.g., top select circuit 241 and bottom select circuit 241'), according to some embodiments described herein. The portion of memory device 200 in FIG. 2C is also shown in FIG. 2B. FIG. 2C also shows line (e.g., data line) 270 and corresponding signal BL0, line (e.g., source) 292 and corresponding signal SRC, and gates 283 and corresponding signals $WL0_0$, $WL1_0$, $WL2_0$, and $WL3_0$.

Figure 2D:
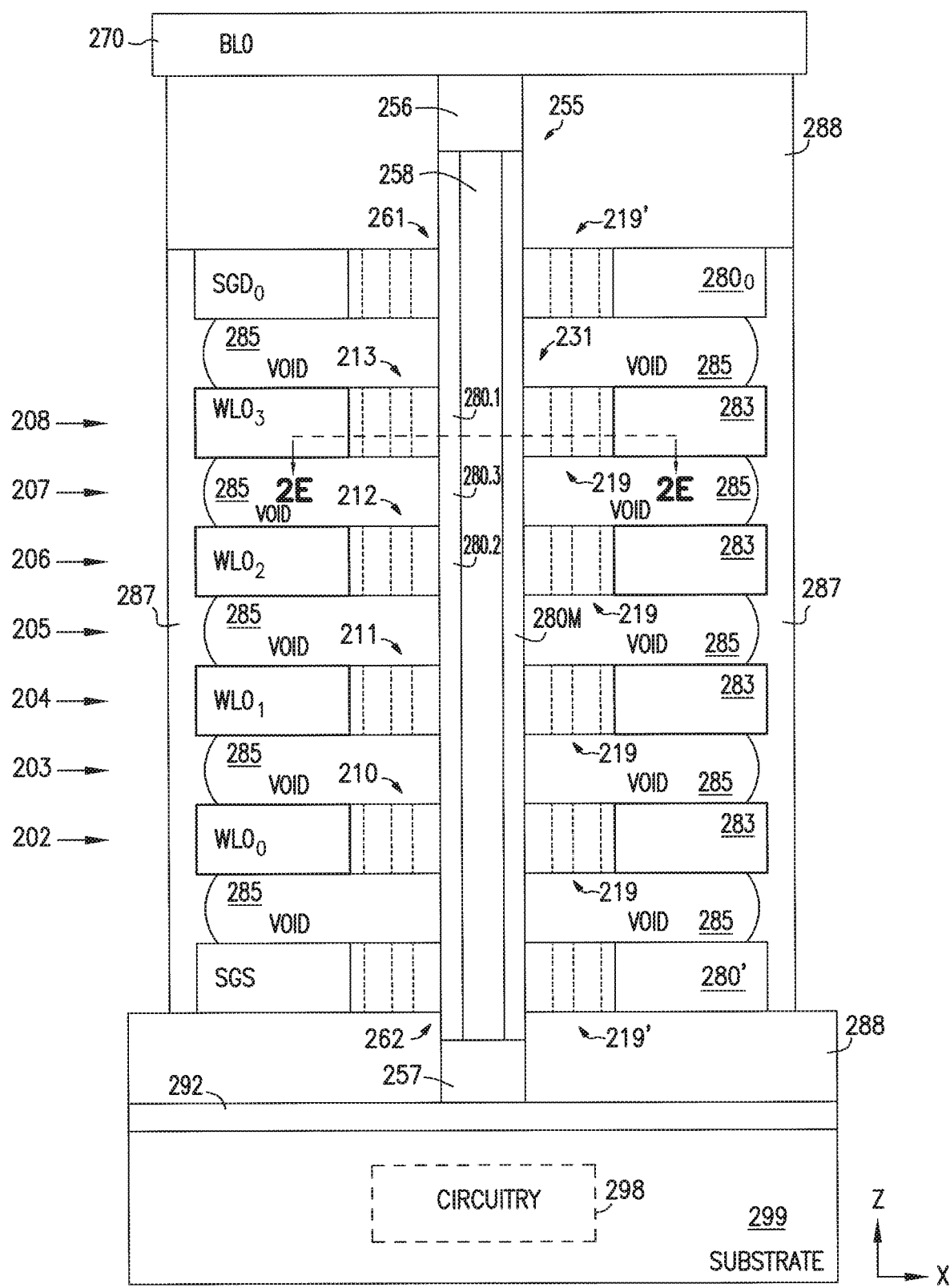
FIG. 2D shows a side view (cross-sectional views) of a structure of a portion of the memory device of FIG. 2C, according to some embodiments described herein.

FIG. 2D shows a side view of a structure of a portion of memory device 200 (e.g., the portion schematically shown in and FIG. 2C), according to some embodiments described herein. For simplicity, the structures of only memory cells 210, 211, 212, and 213 of memory cell string 231 of memory device 200 are shown in FIG. 2D. The structures of memory cells 210, 211, 212, and 213 of other memory cell strings (schematically shown in FIG. 2A and FIG. 2B) of memory device 200 can be similar to or identical to the structures of memory cells 210, 211, 212, and 213 of memory cell string 231 shown in FIG. 2D. Also for simplicity, cross-sectional lines (e.g., hatch lines) are omitted from most of the elements shown in the drawings described herein.

As shown in FIG. 2D, memory device 200 can include a substrate 299 over which memory cells 210, 211, 212, and 213 can be formed (e.g., formed vertically with respect to substrate 299). Memory device 200 includes different levels 202 through 208 with respect to a z-dimension. Levels 202 through 208 are internal device levels between substrate 299 and data line 270 of memory device 200. As shown in FIG. 2D, memory cells 210, 211, 212, and 213 can be located (e.g., located vertically with respect to substrate 299) in levels 202, 204, 206, and 208, respectively.

Gates 283 (associated with memory cells 210, 211, 212, and 213, respectively) can also be located (e.g., located vertically with respect to substrate 299) in levels 202, 204, 206, and 208, respectively. Select lines $280_0$ can be located in a level between the level of data line 270 and level 208. Select line 280' can be located in a level between level 202 and substrate 299.

Substrate 299 can include monocrystalline (also referred to as single-crystal) semiconductor material. For example, substrate 299 can include monocrystalline silicon (also referred to as single-crystal silicon). The monocrystalline semiconductor material of substrate 299 can include impurities, such that substrate 299 can have a specific conductivity type (e.g., n-type or p-type). Substrate 299 can include circuitry 298 formed in substrate 299. Circuitry 298 can include sense amplifiers and page buffer circuits (that can be similar to sense and buffer circuitry 120 of FIG. 1), decoder circuitry (that can be similar to row and column access circuitry 108 and 109 of FIG. 1), and other circuitry. As shown in FIG. 2D, memory cells 210, 211, 212, and 213, and gates 283, can be formed (e.g., formed vertically in the z-direction) over circuitry 298 and substrate 299.

As shown in FIG. 2D, data line 270 can have length in the x-direction, which is perpendicular to the z-dimension. Line 292 (e.g., source region) can include a conductive material (e.g., a conductive region) and can be formed over a portion of substrate 299 (e.g., by depositing a conductive material over substrate 299). Alternatively, line 292 can be formed in or formed on a portion of substrate 299 (e.g., by doping a portion of substrate 299). Memory device 200 can include dielectric materials (e.g., silicon oxide) 288 between each of data line 270 and line 292 and other components of memory device 200.

As shown in FIG. 2D, memory device 200 can include a pillar (conductive pillar) 255 having lengths extending in a direction perpendicular to (e.g., a vertical direction in the z-direction of memory device 200) a conductive material region of line 292 and substrate 299. Pillar 255 can include a channel 280M, portions 256 and 257 (e.g., conductive contact (plug) regions), and portion 258 (e.g., a center region of pillar 255). Portion 256 can contact data line 270. Portion 257 can contact a conductive region of line 292. Portion 258 can be either a hollow portion (e.g., an empty portion) or a solid portion (e.g., a portion having either a dielectric material or a conductive material). Portion 258 can be surrounded by channel 280M.

Channel 280M is part of a conductive path (e.g., current path formed by channel 280M and portions 256 and 257) of pillar 255. The conductive path can carry current (e.g., current between data line 270 and line 292 (e.g., source)) during an operation (e.g., read, write, or erase) of memory device 200. In an alternative structure of pillar 255, portion 258 may be omitted and channel 280M may contact (directly couple to) a conductive region of line 292. FIG. 2D shown an example where each of portions 256, 257, 258, and 280 have a specific dimension (e.g., length) in the z-direction. However, the dimension of each of portions 256, 257, 258, and 280 can vary.

As shown in FIG. 2D, memory cells 210, 211, 212, and 213 of memory cell string 231 can be located along different segments of pillar 255 (e.g., different segments of pillar 255 extending from level 202 to level 208). In a similar structure (not shown in FIG. 2D), memory cells 210, 211, 212, and 213 of other memory cell strings of memory device 200 can be located along different segments of other pillars (not shown) of memory device 200.

As shown in FIG. 2D, gates 283 (associated with respective memory cells 210, 211, 212, and 213) can also be located along pillar 255 at the same segments (e.g., the segment extending from level 202 to level 208) where memory cells 210, 211, 212, and 213 are located. Each of gates 283 can be used to access the memory cell (or memory cells) on a respective level. For example, gate 283 associated with signal $WL0_3$ can be used to access the memory cells (e.g., memory cell 213), and gate 283 associated with signal $WL0_2$ can be used to access the memory cells (e.g., memory cell 212).

As shown in FIG. 2D, each of memory cells 210, 211, 212, and 213 can include a memory cell structure 219 located between a respective gate among gates 283 and a channel portion (a portion of channel 280M). For example, memory cell 213 can include memory cell structure 219 located between one of gates 283 (gate 283 associated with signal $WL0_3$) and channel portion 280.1, and memory cell 212 can include memory cell structure 219 located between one of gates 283 (gate 283 associated with signal $WL0_2$) and channel portion 280.2.

Each of select transistors 261 and 262 can include a select transistor structure 219'. Select transistor structure 219' can be similar to or identical to memory cell structure 219. Alternatively, select transistor structure 219' can be a MOS transistor-type structure that is different from memory cell structure 219. A cross section (e.g., top view) of memory device 200 including a portion of memory cell structure 219 (taken along section line 2E-2E) is described below with reference to FIG. 2E.

As shown in FIG. 2D, memory device 200 can include voids 285 located at different locations between components (e.g., gates 283 and memory cell structures 219) of memory cells 210, 211, 212, and 213. Each of voids 285 is an empty space that can contain air (an air-filled void (e.g., an air gap)) or gas (a gas-filled void).

A void among voids 285 can be located (e.g., can occupy a location) between two adjacent gates 283 and between two adjacent memory cell structures 219. Two adjacent gates are two gates located immediately next to each other. Two adjacent memory cell structures are memory cell structures located immediately next to each other. For example, FIG. 2D shows one of voids 285 located between adjacent gates 283 associated with signals $WL0_2$ and $WL0_3$ and between adjacent memory cell structures 219 of memory cells 212 and 213.

As shown in FIG. 2D, a void among voids 285 can be located (e.g., can occupy a location) between a particular select line (e.g., select line $280_0$ or 280') and an adjacent gate among gates 283, and between a select transistor structure 219' and an adjacent memory cell structure 219. For example, FIG. 2D shows one of voids 285 located between select line $280_0$ a gate 283 associated with signals $WL0_3$ and between select transistor structure 219' of select transistor 261 and memory cell structure 219 of memory cell 213.

FIG. 2D shows an example where some channel portions (e.g., channel portion 280.3) of channel 280M are exposed to voids 285. However, pillar 255 can include a dielectric material between a respective channel portion (e.g., channel portion 280.3) of channel 280M, such that channel 280M is not exposed to voids 285.

In an alternative structure of memory device 200, some of voids 285 may be omitted. For example, memory device 200 may not include (may exclude) top and bottom voids 285 (e.g., a void between select line $280_0$ and gate 283 associated with signal $WL0_3$, and an void between select line select line 280' and gate 283 associated with signal $WL0_0$.

In another alternative structure of memory device 200, all of voids 285 may be omitted. For example, memory device 200 may not include (may exclude) voids 285, such that the locations that are occupied by voids 285 can include a dielectric material (e.g., a dielectric oxide, a dielectric nitride, or other dielectric materials).

As shown in FIG. 2D, memory device 200 can include sealing dielectric 287 (e.g., dielectric oxide), which seals off voids 285 in memory device 200. Thus, each of voids 285 can be contained within a region bounded (e.g., surrounded) by sealing dielectric 287, two adjacent gates 283 (or one gate 283 and a select line (select line $280_0$ or 280')), two adjacent memory cell structures 219 (or one memory cell structure 219 and one select transistor structure 219'), and a respective channel portion (e.g., channel portion 280.3) of channel 280M.

In FIG. 2D, memory cell structure 219 can be any of the memory cell structures described below with reference to FIG. 2E, FIG. 3A through FIG. 3E, FIG. 4A, FIG. 4B, FIG. 5A, and FIG. 5B.

Figure 2E:
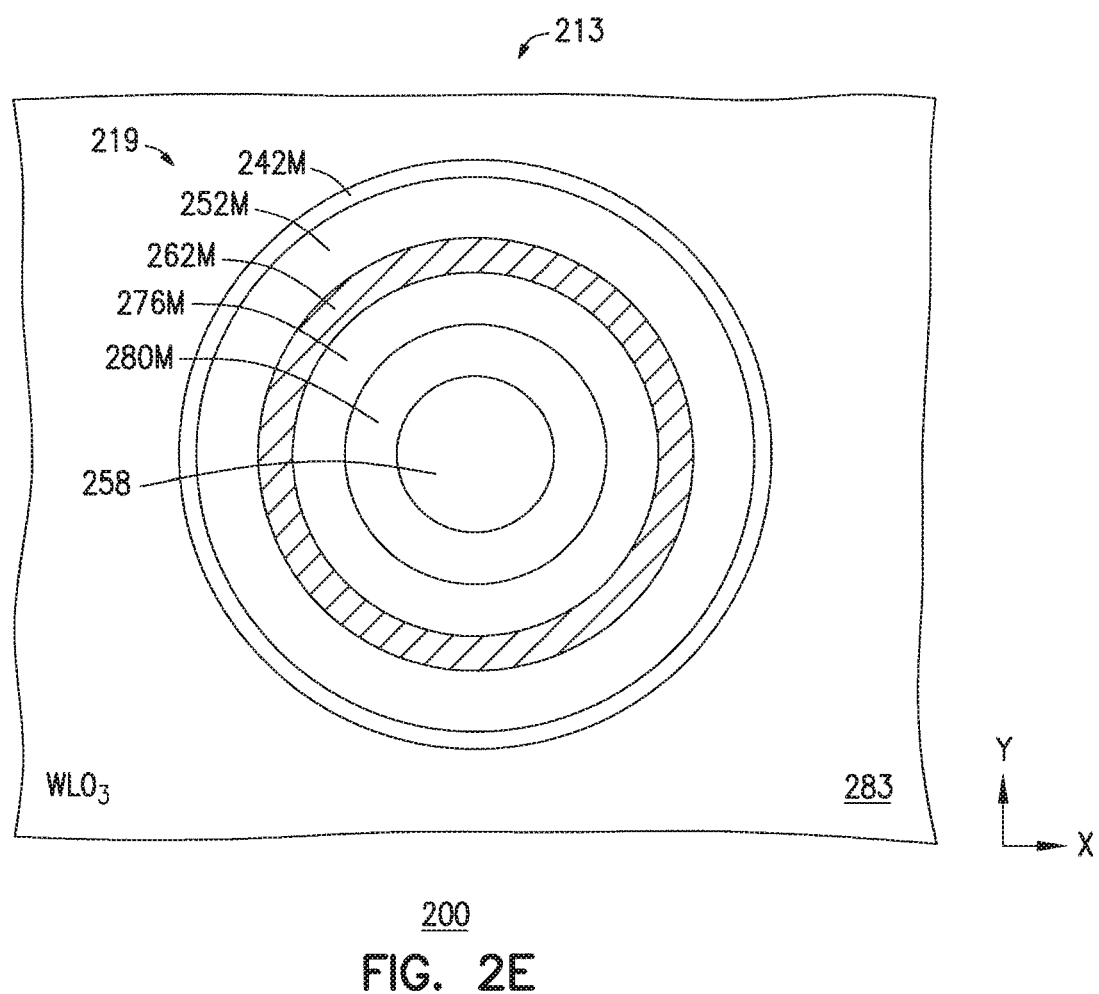
FIG. 2E shows a portion of the memory device of FIG. 2D taken along line 2E-2E of FIG. 2D, according to some embodiments described herein.

FIG. 2E shows a portion of memory device 200 along line 2E-2E of FIG. 2D including memory cell structure 219 of memory cell 213, according to some embodiments described herein. As shown in FIG. 2E, memory cell structure 219 is located between gate 283 (associated with signal $WL0_3$) and channel 280M. Memory cell structure 219 can also be surround by gate 283. Memory cell structure 219 can include a dielectric barrier (e.g., a dielectric region) 242M, a dielectric blocking region 252M, a memory element 262M, and a tunnel region 276M. For simplicity, only memory element 262M has cross-sectional lines (e.g., hatch lines). Cross-sectional lines are omitted from other elements of memory device 200 shown in FIG. 2E. Similar to memory element 262M, only memory elements (or part of the memory elements) of the memory devices described below (e.g., in FIG. 3A through FIG. 14) have cross-sectional lines.

In FIG. 2E, gate 283 can be a metal gate. For example, gate 283 can be a tungsten gate contacting dielectric barrier 242M. Alternatively, gate 283 can include a combination of metals and metallic compounds. For example, gate 283 can include a conductive titanium nitride region contacting dielectric barrier 242M, and a metal (e.g., tungsten) contacting the conductive titanium nitride region, such that the conductive titanium nitride region is between the metal and dielectric barrier 242M. Other conductive materials can be used for gate 283.

Dielectric barrier 242M can include a high-k dielectric material or a combination of high-k dielectric materials. A high-k dielectric material is dielectric material that has a dielectric constant greater than the dielectric constant of silicon dioxide. One of the functions of dielectric barrier 242M includes shielding (e.g., protecting) dielectric blocking region 252M from some processes (e.g., etch processes) during the processes of forming memory device 200. Dielectric barrier 242M can include aluminum oxide or other dielectric (dielectric material) having a dielectric constant greater than the dielectric constant of aluminum oxide. As an example, dielectric barrier 242M can include aluminum oxide, hafnium oxide, or zirconium oxide. In another example, dielectric barrier 242M can include a mixture of hafnium oxide with at least one of aluminum oxide, silicon oxide, titanium oxide, gadolinium oxide, niobium oxide, and tantalum oxide. In another example, dielectric barrier 242M can include a mixture of zirconium oxide with at least one of aluminum oxide, silicon oxide, titanium oxide, gadolinium oxide, niobium oxide, and tantalum oxide. In another example, dielectric barrier 242M can include a mixture of hafnium oxide and zirconium oxide with at least one of aluminum oxide, silicon oxide, titanium oxide, gadolinium oxide, niobium oxide, and tantalum oxide. Other high-k dielectrics can be used for dielectric barrier 242M. Dielectric barrier 242M can have a thickness (from gate 283 to dielectric blocking region 252M) in a range from about 15 angstroms to about 50 angstroms.

Dielectric blocking region 252M includes a material different from the material of dielectric barrier 242M. Dielectric blocking region 252M is disposed on and contacting dielectric barrier 242M. Dielectric blocking region 252M provides a mechanism to block charge from flowing from memory element 262M to gate 283. Dielectric blocking region 252M can be an oxide (e.g., silicon oxide) or other dielectric materials.

Memory element 262M can be configured to store information in memory cell 213. Memory element 262M can be a dielectric nitride region (e.g., a region including dielectric silicon nitride). Other dielectric materials for memory element 262M can be used to trap charge. Alternatively, memory element 262M can be polycrystalline silicon (polysilicon). The value (e.g., the value representing one bit or multiple bits) of information stored in memory cell 213 can be based on the amount of charge (e.g., the number of electrons) in memory element 262M. The amount of charge in memory element 262M can be controlled (e.g., increased or decreased) in part based on the value of voltage (e.g., carried by signal WL0$_3$) applied to gate 283, the value of voltage applied to channel 280M, or both values of voltages applied to gate 283 and channel 280M. For example (e.g., in a write operation), the number of electrons in memory element 262M can be increased by controlling (e.g., increasing) the value of voltage applied to gate 283 in order to cause some of the electrons from channel 280M to move (e.g., tunnel) to memory element 262M (through tunnel region 276M). In another example (e.g., in an erase operation), the number of electrons in memory element 262M can be decreased by controlling (e.g., decreasing) the value of voltage applied to gate 283 in order to some of the electrons from memory element 262M to move to channel 280M to (through tunnel region 276M).

Tunnel region 276M can be constructed to allow tunneling (e.g., transportation) of charge (e.g., electrons) between memory element 262M and channel 280M. Tunnel region 276M can include an oxide (e.g., silicon oxide), a nitride (e.g., silicon nitride), or a combination of oxide and nitride. For example, tunnel region 276M can be a single (e.g., only one) dielectric (e.g., oxide). In another example, tunnel region 276M can include multiple dielectrics, which can be constructed as different regions (e.g., layers) of dielectric materials. For example, tunnel region 276M can include a dielectric nitride region (e.g., a layer of silicon nitride) sandwiched between two dielectric oxide regions (e.g., two layers of silicon oxide).

Channel 280M can include semiconductor material. Example materials for channel 280M include polysilicon (e.g., undoped or doped polysilicon). The polysilicon can be n-type or p-type polysilicon. As described above, channel 280M is part of a conductive path that can carry current during an operation (e.g., read, write, or erase) of memory device 200.

Portion 258 can be either a hollow portion (e.g., an empty portion) or a solid portion (e.g., a portion having either a dielectric material or a conductive material). Thus, channel 280M can be a hollow channel (e.g., if portion 258 is empty or filled with a non-conductive material (e.g., dielectric oxide, such as silicon oxide).

Memory cell structure 219 shown in FIG. 2D and FIG. 2E is an example memory cell structure of memory device 200. However, memory cell structure 219 can be (or can include) any of memory cell structures described below with reference to FIG. 3A through FIG. 14. Thus, memory cell structure 219 can be substituted by any of the memory cell structures described below with reference to FIG. 3A through FIG. 14.

FIG. 3A, FIG. 3B, FIG. 3C, FIG. 3D, FIG. 3E, FIG. 4A, FIG. 4B, FIG. 5A, and FIG. 5B show side views (cross-sectional views) of structures of portions of respective memory devices 300A, 300B, 300C, 300D, 300E, 400A, 400B, 500A, and 500B, according to some embodiments described herein. The figures described herein give the same labels (e.g., reference names and numbers) for similar or identical elements. For simplicity, the description herein refrains from repeating the descriptions of similar or identical elements within the same memory device and among different memory devices. Also for simplicity, only a portion of each of the memory devices described below is shown in the drawings. However, each of the memory devices described below with reference to FIG. 3A through FIG. 14 can include elements similar to or identical to the elements of memory device 100 (FIG. 1) and 200 (FIG. 2A through FIG. 2E).

For example, the elements of memory device 300A above level 608 can be similar to the elements above level 208 of memory device 200 in FIG. 2D. In another example, the elements of memory device 300A in portion 694 (e.g., between level 602 and line (e.g., source) 692) can be similar to or identical to the elements in portion 294 of memory device 200 in FIG. 2D.

Figure 3A:
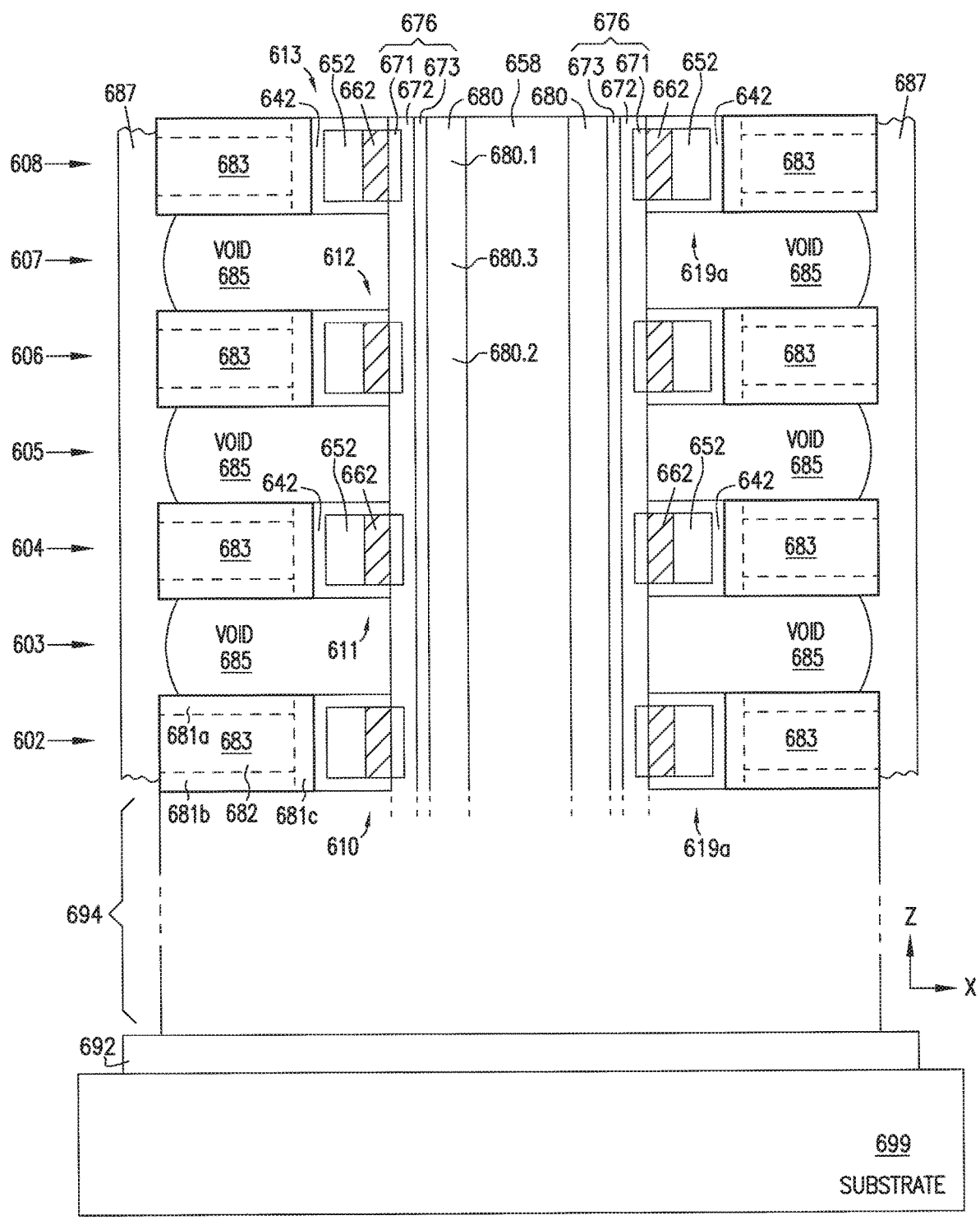
FIG. 3A, FIG. 3B, FIG. 3C, FIG. 3D, and FIG. 3E show side views of structures of portions of different memory devices having voids (e.g., empty spaces that can contain air (air-filled voids) or gas (gas-filled voids) and dielectric memory elements, according to some embodiments described herein.

As shown in FIG. 3A, memory device 300A can include a substrate 699, conductive region 692, and levels 602 through 608 (e.g., vertical level in the z-direction, which is perpendicular to the x-direction (direction from channel 680 to gate 683)). Memory device 300A can include memory cells 610, 611, 612, and 613, gates 683 located in respective levels 602 through 608, a channel 680 having a length extending through levels 602 through 608 in the z-direction, and a portion 658. Memory device 300A can include voids 685 located at levels 603, 605, and 607, and sealing dielectric 687 that seal off voids 685 in memory device 300A. Each of voids 685 is an empty space that can contain air (an air-filled void (e.g., an air gap)) or gas (a gas-filled void).

Each of memory cells 610, 611, 612, and 613 can include a memory cell structure 619a, which can be located between a respective gate (one of gates 683) and a channel portion of channel 680. For example, memory cell 613 can include memory cell structure 619a located between one of gates 683 and channel portion 680.1, and memory cell 612 can include memory cell structure 619a located between one of gates 683 and channel portion 680.2.

Each memory cell structures 619a can include a dielectric barrier (e.g., a dielectric region) 642, a dielectric blocking region 652, a memory element 662, and a tunnel region (a portion of tunnel region 676). As shown in FIG. 3A, tunnel region 676 can include a combination of multiple tunnel dielectrics (e.g., different layers of dielectric materials) 671, 672, and 673. Tunnel dielectrics 671, 672, and 673 can include a region of dielectric oxide (e.g., silicon oxide), a region of dielectric nitride (e.g., silicon nitride), and another region of dielectric oxide (e.g., silicon oxide), respectively.

Each of voids 685 can be located (e.g., can occupy a location) between two adjacent gates 683 and between two adjacent memory cell structures 219. For example, FIG. 3A shows a void (one of voids 685) located between two gates 683 associated with memory cell structures 619a of memory cells 612 and 613. Each of voids 685 can be separated from a channel portion (e.g., channel portion 680.3) of channel 680 by a dielectric region (which is a portion of tunnel region 676).

As shown in FIG. 3A, gate 683 can include gate portions 681a, 681b, 681c, and 682. Gate portions 681a, 681b, 681c can have the same material (e.g., conductive titanium nitride) that can be different from the material (e.g., tungsten) of gate portion 682. In an alternative structure of memory device 300A, gate portions 681a and 681b can be omitted, such that gate portion 682 can occupy the location of gate portions 681a and 681b. In another alternative structure of memory device 300A, gate portions 681a, 681b, and 681c can be omitted, such that gate portion 682 can occupy the location of gate portions 681a, 681b, and 681c.

The materials for sealing dielectric 687, gates 683, dielectric barrier 642, dielectric blocking region 652, memory element 662, tunnel region 676, channel 680, and portion 658 can be similar to or identical to the materials for sealing dielectric 287, gates 283, dielectric barrier 242M, dielectric blocking region 252M, memory element 262M, tunnel region 276M, channel 280M, and portion 258 of FIG. 2E, respectively.

Figure 3B:
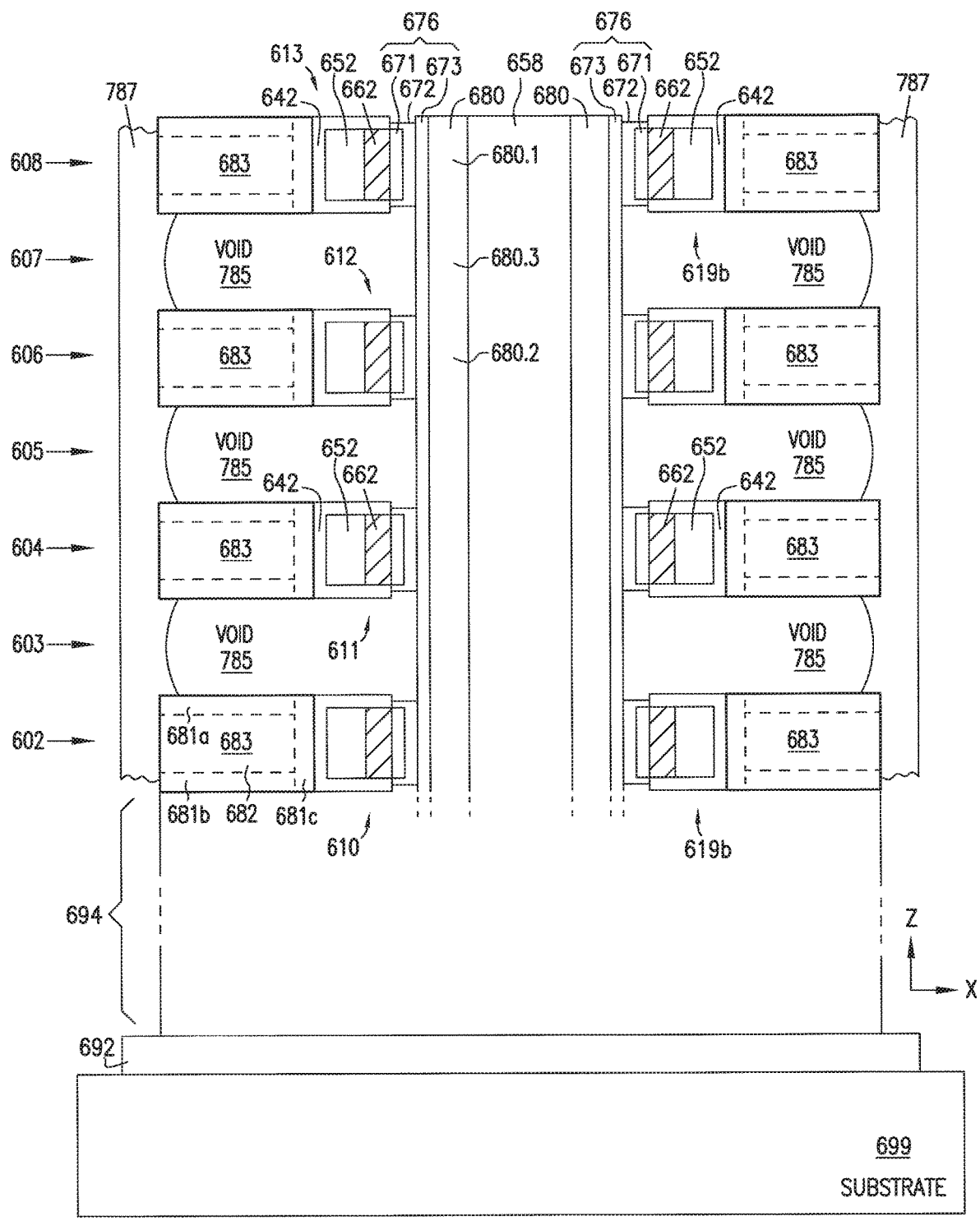

In FIG. 3B, the structure of the portion of memory device 300B can be a variation of the structure of the portion of memory device 300A of FIG. 3A. Differences between memory devices 300A and 300B include (as shown in FIG. 3B) the exclusion (e.g., omission) of a portion of tunnel dielectric 672 (e.g., silicon nitride) between two adjacent memory cell structures 619b in FIG. 3B. As shown in FIG. 3A, tunnel dielectric 673 (e.g., silicon oxide) between two adjacent memory cell structures 619a is unexposed (not exposed) to a corresponding void (one of voids 685 in FIG. 3A). In FIG. 3B, since a portion of tunnel dielectric 672 (e.g., silicon nitride) between two adjacent memory cell structures 619b is omitted (e.g., removed), a portion of tunnel dielectric 673 (e.g., silicon oxide) between two adjacent memory cell structures 619b is exposed to a corresponding void (one of voids 785). Each of voids 785 is an empty space that can contain air (an air-filled void (e.g., an air gap)) or gas (a gas-filled void). Memory device 300B can include sealing dielectric 787 (which is similar to sealing dielectric 687 of FIG. 3A) to seal off voids 785 in memory device 300B.

Figure 3C:
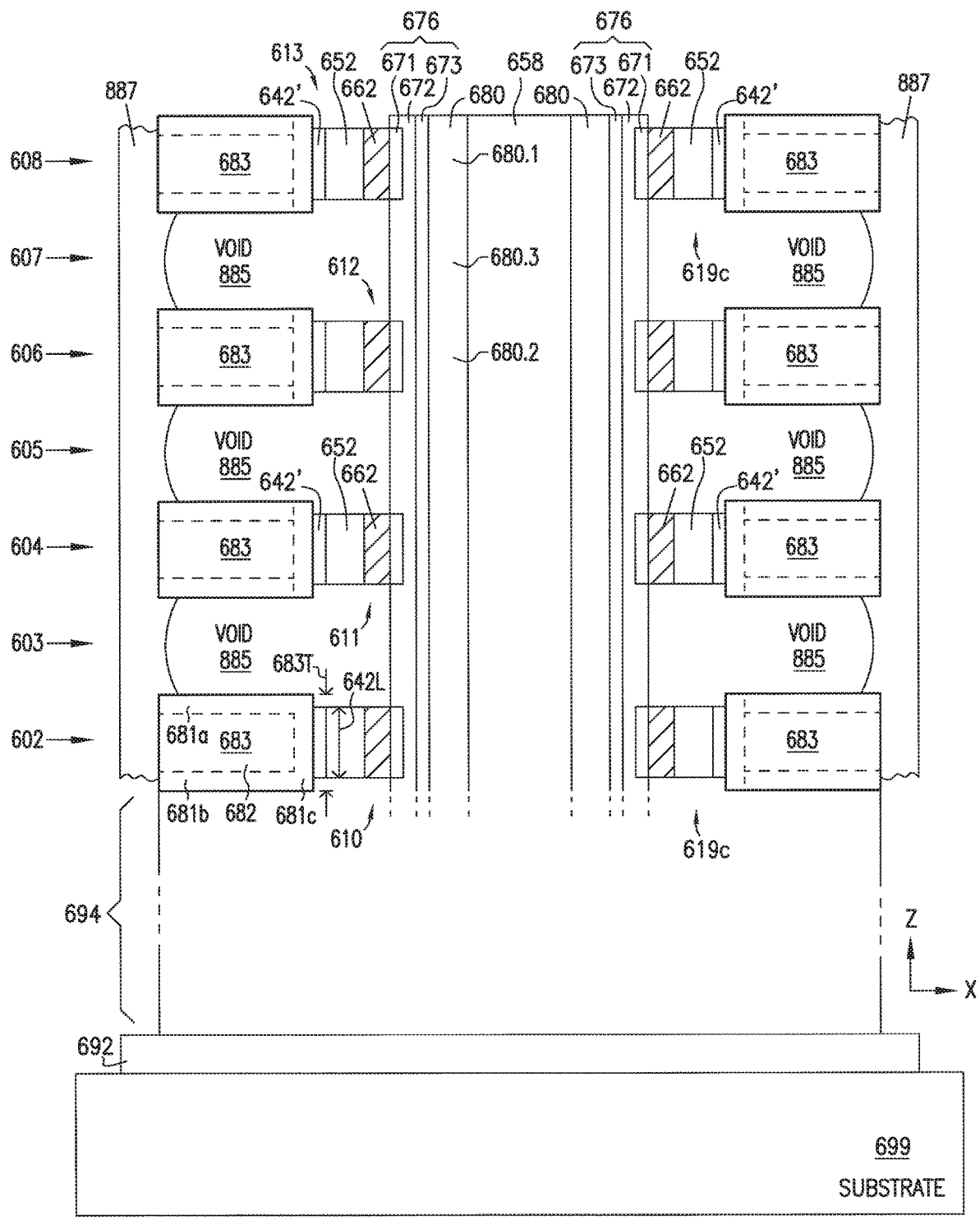

In FIG. 3C, the structure of the portion of memory device 300C can be a variation of the structure of the portion of memory device 300A of FIG. 3A. Differences between memory devices 300C and 300A include (as shown in FIG. 3C) the structure of dielectric barrier 642' in FIG. 3C. As shown in FIG. 3C, dielectric barrier 642' can be dielectric barrier 642 (e.g., aluminum oxide or other high-k dielectric) of FIG. 3A where a portion (e.g., a top part and a bottom part) of dielectric barrier 642 in FIG. 3A is removed from each of memory cell structures 619c. In FIG. 3C, since a portion of dielectric barrier 642 in each of memory cell structures 619c is omitted (e.g., removed) from each of memory cell structures 619c, dielectric blocking region 652 and memory element 662 in each of memory cell structures 619c are exposed to a corresponding void (one of voids 885) or exposed to two corresponding voids 885. Each of voids 885 is an empty space that can contain air (an air-filled void (e.g., an air gap)) or gas (a gas-filled void).

As shown in FIG. 3C, each of gates 683 has thickness 683T extending in the z-direction perpendicular to the x-direction (which is the direction channel 680 to gates 683. FIG. 3C also shows that dielectric barrier 642' has length 642L (extending in the z-direction) less than thickness 683T of the gates 683. As a comparison with FIG. 3A, the length of dielectric barrier 642 can be at most equal to the thickness (e.g., thickness 683T) of each of gates 683. Memory device 300C can include sealing dielectric 887 (which is similar to sealing dielectric 687 of FIG. 3A) to seal off voids 885 in memory device 300C.

Figure 3D:
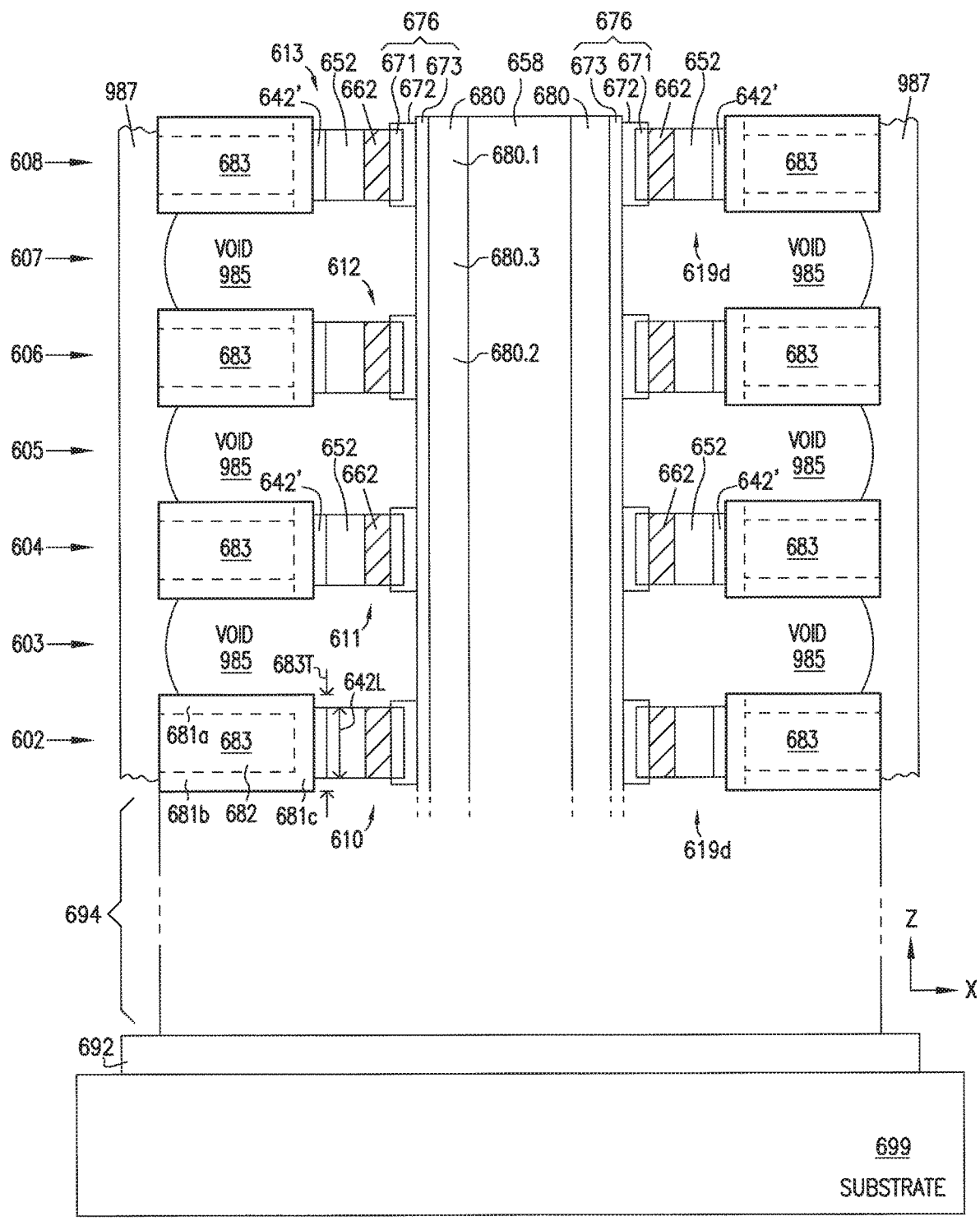

In FIG. 3D, the structure of the portion of memory device 300D can be a variation of the structure of the portion of memory device 300C of FIG. 3C. Differences between memory devices 300D and 300C include (as shown in FIG. 3D) the exclusion (e.g., omission) of a portion of tunnel dielectric 672 (e.g., silicon nitride) between two adjacent memory cell structures 619d in FIG. 3D. As shown in FIG. 3D, since a portion of tunnel dielectric 672 (e.g., silicon nitride) between two adjacent memory cell structures 619d is omitted (e.g., removed), a portion of tunnel dielectric 673 (e.g., silicon oxide) between two adjacent memory cell structures 619d is exposed to a corresponding void (one of voids 985). Each of voids 985 is an empty space that can contain air (an air-filled void (e.g., an air gap)) or gas (a gas-filled void). Memory device 300D can include sealing dielectric 987 (which is similar to sealing dielectric 687 of FIG. 3A) to seal off voids 985 in memory device 300D.

Figure 3E:
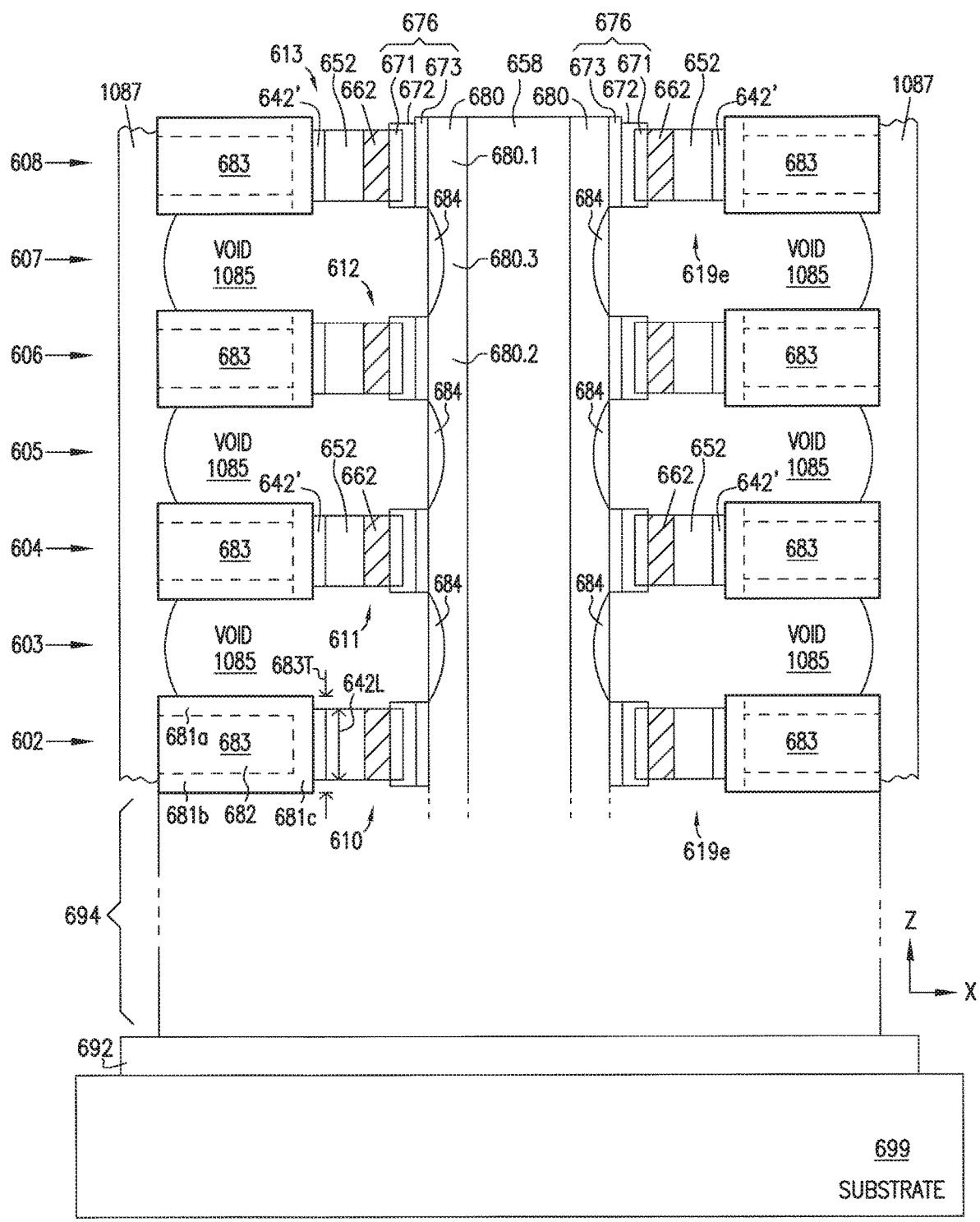

In FIG. 3E, the structure of the portion of memory device 300E can be a variation of the structure of the portion of memory device 300D of FIG. 3D. Differences between memory devices 300E and 300D include (as shown in FIG. 3E) the inclusion (e.g., addition) of a region 684 in a channel portion (e.g., channel portion 680.3) of channel 680 that is exposed to voids 1085. Each of voids 1085 is an empty space that can contain air (an air-filled void (e.g., an air gap)) or gas (a gas-filled void). Region 684 (e.g., doped region) can have an amount of dopants (e.g., doping concentration) that is different from an amount of dopants (e.g., doping concentration) in each of channel portions 680.1 and 680.2. Memory device 300E can include sealing dielectric 1087 (which is similar to sealing dielectric 687 of FIG. 3A) to seal off voids 1085 in memory device 300E.

Figure 4A:
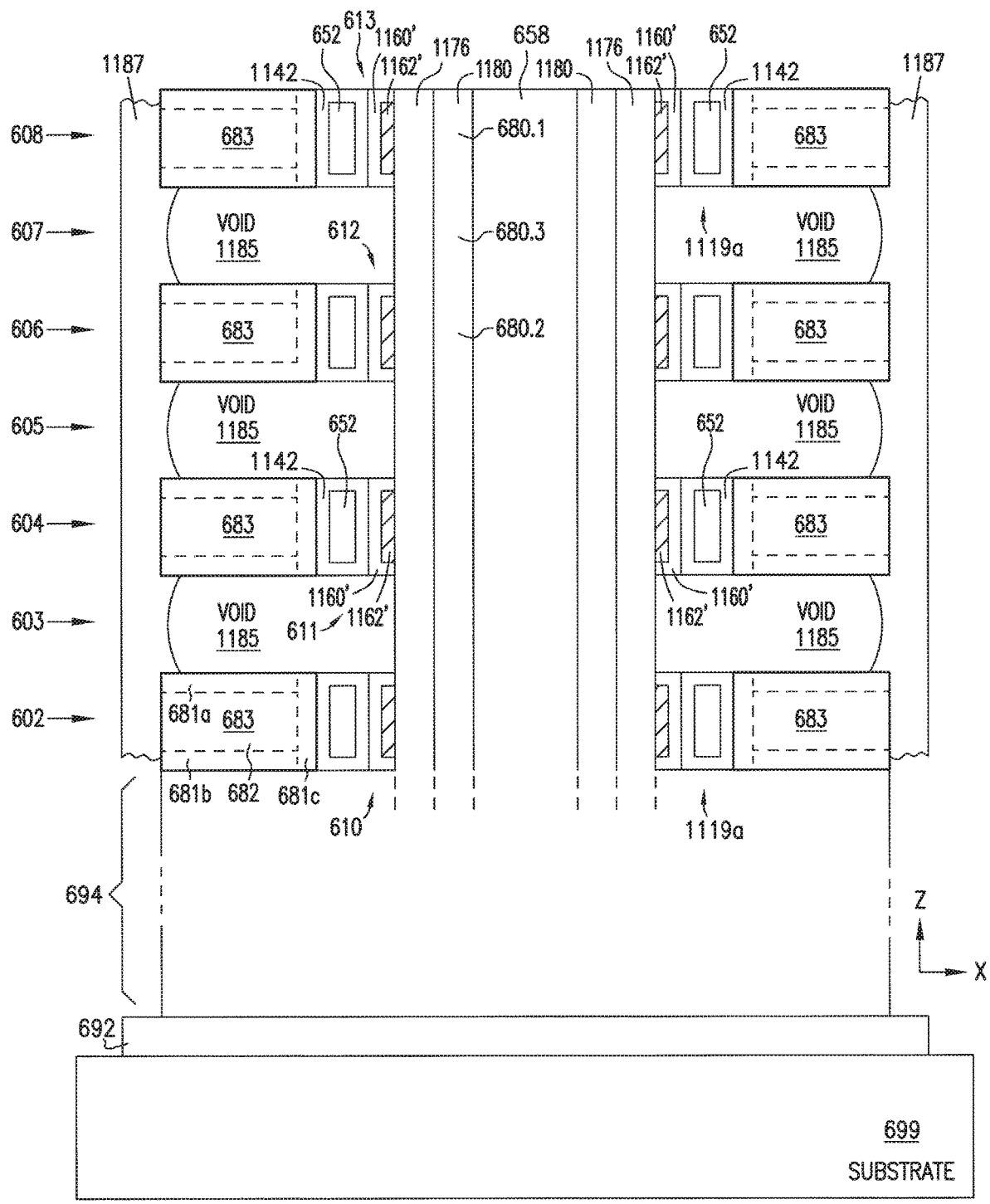
FIG. 4A and FIG. 4B show side views of structures of portions of different memory devices having voids and polysilicon memory elements, according to some embodiments described herein.

As shown in FIG. 4A, memory device 400A can include elements similar to or identical to those of memory device 300A of FIG. 3A. Memory device 400A can include memory cell structures 1119a, a channel 1180, and voids 1185. Each of voids 1185 is an empty space that can contain air (an air-filled void (e.g., an air gap)) or gas (a gas-filled void). Each memory cell structure 1119a can be located between a respective gate (one of gates 683) and a channel portion of channel 1180. For example, memory cell 613 can include memory cell structure 1119a located between one of gates 683 and channel portion 680.1, and memory cell 612 can include memory cell structure 1119a located between one of gates 683 and channel portion 680.2.

Each of voids 1185 can be located (e.g., can occupy a location) between two adjacent gates 683 and between two adjacent memory cell structures 1119a. For example, FIG. 4A shows a void (one of voids 1185) located between two adjacent gates 683 associated with two corresponding memory cell structures 1119a of memory cells 612 and 613. Each of voids 1185 can be separated from channel portion (e.g., channel portion 680.3) of channel 1180 by a dielectric region (which is a portion of tunnel region 1176).

Each of memory cell structures 1119a can include a dielectric barrier (e.g., a dielectric region) 1142, a dielectric blocking region 652, material 1160', a memory element 1162', and a tunnel region (a portion of tunnel region 1176).

Channel 1180 can include a material similar to or identical to the material of channel 680 (FIG. 3A). Tunnel region 1176 can be a single tunnel dielectric (e.g., oxide). Alternatively, tunnel region 1176 can include a combination of multiple tunnel dielectrics (e.g., different layers of dielectric materials). Memory element 1162' can be polysilicon. Alternatively, memory element 1162' can include other materials that can trap charge. Material 1160' can include metal, a metallic compound, or a combination of metals and metallic compounds. Material 1160' can surround the top, the bottom, and a side of memory element 1162'. In an alternative structure of memory device 400A, material 1160' can be omitted from memory device 400A, such that memory element 1162' can contact dielectric barrier 1142. As shown in FIG. 11G, dielectric barrier 1142 (e.g., high-k dielectric material) can surround dielectric blocking region 652 (e.g., silicon oxide). Memory device 400A can include sealing dielectric 1187 (which is similar to sealing dielectric 687 of FIG. 3A) to seal off voids 1185 in memory device 400A.

Figure 4B:
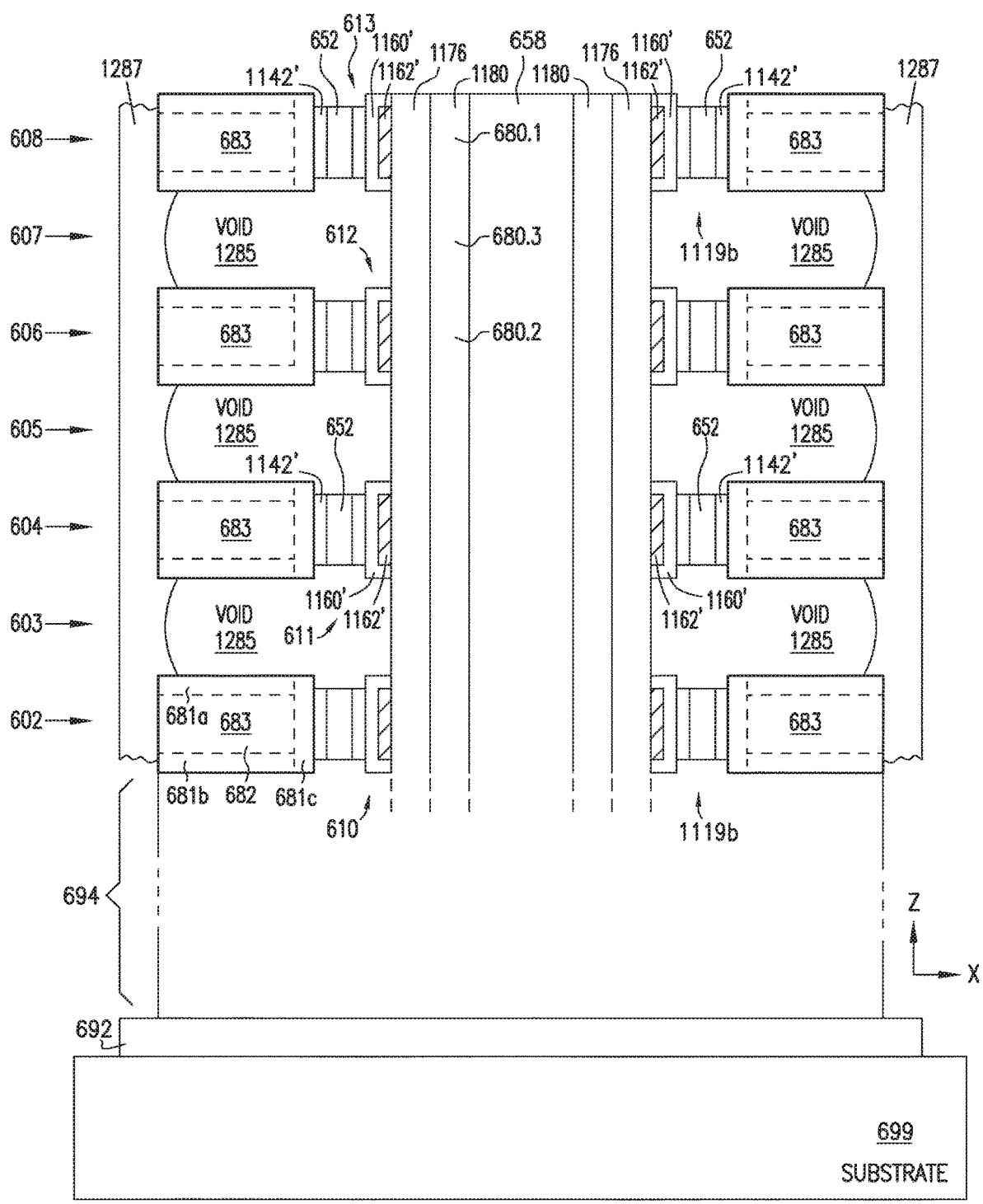

In FIG. 4B, the structure of the portion of memory device 400B can be a variation of the structure of the portion of memory device 400A of FIG. 4A. Differences between memory devices 400B and 400A include (as shown in FIG. 4B) the structure of dielectric barrier 1142' in FIG. 4B. As shown In FIG. 4B, dielectric barrier 1142' can be dielectric barrier 642 (e.g., aluminum oxide or other high-k dielectric) of FIG. 3A where of a portion (e.g., a top part and a bottom part) of dielectric barrier 1142 in FIG. 4A is removed from each of memory cell structures 1119b. In FIG. 4B, since a portion of dielectric barrier 642 in each of memory cell structures 1119b is omitted (e.g., removed) from each of memory cell structures 1119b, dielectric blocking region 652 and memory element 1162' in each of memory cell structures 1119b are exposed to a corresponding void (one of voids 1285) or exposed to two corresponding voids 1285. Each of voids 1285 is an empty space that can contain air (an air-filled void (e.g., an air gap)) or gas (a gas-filled void). Memory device 400B can include sealing dielectric 1287 (which is similar to sealing dielectric 687 of FIG. 3A) to seal off voids 1285 in memory device 400B.

Figure 5A:
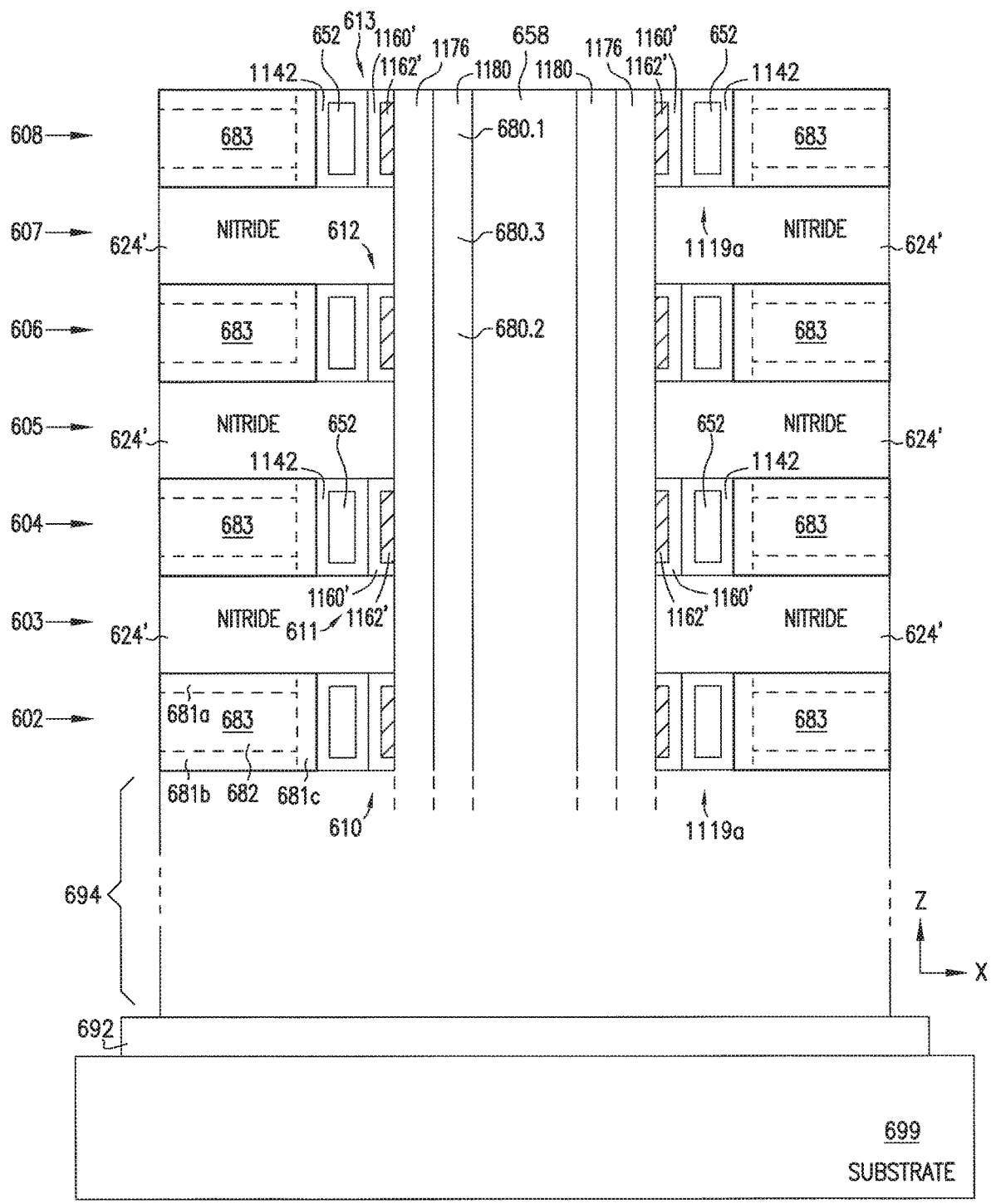
FIG. 5A and FIG. 5B show side views of structures of portions of different memory devices that can be variations of the memory devices of FIG. 4A and FIG. 4B, according to some embodiments described herein.

In FIG. 5A, the structure of the portion of memory device 500A can be a variation of the structure of the portion of memory device 400A of FIG. 4A. Differences between memory devices 500A and 400A include the absence of voids 1185 in FIG. 5A. As shown in FIG. 5, memory device 500A can include dielectric material (e.g., silicon nitride) 624' that occupies the same locations that voids 1185 occupy in memory device 400A (FIG. 4A).

Figure 5B:
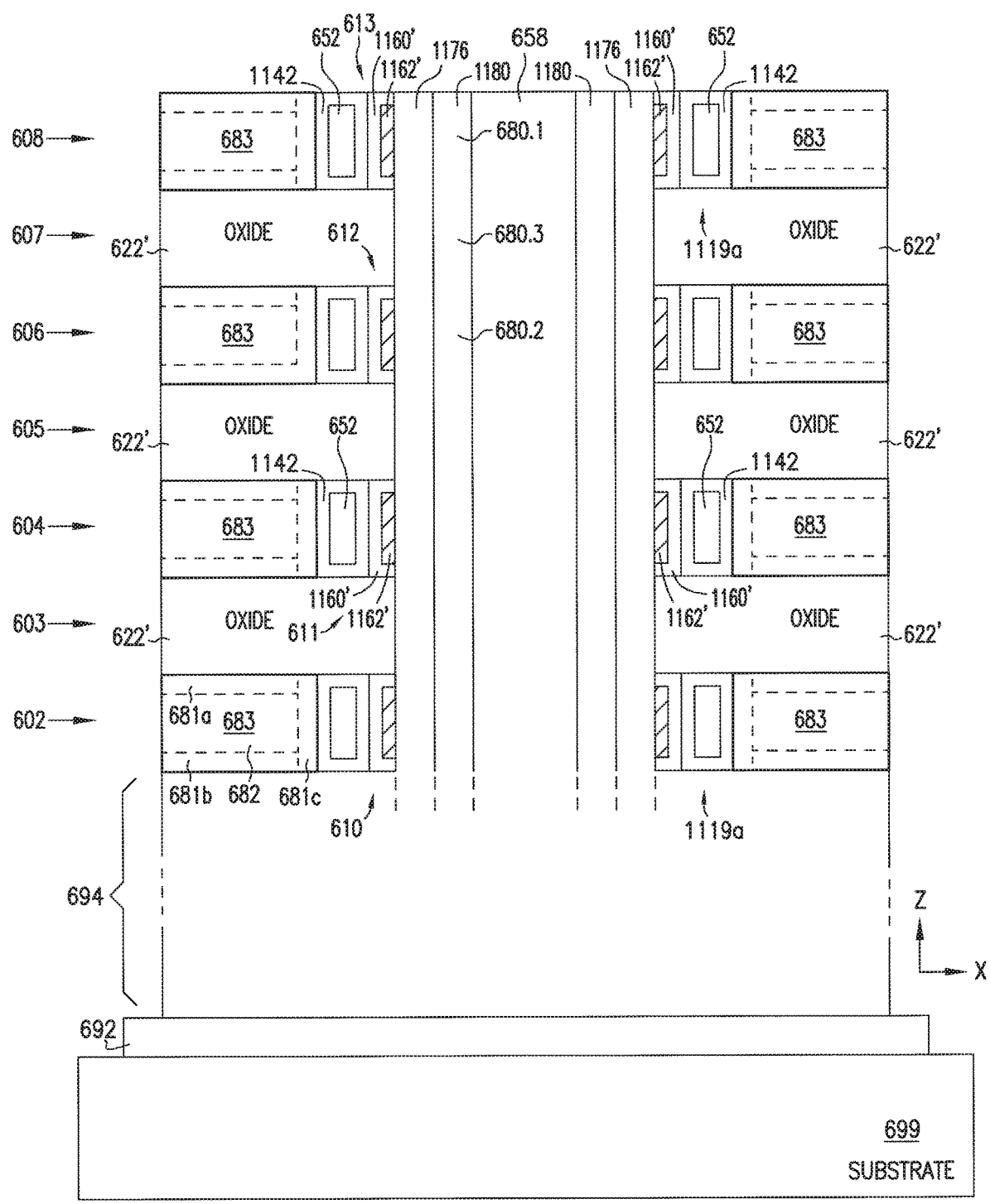

In FIG. 5B, the structure of the portion of memory device 500B can be a variation of the structure of the portion of memory device 400A of FIG. 4A. Differences between memory devices 500B and 400A include the absence of voids 1185 in FIG. 5B. As shown in FIG. 5B, memory device 500B can include dielectric material (e.g., silicon nitride) 622' that occupies the same locations that voids 1185 occupy in memory device 400A (FIG. 4A).

The voids in the memory devices described herein (e.g., the memory devices shown in FIG. 2A through FIG. 5B) allow the distance (e.g., vertical spacing) between tiers (e.g., vertical tier pitch in the z-direction) of memory cells of the memory device 600 to be relatively smaller (e.g., about 30 nanometers or less). A smaller distance (e.g., smaller vertical tier pitch (e.g., thinner tier pitch)) from one tier to another may allow elements with relatively smaller dimensions (e.g., smaller vertical sizes) to be formed in the memory devices described herein. This in turn may allow the described memory devices to have a higher memory storage density for a given device dimension (e.g., vertical dimension) in comparison with some conventional memory devices.

Further, the voids in the memory devices described herein can have other improvements over conventional memory devices. For example, the voids may reduce coupling capacitance between the gates (e.g., between local word lines), such as gates 283 (FIG. 2E) or gates 683 (FIG. 3A through FIG. 5B). In another example, as shown in FIG. 2D through FIG. 5B, the memory elements (e.g., memory element 262M, 662, or 1162') of the memory cells (e.g., memory cells 210, 211, 212, and 213, or memory cells 610, 611, 612, and 613) described herein are separated from each other (e.g., the material that forms the memory elements is not a continuous layer (e.g., film) of material). This separation can prevent charge from moving from one memory cell to another memory cell (an adjacent memory cell). This can improve the reliability of the information stored in the memory cells of the memory devices described herein. This can also reduce electrical resistance between memory cells, thereby further improving the performance of the memory devices described herein.

Figure 6A:
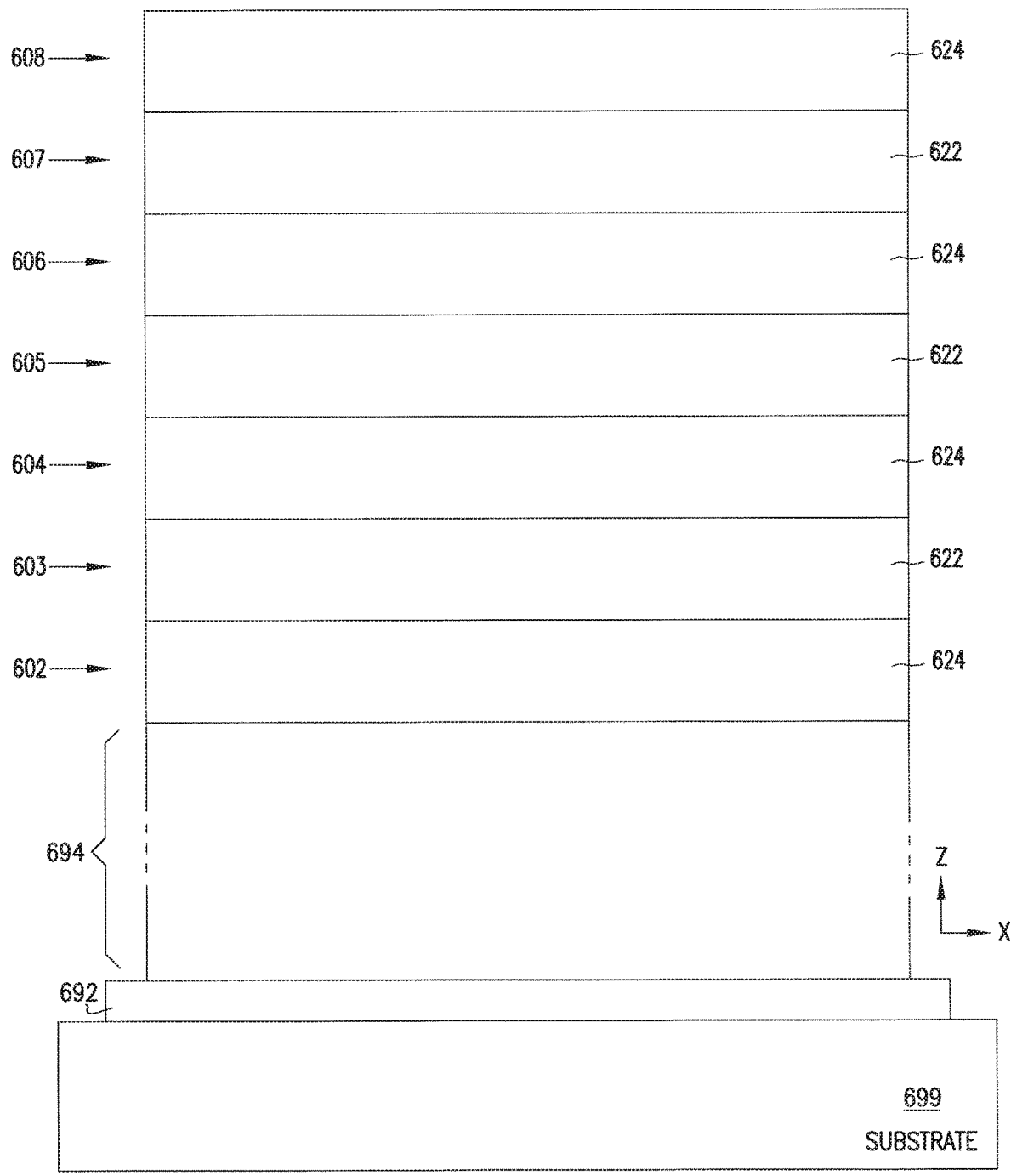
FIG. 6A through FIG. 6O show cross-sectional views of elements during processes of forming a memory device that can be the memory device of FIG. 3A, according to some embodiments of the invention.
Figure 6B:
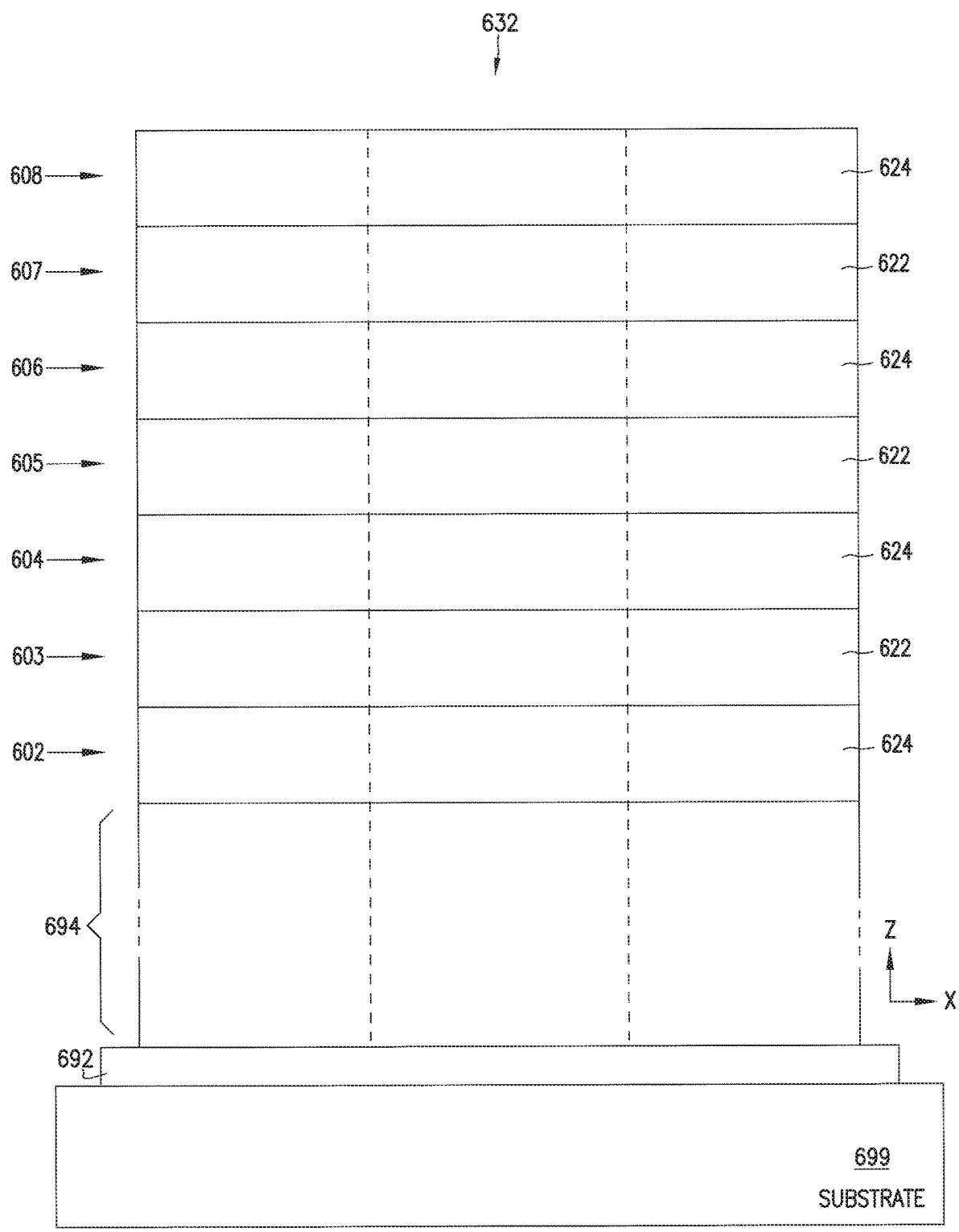
Figure 6C:
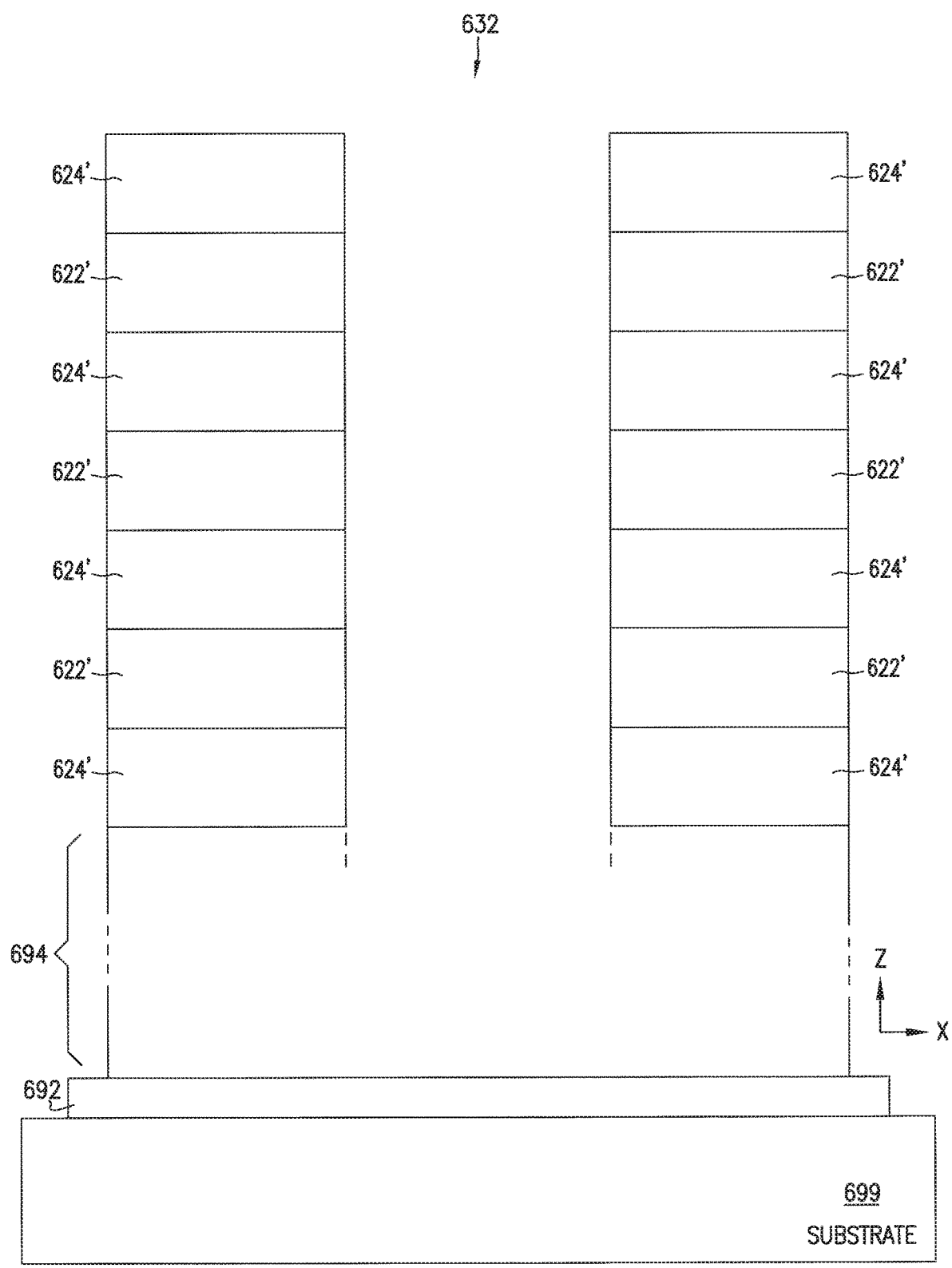
Figure 6D:
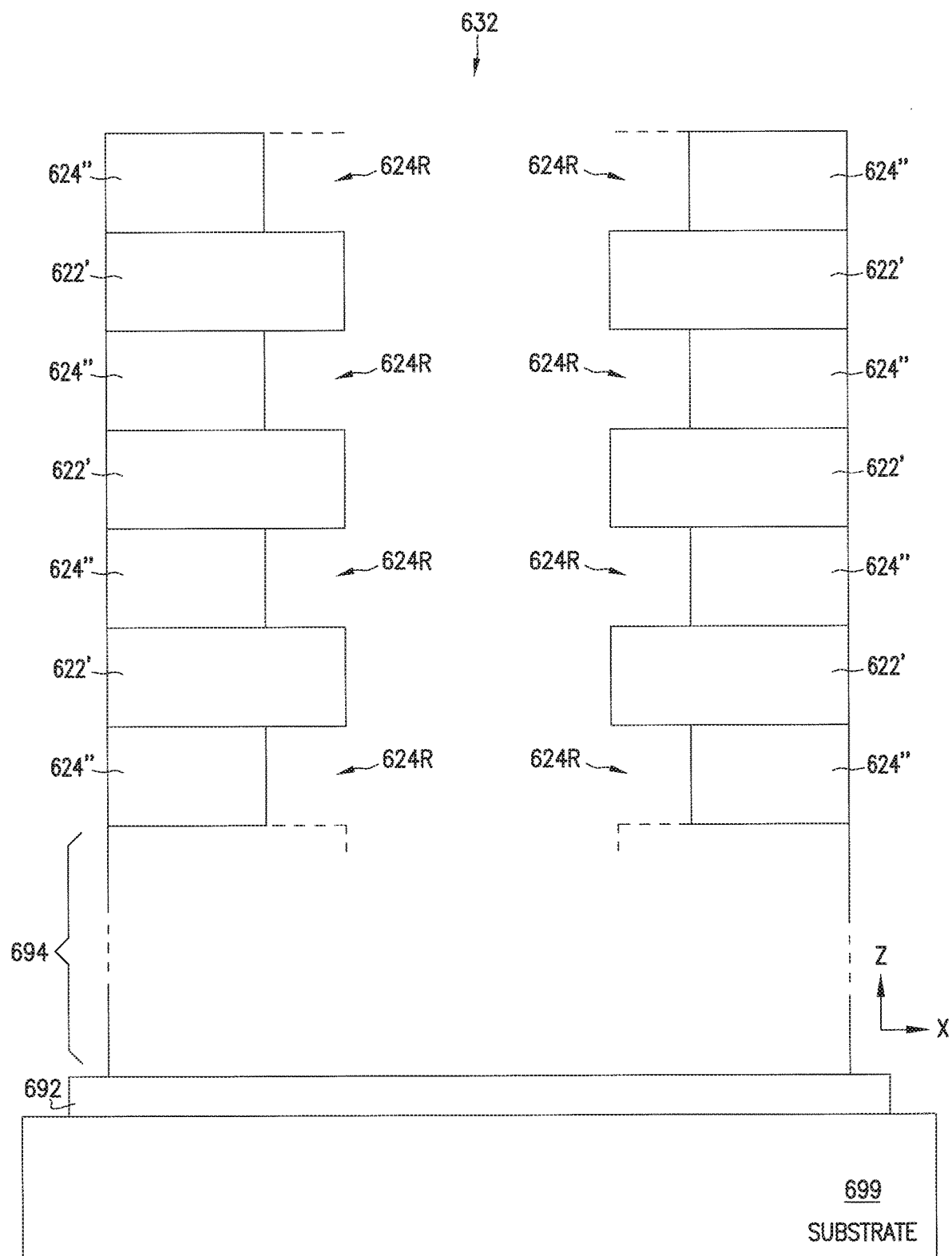
Figure 6E:
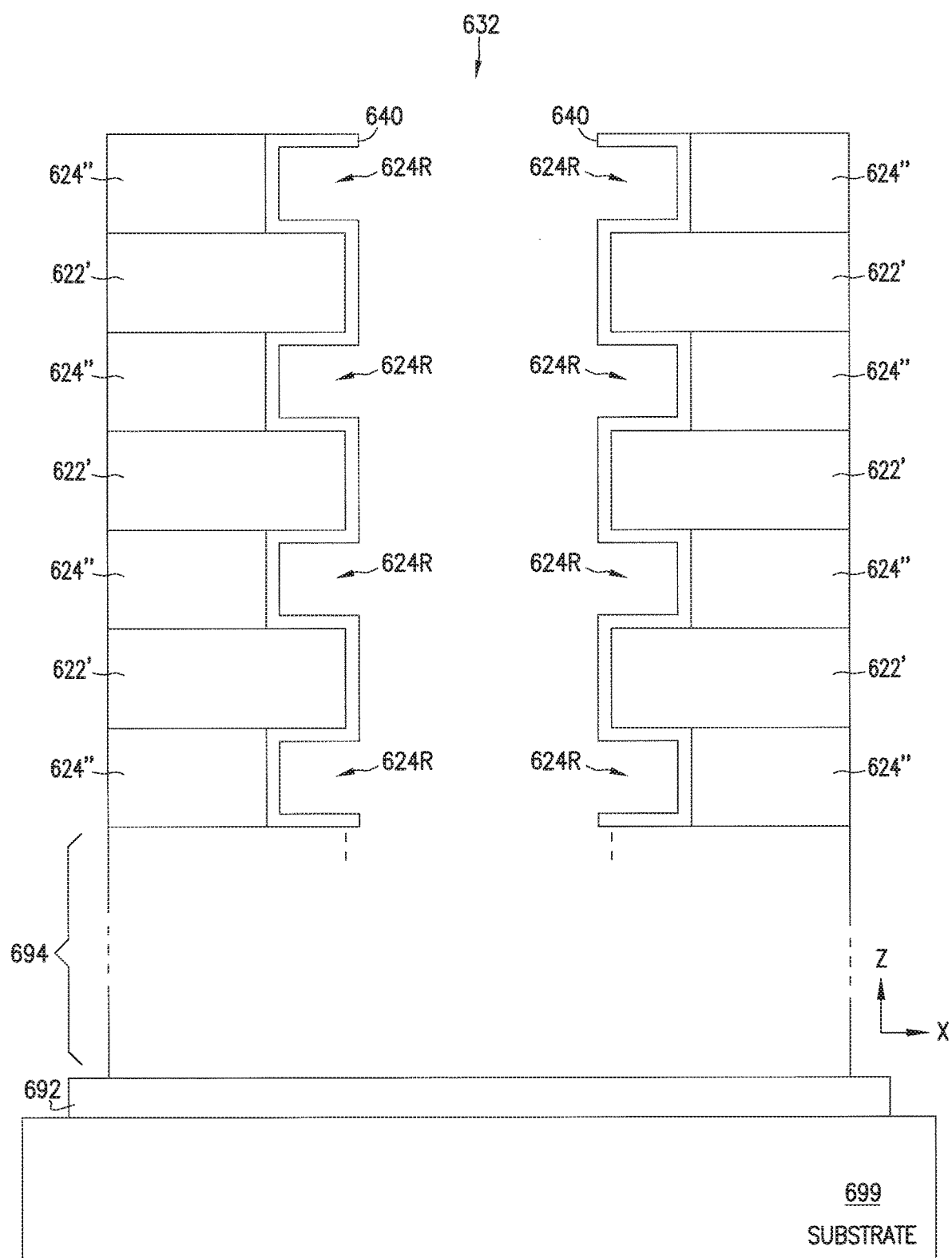
Figure 6F:
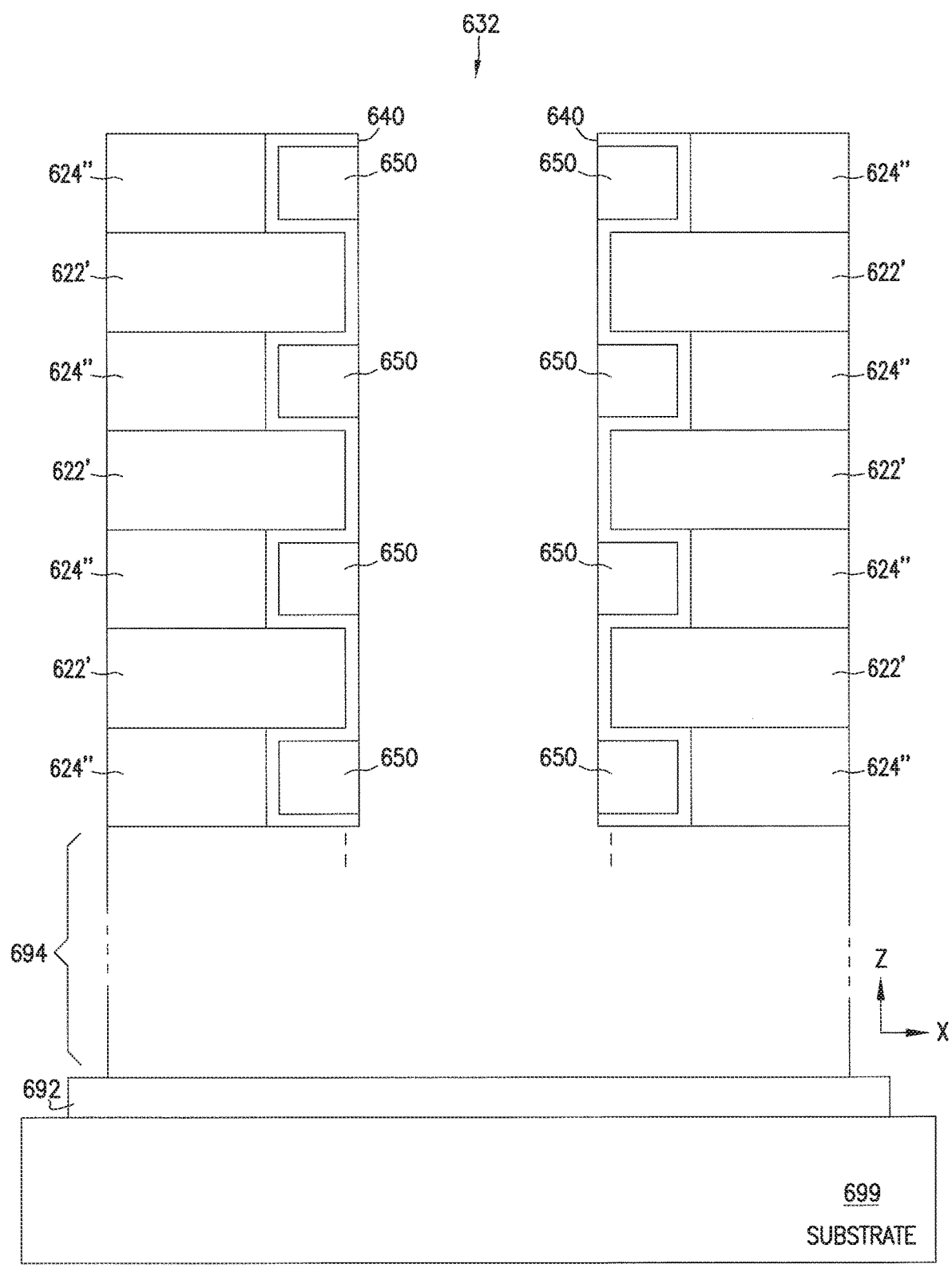
Figure 6G:
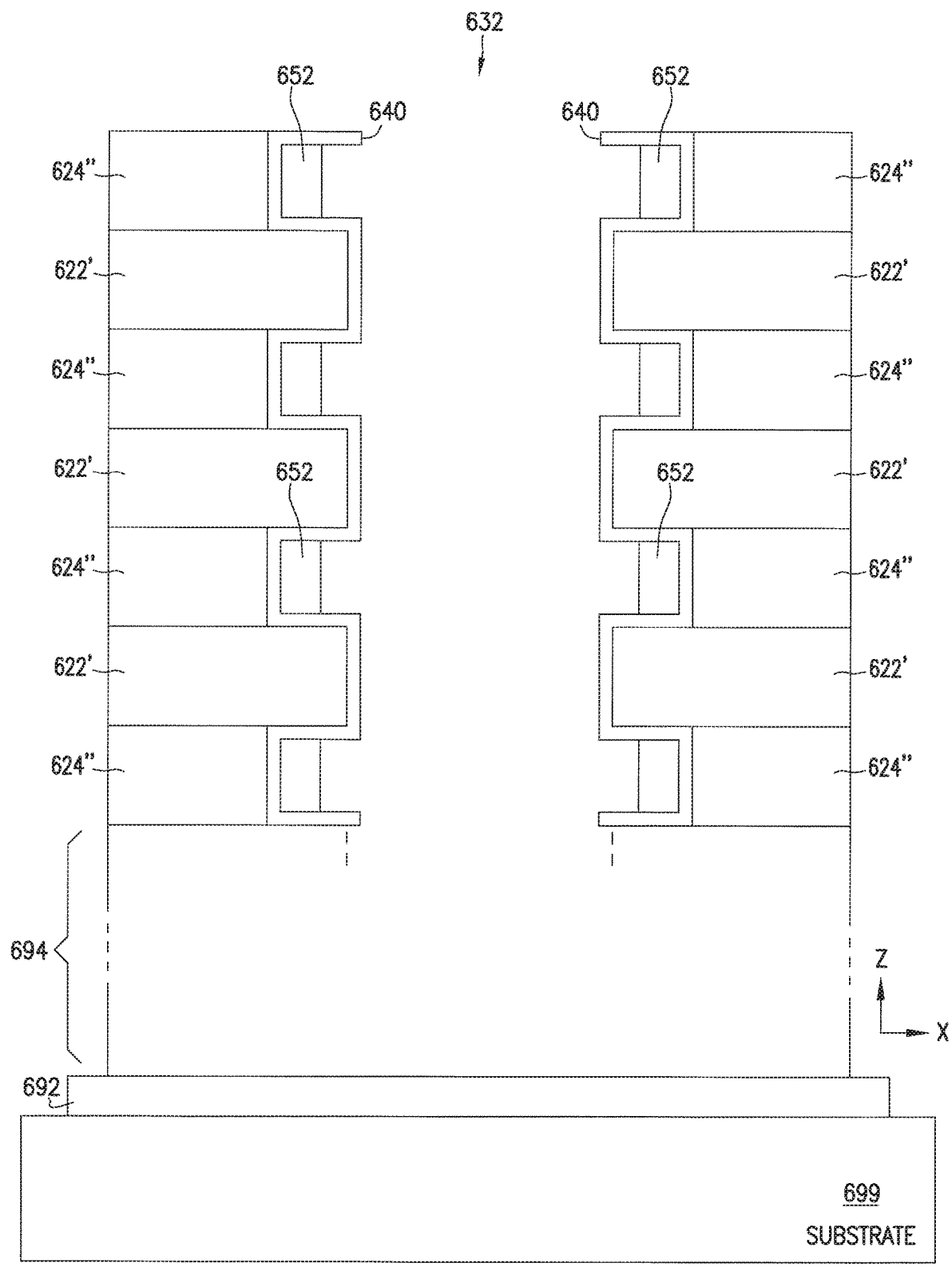
Figure 6H:
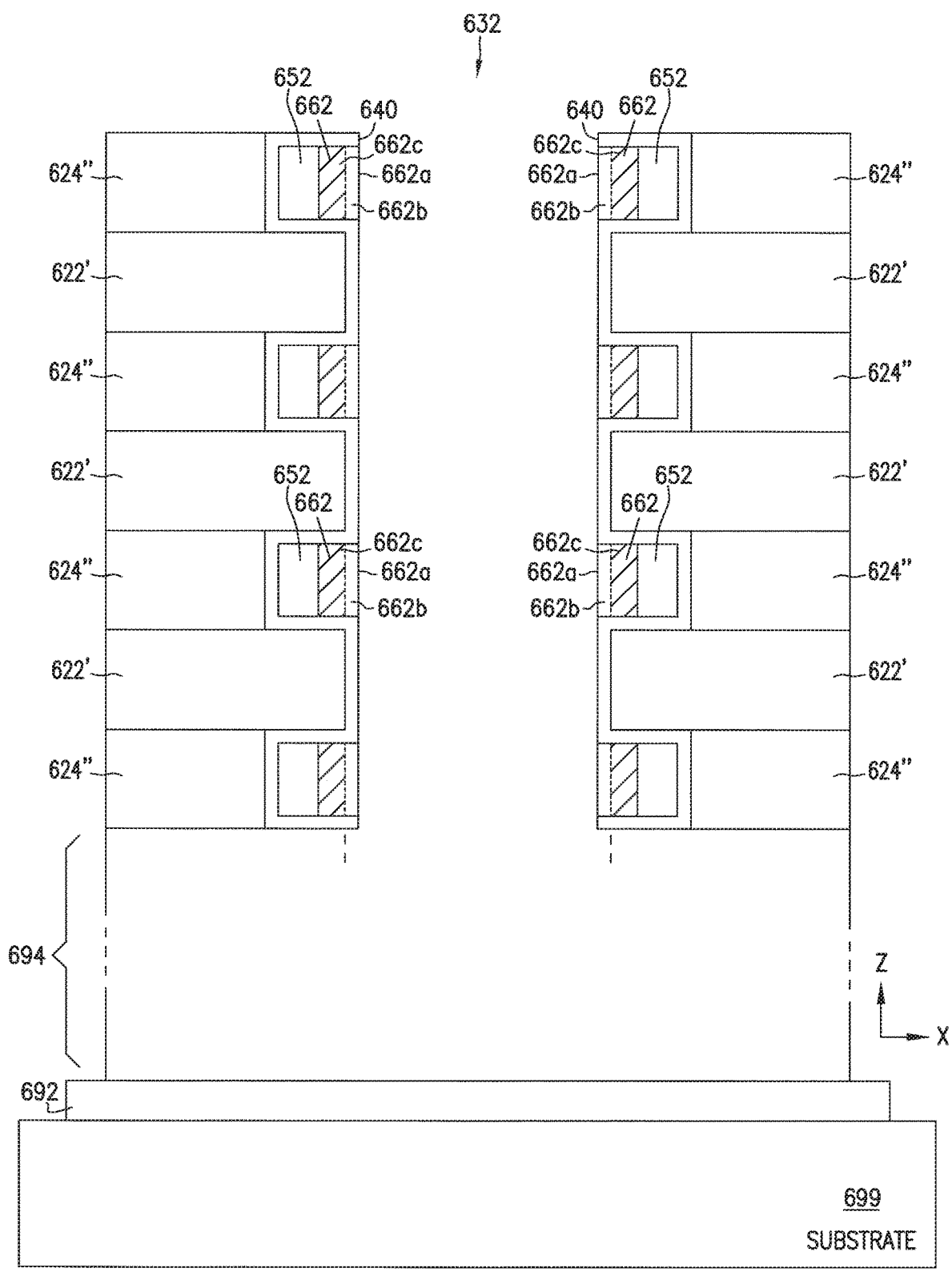
Figure 6I:
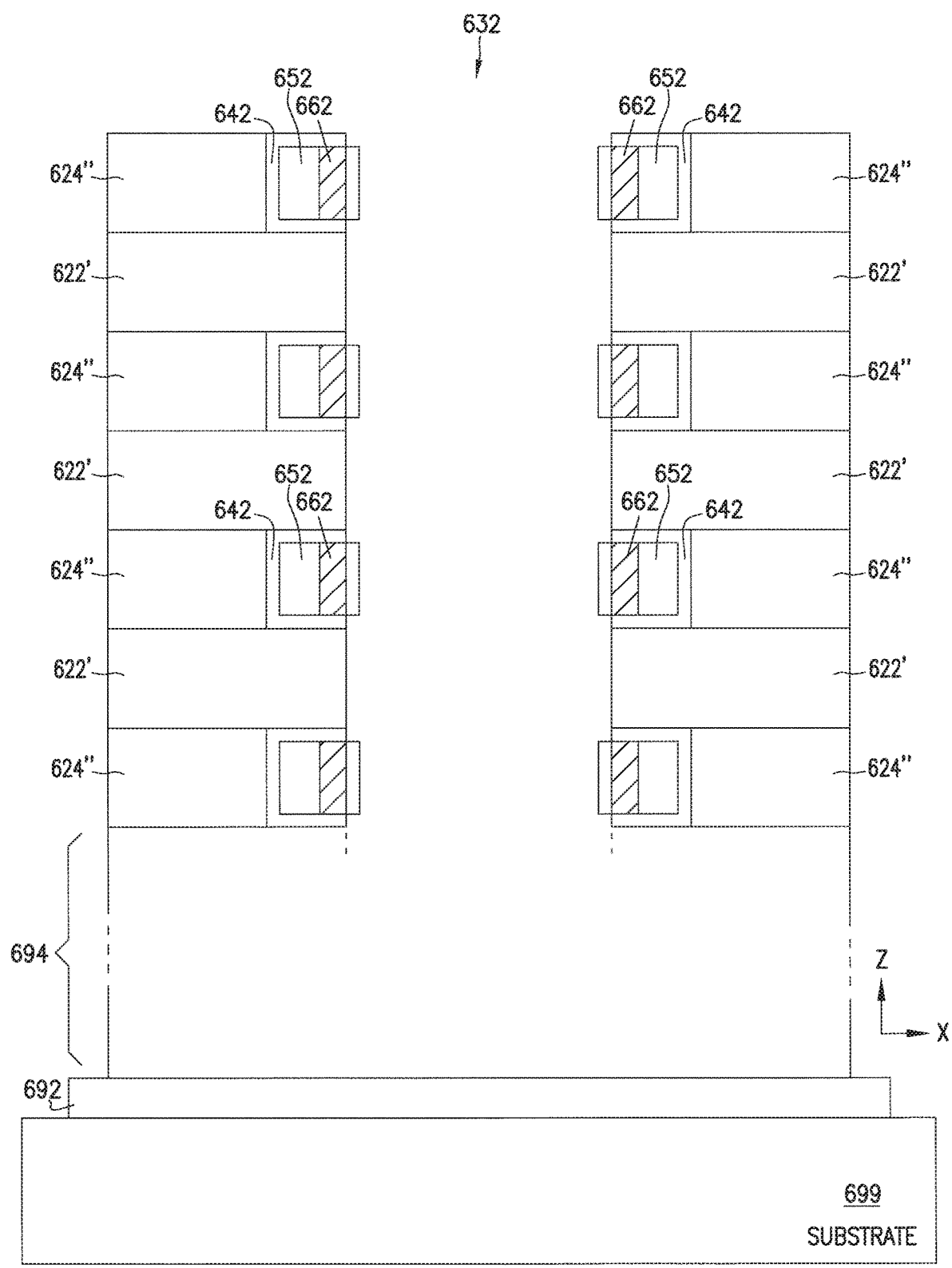
Figure 6J:
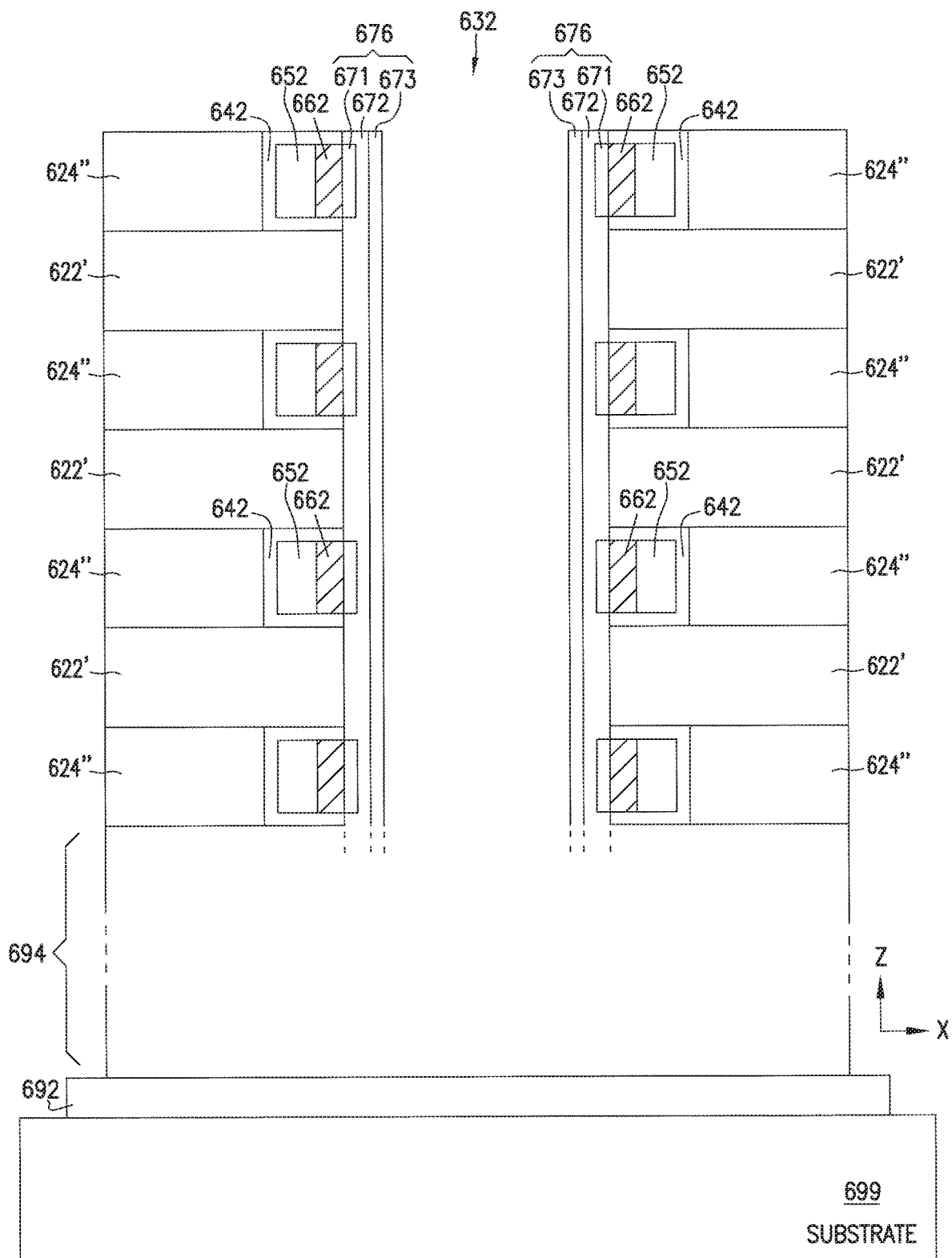
Figure 6K:
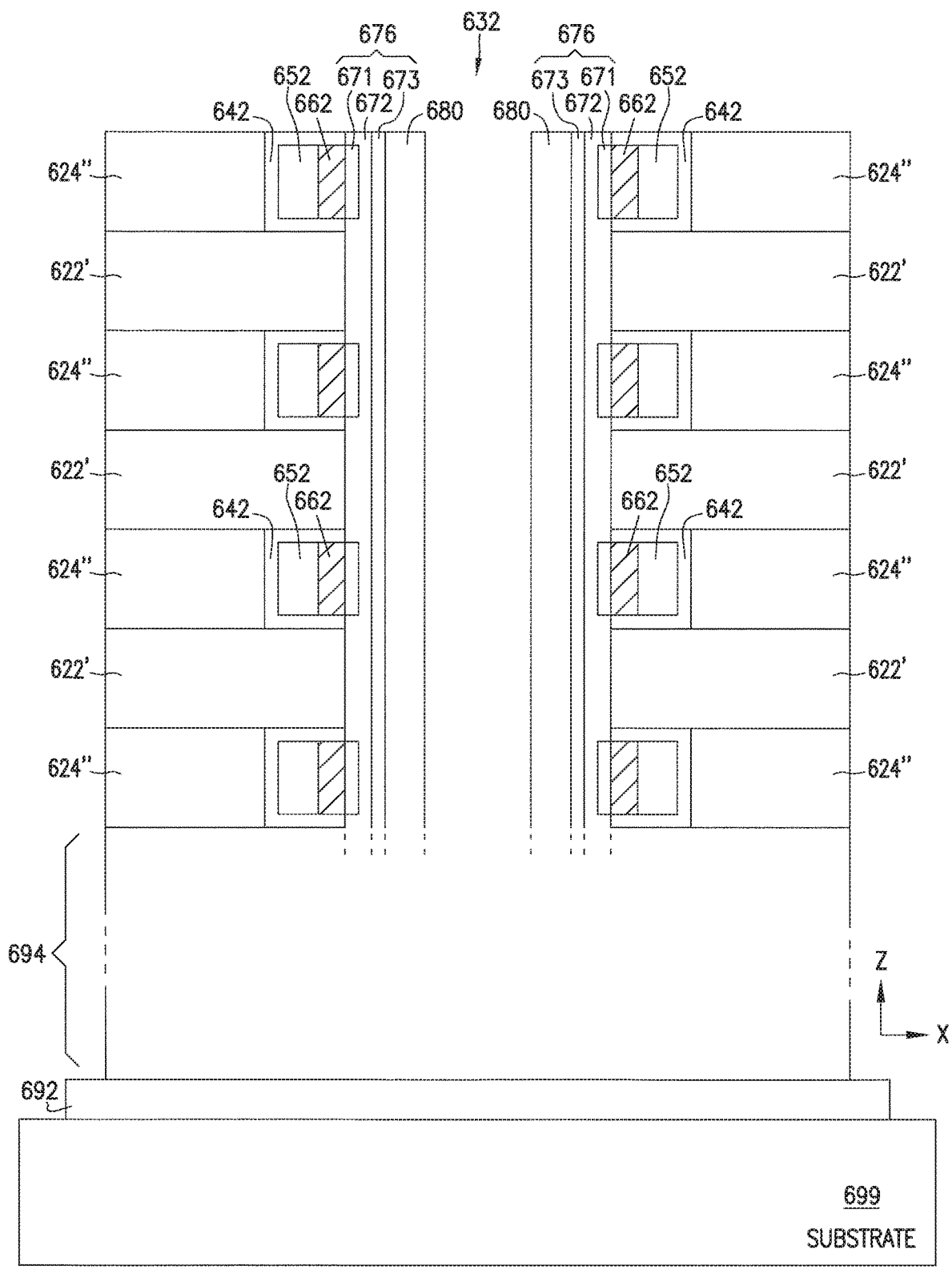
Figure 6L:
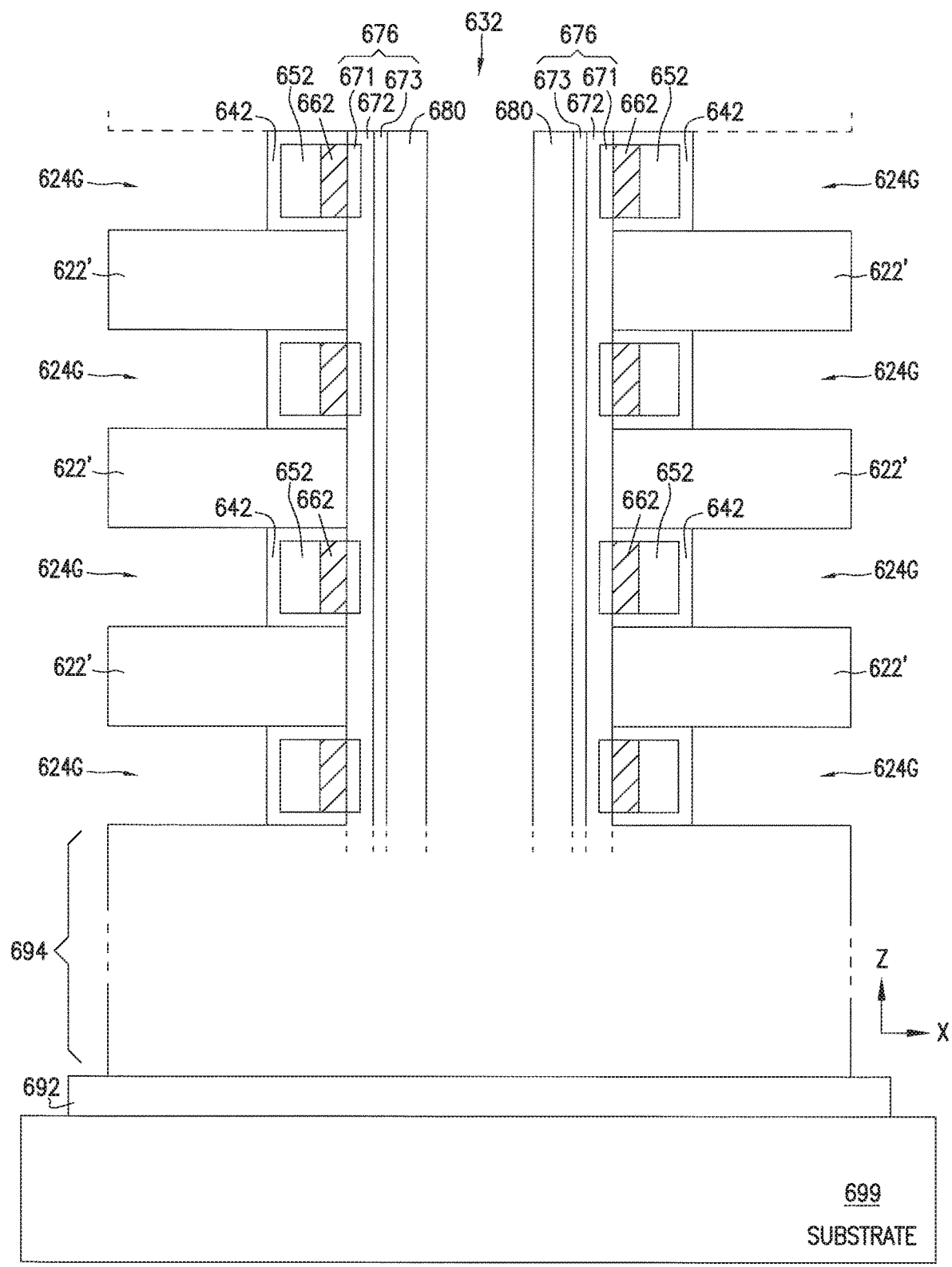
Figure 6M:
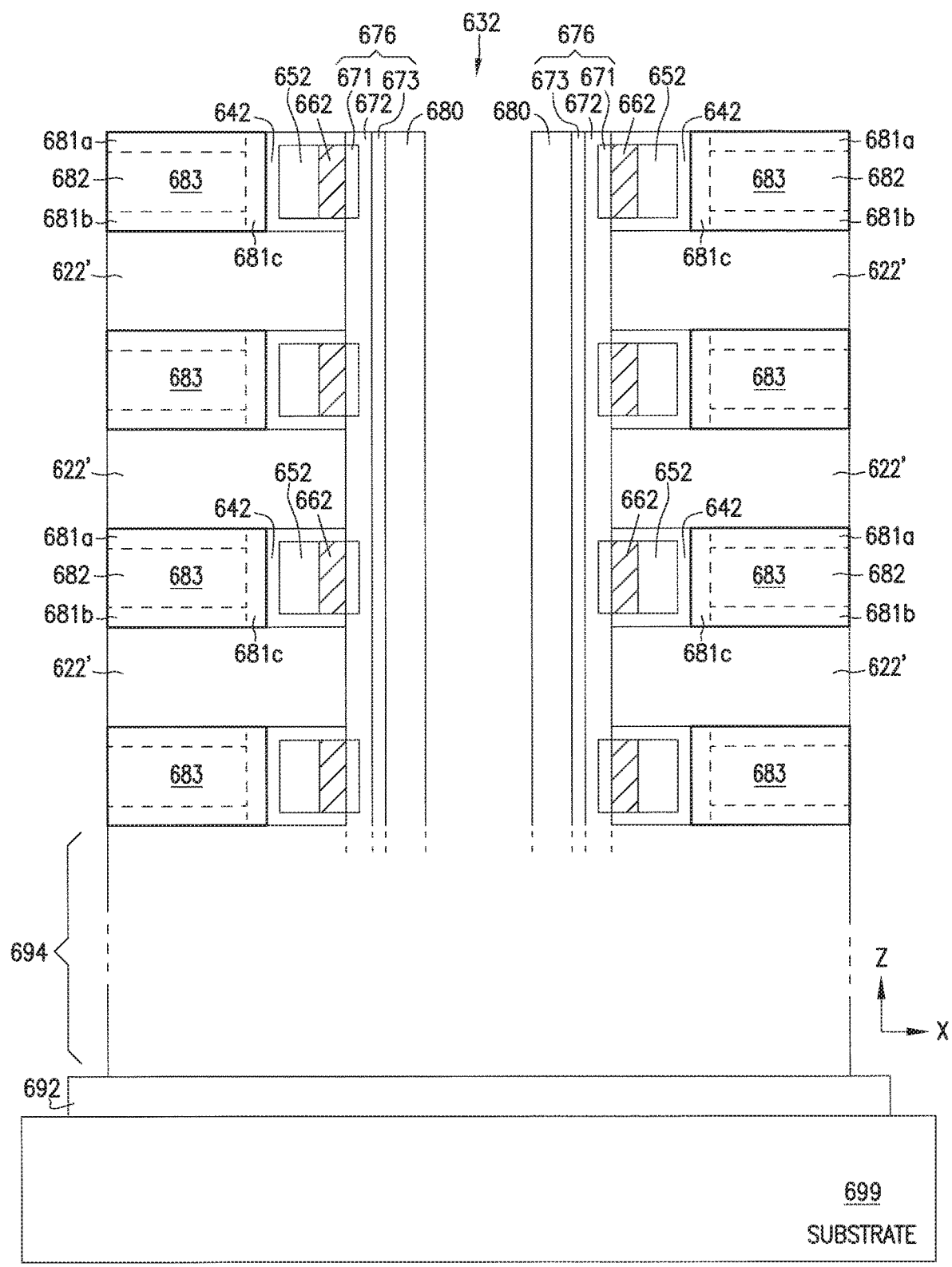
Figure 6N:
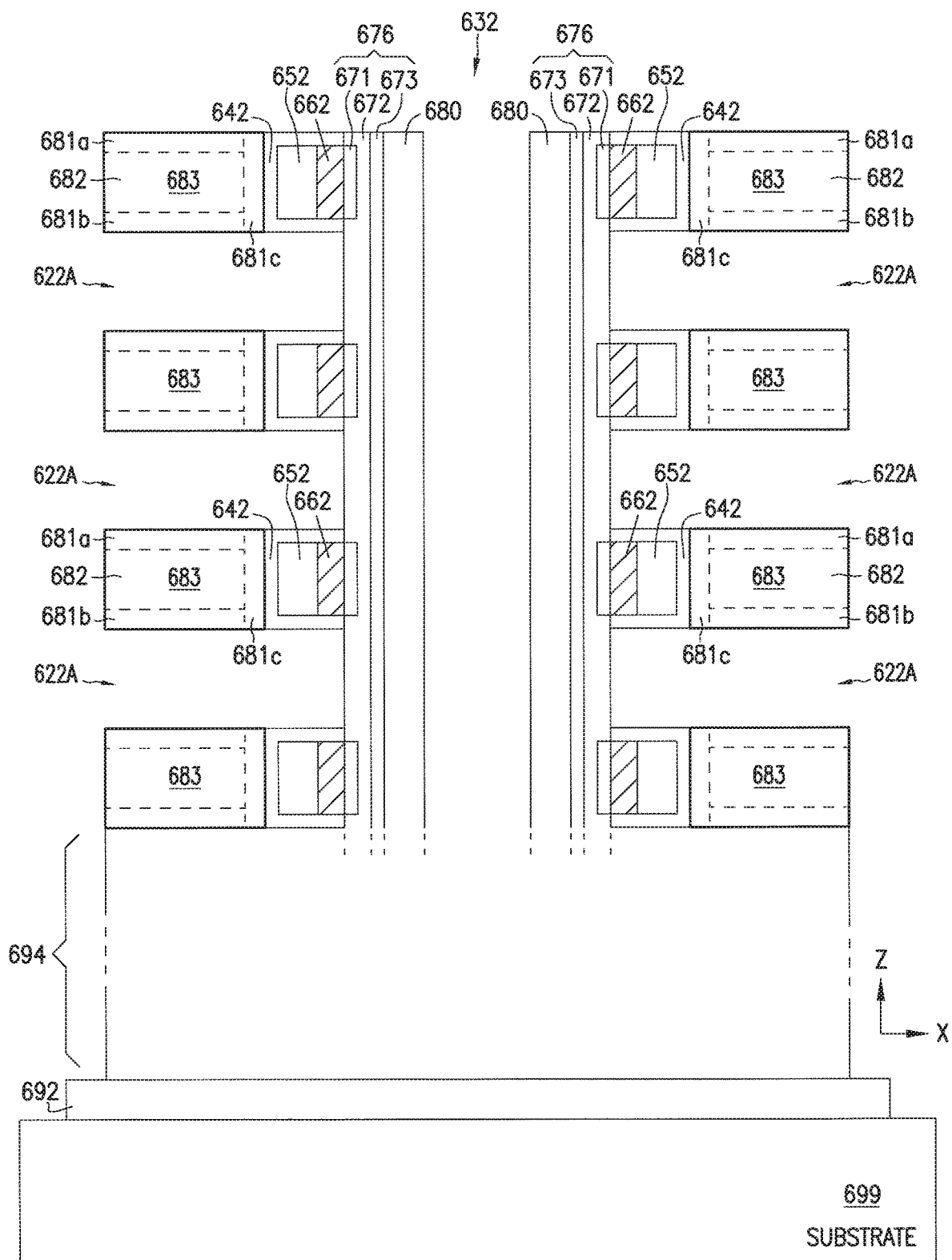
Figure 6O:
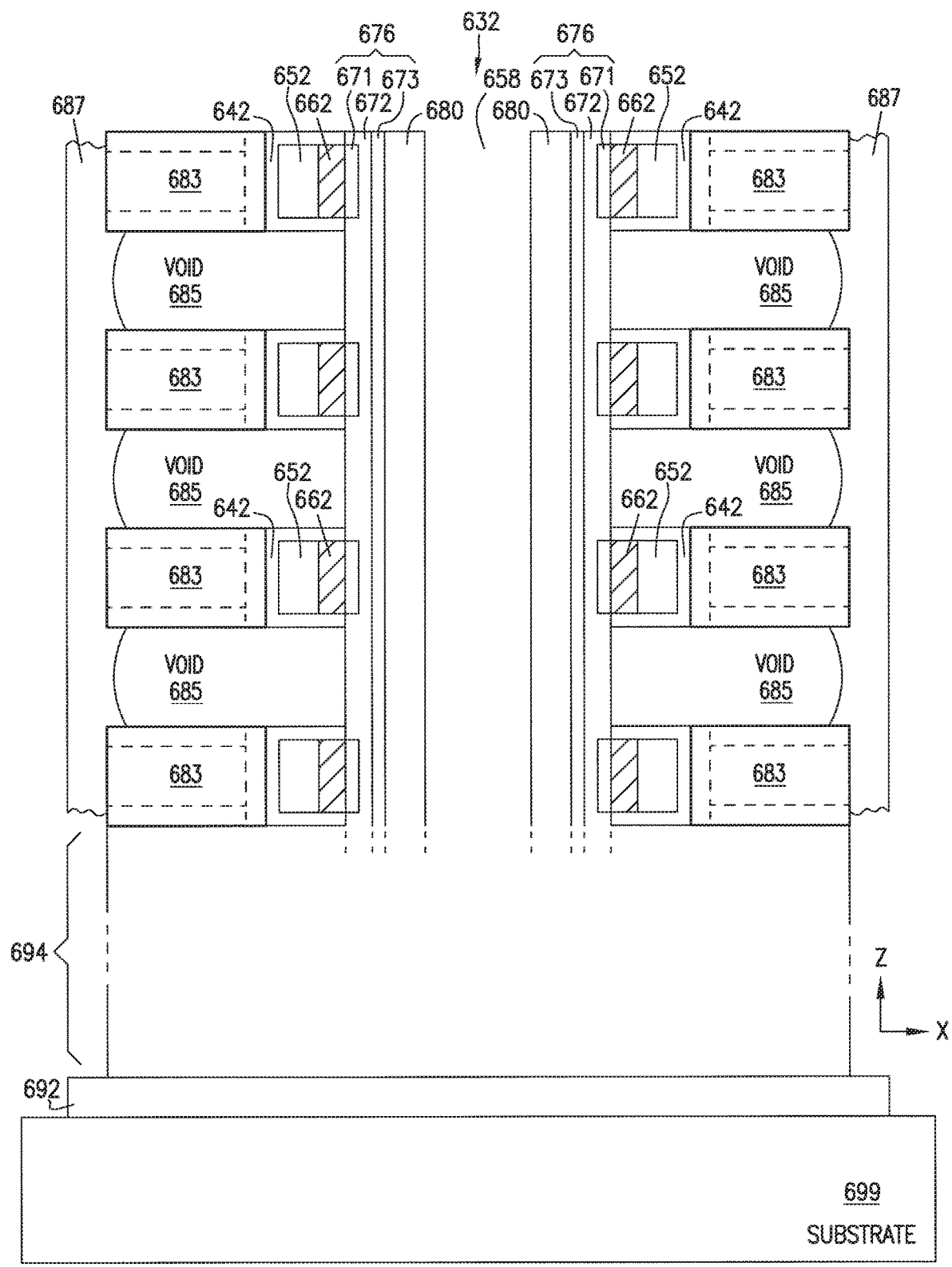

FIG. 6A through FIG. 6O show cross-sectional views of elements during processes of forming a memory device 600, according to some embodiments of the invention. FIG. 6A shows memory device 600 after dielectric materials 622 and 624 are formed in respective levels 602 through 608 in the z-direction. The z-direction (e.g., vertical direction) is a direction perpendicular to (e.g., outward from) substrate 699. The z-direction is also perpendicular to the x-direction. As shown in FIG. 6A, dielectric materials 622 and 624 can be formed over a portion 694 of memory device 600. In order not to obscure the embodiments described herein, the processes of forming the structure of portion 694 of memory device 600 are omitted. However, one skilled in the art can recognize that portion 694 can be formed to include a select transistor (e.g., a source select transistor) or multiple select transistors (e.g., multiple series-connected source select transistors) of a memory cell string. The select transistor (or select transistors) in portion 694 can be similar to select transistor 262 of FIG. 2C.

As shown in FIG. 6A, dielectric materials 622 and 624 can be formed over a conductive region 692, which can be formed over substrate 699. Conductive region 692 and substrate 699 can be similar to or identical to conductive region 292, and substrate 299, respectively, of FIG. 2C.

In FIG. 6A, forming dielectric materials 622 and 624 can include depositing alternating dielectric materials (e.g., alternating layers of dielectric materials 622 and layers of dielectric materials 624) in respective levels 602 through 608. Dielectric materials 622 can include an oxide material (e.g., silicon dioxide $SiO_2$). Dielectric materials 624 can include a nitride material (e.g., silicon nitride $SiN_4$). FIG. 6A shows seven layers of dielectric materials 622 and 624 as an example. The number of layers of dielectric materials 622 and 624 can be different from seven, depending on the number of tiers (e.g., vertical tiers in the z-direction) of memory cells to be included in memory device 600.

FIG. 6B shows locations (in dashed lines) in dielectric materials 622 and 624 where an opening (e.g., hole) 632 will be formed in a subsequent process.

FIG. 6C shows memory device 600 after opening 632 is formed. Forming opening 632 can include removing parts of dielectric materials 622 and 624 (at the location of opening 632) leaving a remaining part of dielectric materials 622 and 624, which are dielectric materials 622' and 624', respectively.

FIG. 6D shows memory device 600 after recesses 624R are formed. Forming recesses 624R can include removing a portion of dielectric materials 624' (at the locations of recesses 624R) and leaving a remaining portion of dielectric materials 624'' as shown in FIG. 6D. An etch process can be used to remove the portion of dielectric materials 624' (FIG. 6C) to form recesses 624R (FIG. 6D). The etch process can include an atomic layer etching (ALE) process.

FIG. 6E shows memory device 600 after a barrier material (or materials) 640 is formed. A portion of barrier material 640 can be part of a dielectric barrier for a memory cell of memory device 600 (as described below in subsequent processes of forming memory device 600). As shown in FIG. 6E, barrier material 640 can be formed such that barrier material 640 is conformal to a wall of each of recesses 624R and walls of other portions of opening 632 (e.g., vertical walls of dielectric materials 622' in opening 632).

Forming barrier material 640 can include depositing one or more of high-k dielectric materials through opening 632 The high-k dielectric materials can include the materials for dielectric barrier 242M described above with reference to FIG. 2E. Thus, as an example, forming barrier material 640 can include depositing (through opening 632) one of aluminum oxide, hafnium oxide, and zirconium oxide. In another example, forming barrier material 640 can include depositing a mixture of hafnium oxide with at least one of aluminum oxide, silicon oxide, titanium oxide, gadolinium oxide, niobium oxide, and tantalum oxide. In another example, forming barrier material 640 can include depositing (through opening 632) a mixture of zirconium oxide with at least one of aluminum oxide, silicon oxide, titanium oxide, gadolinium oxide, niobium oxide, and tantalum oxide. In another example, forming barrier material 640 can include depositing a mixture of hafnium oxide and zirconium oxide with at least one of aluminum oxide, silicon oxide, titanium oxide, gadolinium oxide, niobium oxide, and tantalum oxide. Forming barrier material 640 can include depositing other high-k dielectrics.

The deposition of barrier material 640 (e.g., deposition of high-k dielectric or dielectrics through opening 632) can be performed using one or more of a number of deposition processes. For example, the deposition can be implemented using chemical vapor deposition (CVD), atomic layer deposition (ALD), or another process suitable for forming a 3D memory device, such as memory device 600. An ALD process allows formation of a region as a nanolaminate of a number of different compounds in each sub-region of the region, such that the formed region has a total thickness in the nanometer range. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as multiple nanometers (e.g., 5 nanometers).

In FIG. 6E, barrier material 640 can be formed to have a thickness in the range from about 15 angstroms to about 50 angstroms. The thickness of barrier material 640 is measured from the wall of each of recesses 624R and from the wall of the other portions of opening 632 (e.g., from the vertical walls of dielectric materials 622' in opening 632).

FIG. 6F shows memory device 600 after a blocking material (or materials) 650 is formed in each of recesses 624R through opening 632. A portion of blocking material 650 can be part of a dielectric blocking region for a memory cell of memory device 600 (as described below in subsequent processes of forming memory device 600). In FIG. 6F, blocking material 650 can include silicon oxide or other dielectric materials. Blocking material 650 can be selected to be different from barrier material 640. Blocking material 650 can be formed by depositing (e.g., using an ALD process or other processes) a dielectric material (e.g., silicon oxide) on barrier material 640 (including in barrier material 640 recesses 624R). Then, another process (e.g., an etch process) can be performed to remove (e.g., cut) a portion of the dielectric material (e.g., silicon oxide). The remaining portion of the dielectric material (e.g., silicon oxide) is blocking material 650 (in FIG. 6F) located in each of recesses 624R.

FIG. 6G shows memory device 600 after a dielectric blocking region 652 is formed in each of recesses 624R. Dielectric blocking region 652 can be formed by removing a portion of blocking material 650 (FIG. 6F) in each of recesses 624R and leaving a remaining portion of blocking material 650 (which is dielectric blocking region 652) in each of recesses 624R. As shown in FIG. 6G, dielectric blocking region 652 in each of recesses 624R can have a thickness (e.g., horizontal thickness in the x-direction) such that the entire dielectric blocking region 652 can be located in a respective recess among recesses 624R. This means that no portion of dielectric blocking region 652 at a particular recess (among recesses 624R) is outside that particular recess.

FIG. 6H shows memory device 600 after a memory element 662 is formed in each of recesses 624R. The material used to form memory element 662 can include a dielectric nitride (e.g., silicon nitride) or other materials capable of storing (e.g., trapping) charge that can represent the value of information stored in memory element 662. Memory element 662 can be formed by depositing (e.g., using an ALD process or by other processes) a dielectric material (e.g., silicon nitride or other materials) on dielectric blocking region 652 in recesses 624R and on barrier material 640. Then, another process (e.g., an etch process) can be performed to remove (e.g., cut) a portion of the dielectric material (e.g., silicon nitride). The remaining portion of the dielectric material is memory element 662 located in each of recesses 624R.

Additional processes can be performed to memory element 662. For example, an oxidation process can be performed to oxidize a portion (e.g., surface) 662a of memory element 662. In another example, a portion (e.g., portion 662b) of memory element 662 can be removed (e.g., cut), such that only a portion 662c of memory element 662 remains in each of recesses 624R.

FIG. 6I shows memory device 600 after a portion of barrier material 640 (FIG. 6H) is removed to form a dielectric barrier 642 in each of recesses 624R. An ALE process can be used to remove (e.g., pattern) barrier material 640 of FIG. 6H in order to form dielectric barrier 642 of FIG. 6I. An ALE process is similar to an ALD process except that ALD is a deposition process and an ALE process is a removal process. An ALE process is a material removal technique based on sequential, self-limiting surface reactions. An ALE process provides the capability to remove films with atomic layer control, allowing nanofabrication of a wide range of electronic devices. ALE removal of $Al_2O_3$ has been reported using sequential, self limiting thermal reactions with tin(II) acetylacetonate ($Sn(acac)_2$) and HF as reactants in the cycles. Use of $Sn(acac)_2$ and HF to etch $Al_2O_3$ providing linear removal of $Al_2O_3$ at temperatures from 150° C. to 250° C. at etch rates of angstroms per cycle, dependent on the processing temperature, was reported. ALE of $HfO_2$ has also been reported using $Sn(acac)_2$ and HF as the reactants in sequential, self-limiting thermal reactions, where linear removal of the $HfO_2$ by the ALE process was achieved. Other materials, which may be etched by ALE, include other metal oxides, metal nitrides, metal phosphides, metal sulfides, and metal arsenides.

FIG. 6J shows memory device 600 after a tunnel region 676 is formed. Tunnel region 676 can include a combination of multiple tunnel dielectrics (e.g., different layers of dielectric materials) 671, 672, and 673. Tunnel dielectrics 671, 672, and 673 can include a region of dielectric oxide (e.g., silicon oxide), a region of dielectric nitride (e.g., silicon nitride), and another region of dielectric oxide (e.g., silicon oxide), respectively. In an alternative structure of memory device 600, one or two of tunnel dielectrics 671, 672, and 673 can be omitted from tunnel region 676. For example, tunnel dielectric 671 or 672, or both, can be omitted. In another alternative structure of memory device 600, tunnel region 676 may have four or more than four tunnel dielectrics (e.g., four or more different layers of dielectric materials). Dielectric nitride (e.g., silicon nitride) and dielectric oxide (e.g., silicon oxide) are used herein as an example for the material (or materials) for tunnel region 676. However, other dielectric materials can be used for tunnel region 676.

In FIG. 6J, forming tunnel dielectric 671 can include performing oxidization process (e.g., in situ steam generation (ISSG)) to form tunnel dielectric 671 on a portion of the material (e.g., dielectric nitride) that is included in memory element 662. Thus, tunnel dielectric 671 (e.g., silicon oxide) can be a portion of memory element 662 (e.g., silicon nitride) that has been oxidized by an oxidization process. Tunnel dielectric 672 can be formed after tunnel dielectric 671 is formed. Forming tunnel dielectric 672 can include depositing a dielectric material (e.g., silicon nitride or other dielectric materials) on tunnel dielectric 671 (through opening 632) and on other parts of opening 632 (as shown in FIG. 6J). Tunnel dielectric 673 can be formed after tunnel dielectric 672 is formed. Forming tunnel dielectric 673 can include performing an oxidization process (e.g., in situ steam generation (ISSG)) to form tunnel dielectric 673 on tunnel dielectric 672. Thus, tunnel dielectric 673 (e.g., silicon oxide) can be a portion of tunnel dielectric 672 (e.g., silicon nitride) that has been oxidized by an oxidization process. As shown in FIG. 6J, dielectric blocking region 652 and memory element 662 are already formed in each of recesses 624R. This can improve margin for a subsequent punch etch process (e.g., a process to form a conductive path (e.g., a channel 680 in FIG. 6K) connecting to conductive region 692).

FIG. 6K shows memory device 600 after a channel 680 is formed. Channel 680 can be similar to (or identical to) a portion (e.g., portion between levels 202 through 208) of channel 280M of FIG. 2D. Channel 680 in FIG. 6K can be a semiconductor material. Example materials for channel 680 include polysilicon (e.g., undoped to doped polysilicon). Channel 680 can be polysilicon of n-type or polysilicon of p-type).

FIG. 6L shows memory device 600 after dielectric materials 624" (FIG. 6K) are removed from locations 624G. As shown in FIG. 6L, dielectric barrier 642 in each of recesses 624R (labeled in FIG. 6D) is exposed at a respective location 624G. As described below, gates (e.g., control gates that can be part of word lines) of memory device 600 can be formed in locations 624G where dielectric materials 624" were removed.

FIG. 6M shows memory device 600 after gates 683 are formed in locations 624G. Each of gates 683 contacts a respective dielectric barrier 642. Each of gates 683 can be metal gates. Each of gates 683 can include gate portions 681a, 681b, 681c, and 682. Gate portions 681a, 681b, 681c can have the same conductive material (e.g., conductive titanium nitride) that can be different from the conductive material (e.g., tungsten) of gate portion 682. In an alternative structure of gates 683, gate portions 681a and 681b can be omitted, such that gate portion 682 can occupy the location of gate portions 681a and 681b. In another alternative structure of gates 683, gate portions 681a, 681b, and 681c can be omitted, such that gate portion 682 can occupy the location of gate portions 681a, 681b, and 681c. In FIG. 6M, forming gates 683 can include depositing (e.g., by using an ALD process or by other processes) a conductive material (e.g., conductive titanium nitride) in part of locations 624G (on the walls of locations 624G) to form either only gate portions 681c or all of gate portions 681a, 681b, and 681c, and then depositing another conductive material (e.g., tungsten) in the rest of locations 624G to form gate portions 682.

FIG. 6N shows memory device 600 after dielectric materials 622' (FIG. 6M) are removed from locations 622A. As shown in FIG. 6N, since dielectric materials 622' (e.g., silicon oxide) are removed, no silicon oxide is directly located between memory elements 662 at location 622A. As described below, voids of memory device 600 can be formed in locations 622A where dielectric materials 622' were removed.

FIG. 6O shows memory device 600 after voids 685 and sealing dielectric 687 of memory device 600 are formed. As shown in FIG. 6O, voids 685 can be located at locations 622A where dielectric materials 622' were removed. Sealing dielectric 687 may be formed by a sealing process that can include plasma-enhanced chemical vapor deposition (PECVD) process or other depleting processes. Voids 685 can be formed by intentionally leaving empty spaces at locations 622A (FIG. 6N) after dielectric materials 622' (FIG. 6M) are removed from locations 622A (FIG. 6N). Each of voids 685 (FIG. 6O) contains no conductive material (e.g., metal, conductive polysilicon, or other conductive materials) or no dielectric material (e.g., oxide, nitride, or other dielectric materials). Each of voids 685 may contain air (an air-filled void) or gas (a gas-filled void). Voids 685 (FIG. 6O) remain in memory device 600 after memory device 600 is completed. FIG. 6O also shows a portion 658 of memory device 600. The process of forming memory device 600 can include forming (e.g., by using a deposition process) a dielectric material (e.g., silicon oxide) or a conductive material in portion 658. Alternatively, the process of forming memory device 600 may leave portion 658 empty (e.g., not fill portion 658 with a material).

After the structure of memory device 600 shown in FIG. 6) is formed, additional processes can be used to complete memory device 600. After completion, memory device 600 can include elements similar to a memory device 100 (FIG. 1) and memory device 200 (FIG. 2A through FIG. 2E).

As shown in FIG. 6), memory device 600 includes elements that are similar to or identical to memory device 300A (FIG. 3A). Thus, the processes described above with reference to FIG. 6A through FIG. 6) can also be used to form memory device 300A.

Figure 7A:
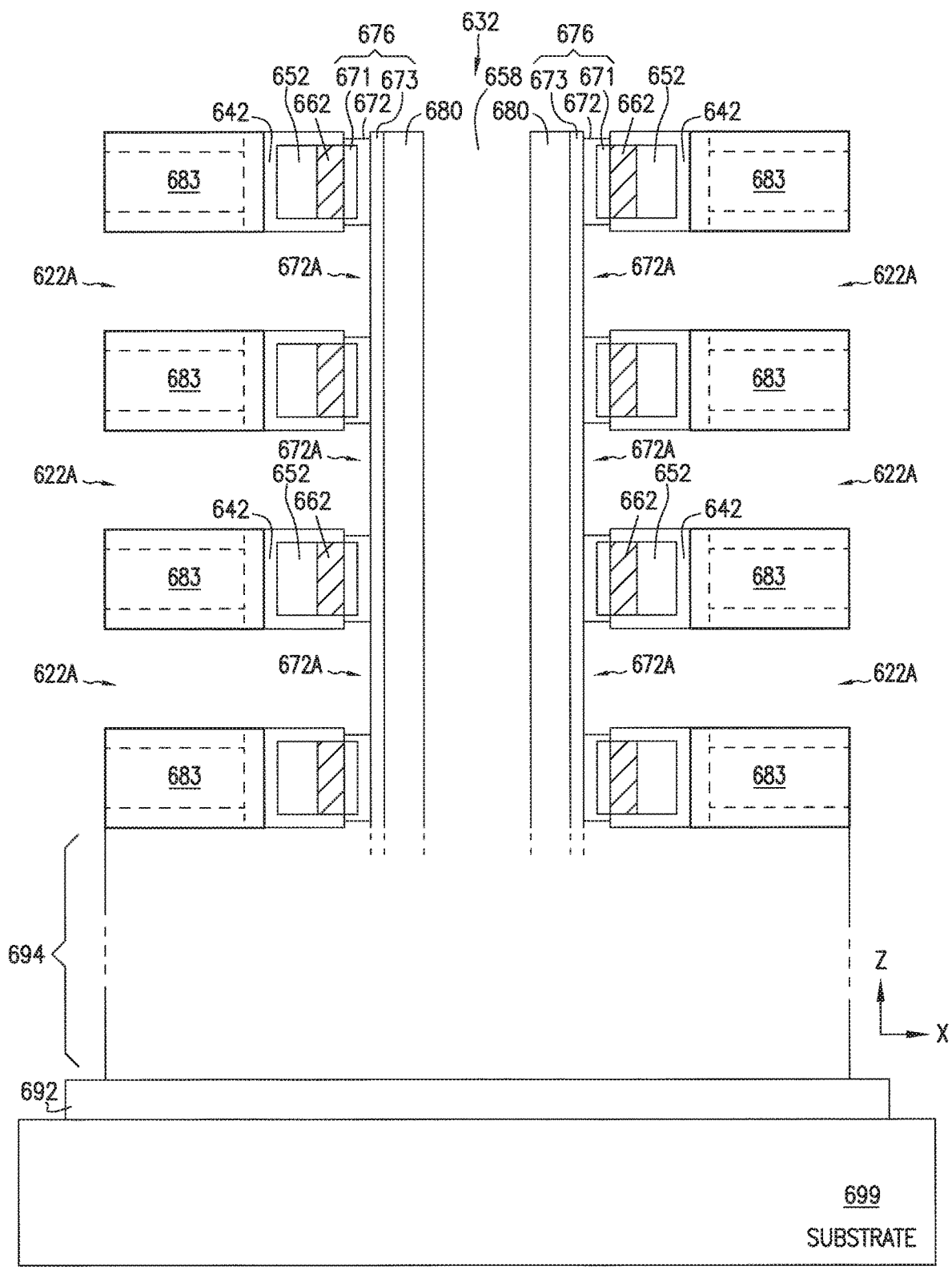
FIG. 7A and FIG. 7B show cross-sectional views of elements during processes of forming a memory device that can be the memory device of FIG. 3B, according to some embodiments of the invention.
Figure 7B:
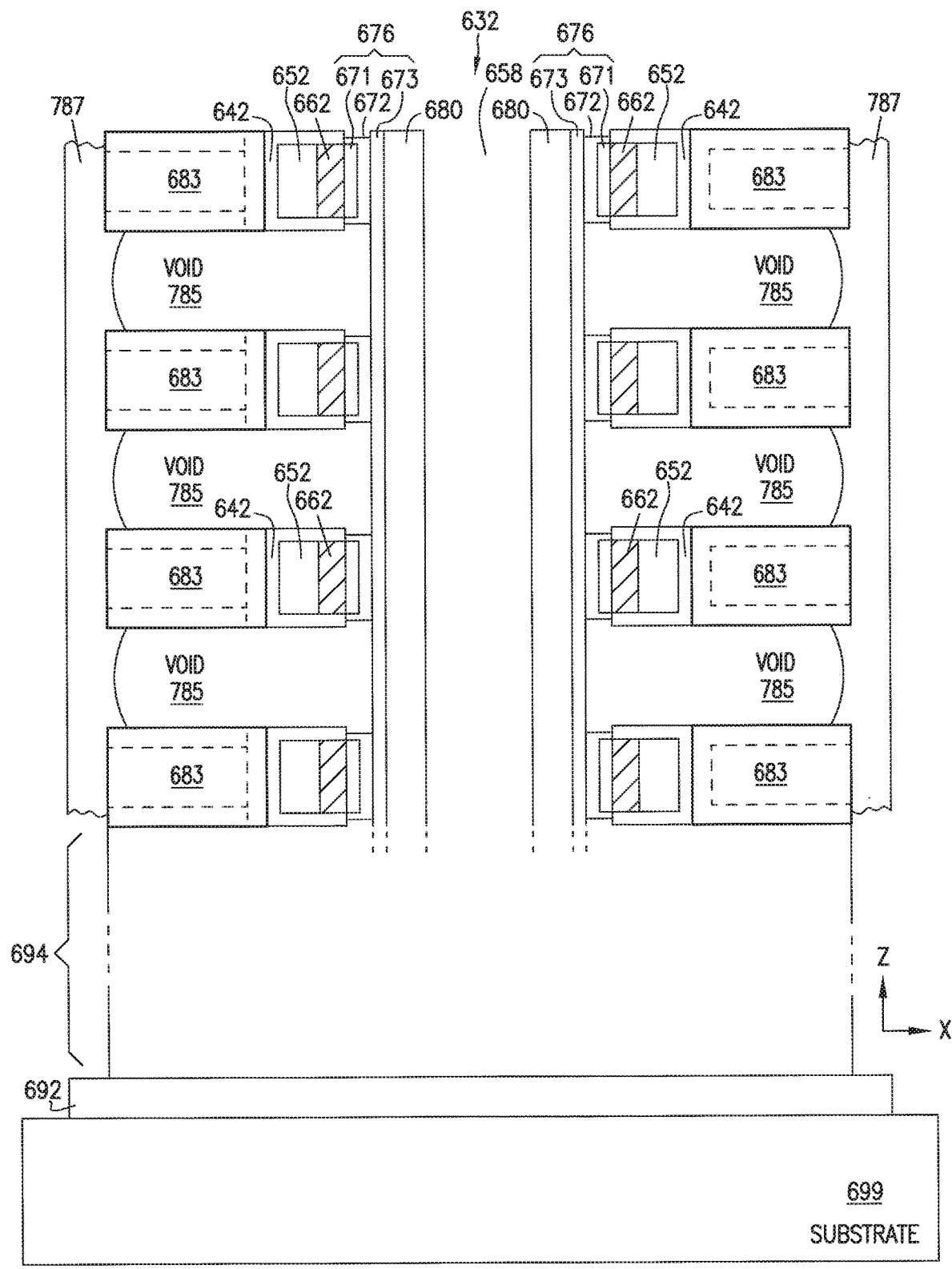

FIG. 7A and FIG. 7B show cross-sectional views of elements during processes of forming a memory device 700, according to some embodiments described herein. Memory device 700 can be a variation of memory device 600. Thus, some of the processes (described above with reference to FIG. 6A through FIG. 6)) used to form memory device 600 can be used to form memory device 700 of FIG. 7A and FIG. 7B. For example, the elements of FIG. 7A are the same as the elements of FIG. 6N, except for locations 672A in FIG. 7A. As shown in FIG. 7A, a portion of tunnel dielectric 672 (e.g., silicon nitride) has been removed from locations 672A. Removing the portion of tunnel dielectric 672 from locations 672A can include etching tunnel dielectric 672 at locations 672A selective to other elements next to locations 672A (e.g., selective to gate 683, dielectric barrier 642, and tunnel dielectric 673).

FIG. 7B shows memory device 700 after voids 785 and sealing dielectric 787 are formed. Sealing dielectric 787 may be formed by a process similar to that of the process used to form sealing dielectric 687 (FIG. 6O) of memory device 600.

As shown in FIG. 7B, voids 785 can occupy (e.g., can be located at) locations 622A and 672A (labeled in FIG. 7A). Voids 785 can be formed by intentionally leaving empty spaces at locations 622A and 672A after dielectric materials 622' (e.g., silicon oxide) and a portion of tunnel dielectric 672 (e.g., silicon nitride) are removed from respective locations 622A and 672A. Each of voids 785 (FIG. 7B) contains no conductive material (e.g., metal, conductive polysilicon, or other conductive materials) or no dielectric material (e.g., oxide, nitride, or other dielectric materials). Each of voids 785 may contain air (an air-filled void) or gas (a gas-filled void). Voids 785 (FIG. 7B) remain in memory device 700 after memory device 700 is completed.

After the structure of memory device 700 shown in FIG. 7B is formed, additional processes can be used to complete memory device 700. After completion, memory device 700 can include elements similar to memory device 100 (FIG. 1) and memory device 200 (FIG. 2A through FIG. 2E).

As shown in FIG. 7B, memory device 700 includes elements that are similar to or identical to memory device 300B (FIG. 3B). Thus, the processes used to form memory device 700 can also be used to form memory device 300B.

Figure 8A:
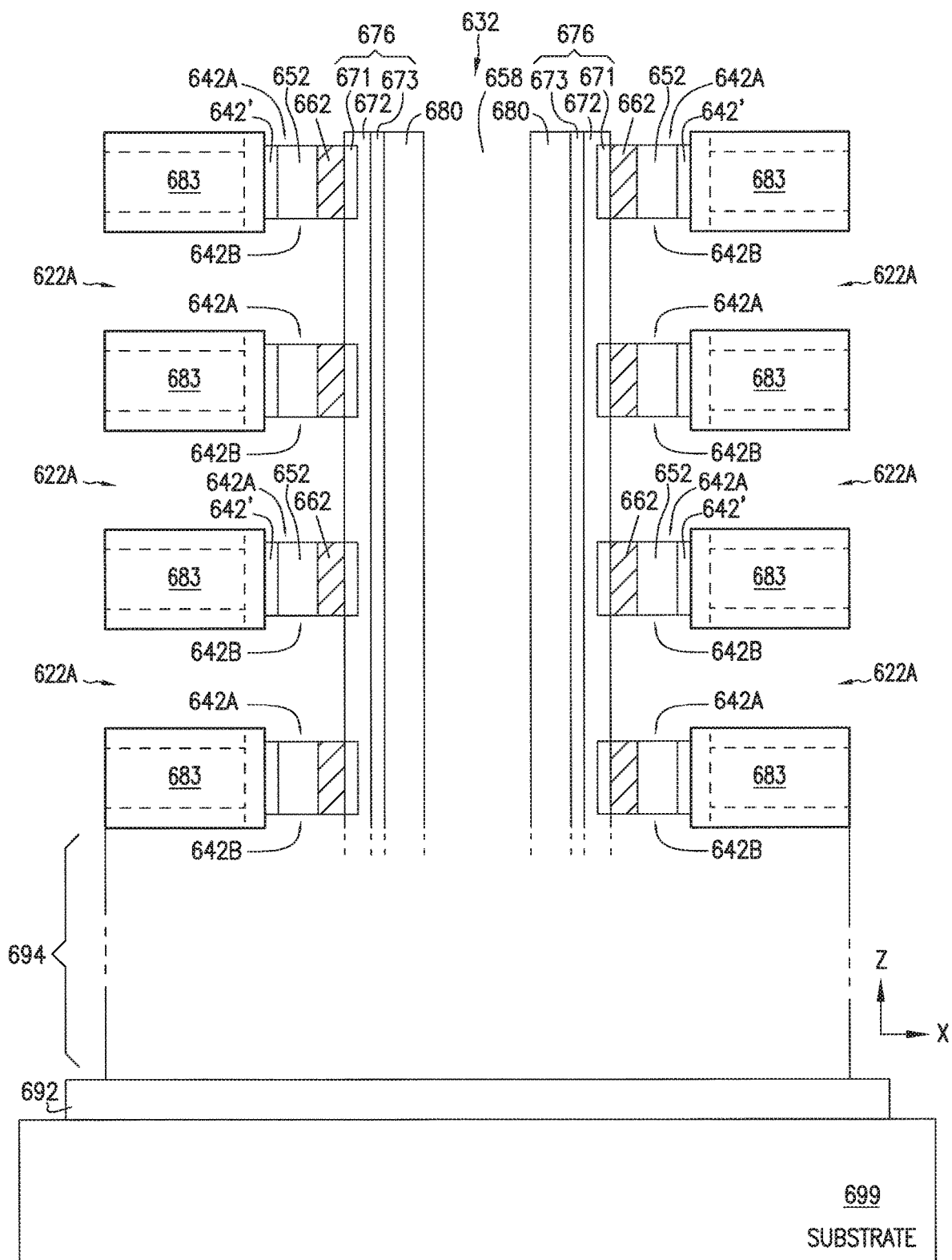
FIG. 8A and FIG. 8B show cross-sectional views of elements during processes of forming a memory device that can be the memory device of FIG. 3C, according to some embodiments of the invention.
Figure 8B:
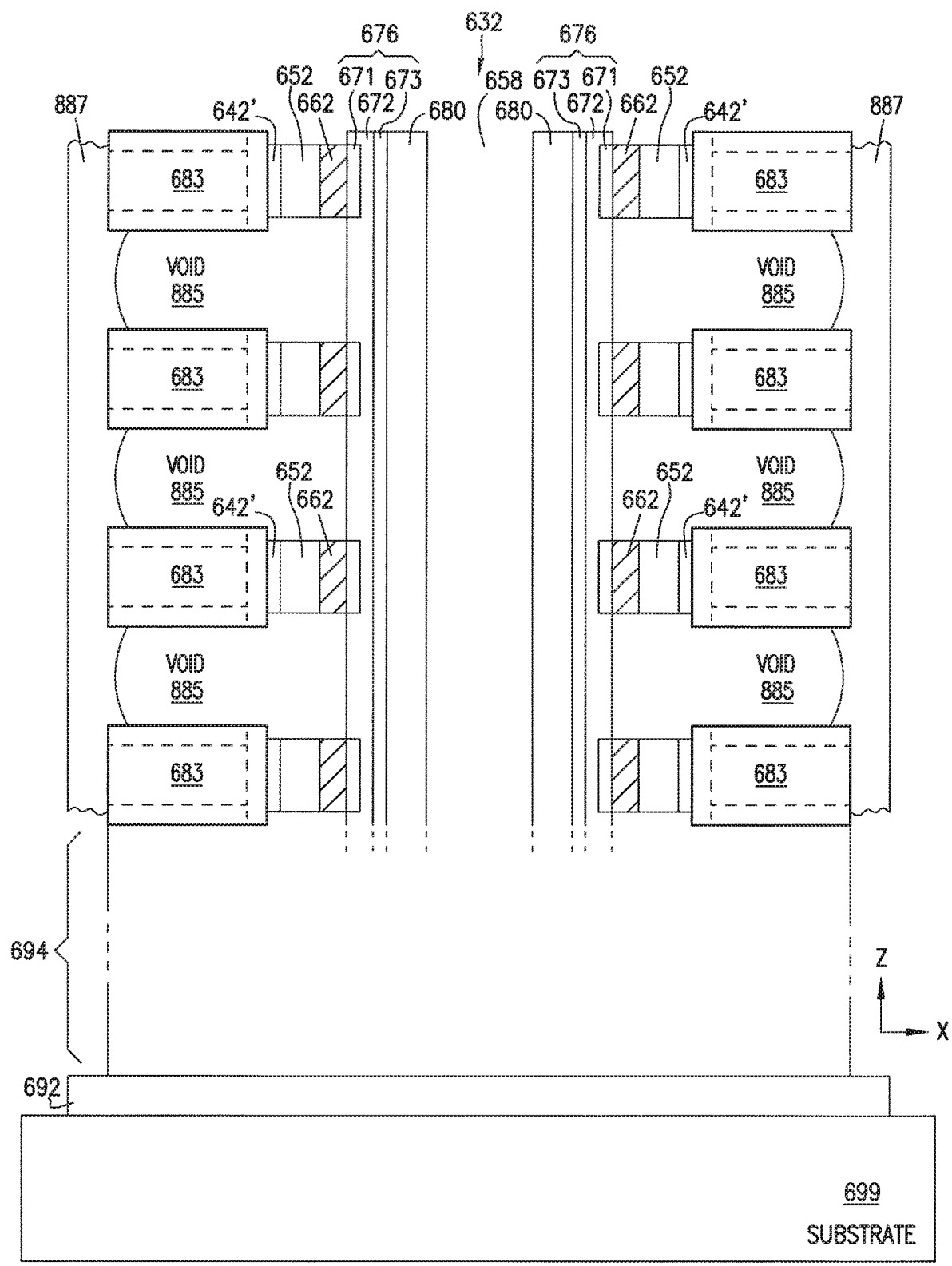

FIG. 8A and FIG. 8B show cross-sectional views of elements during processes of forming memory device 800, according to some embodiments described herein. Memory device 800 can be a variation of memory device 600 (FIG. 6O). Thus, some of the processes (described above with reference to FIG. 6A through FIG. 6O) used to form memory device 600 can be used to form memory device 800 of FIG. 8A and FIG. 8B. For example, the elements of FIG. 8A are the same as the elements of FIG. 6N, except for locations 642A and 642B in FIG. 8A. In FIG. 8A, dielectric barrier 642' (e.g., high-k dielectric material) is a remaining (unremoved) portion of dielectric barrier 642 (e.g., high-k dielectric material) of FIG. 6N after a portion of dielectric barrier 642 has been removed from locations 642A and 642B. Removing a portion of dielectric barrier 642 (FIG. 6N) from locations 642A and 642B can include etching (e.g., using an ALE process) a portion of dielectric barrier 642 (FIG. 6N) at locations 642A and 642B selective to other elements next to locations 642A and 642B (e.g., gate 683, dielectric blocking region 652, memory element 662, and tunnel dielectric 672).

FIG. 8B shows memory device 800 after voids 885 and sealing dielectric 887 are formed. Sealing dielectric 887 may be formed by a process similar to that of the process used to form sealing dielectric 687 (FIG. 6O) of memory device 600.

As shown in FIG. 8B, voids 885 can occupy (e.g., can be located at) locations 622A, 642A, and 642B (labeled in FIG. 8A). Voids 885 can be formed by intentionally leaving empty spaces at locations 622A, 642A, and 642B after dielectric materials 622' (e.g., silicon oxide) and a portion of dielectric barrier 642 (e.g., high-k dielectric material) are removed from respective locations 622A, 642A, and 642B. Each of voids 885 (FIG. 8B) contains no conductive material (e.g., metal, conductive polysilicon, or other conductive materials) or no dielectric material (e.g., oxide, nitride, or other dielectric materials). Each of voids 885 may contain air (an air-filled void) or gas (a gas-filled void). Voids 885 (FIG. 8B) remain in memory device 800 after memory device 800 is completed.

After the structure of memory device 800 shown in FIG. 8B is formed, additional processes can be used to complete memory device 800. After completion, memory device 800 can include elements similar to memory device 100 (FIG. 1) and memory device 200 (FIG. 2A through FIG. 2E).

As shown in FIG. 8B, memory device 800 includes elements that are similar to or identical to memory device 300C (FIG. 3C). Thus, the processes used to form memory device 800 can also be used to form memory device 300C.

Figure 9A:
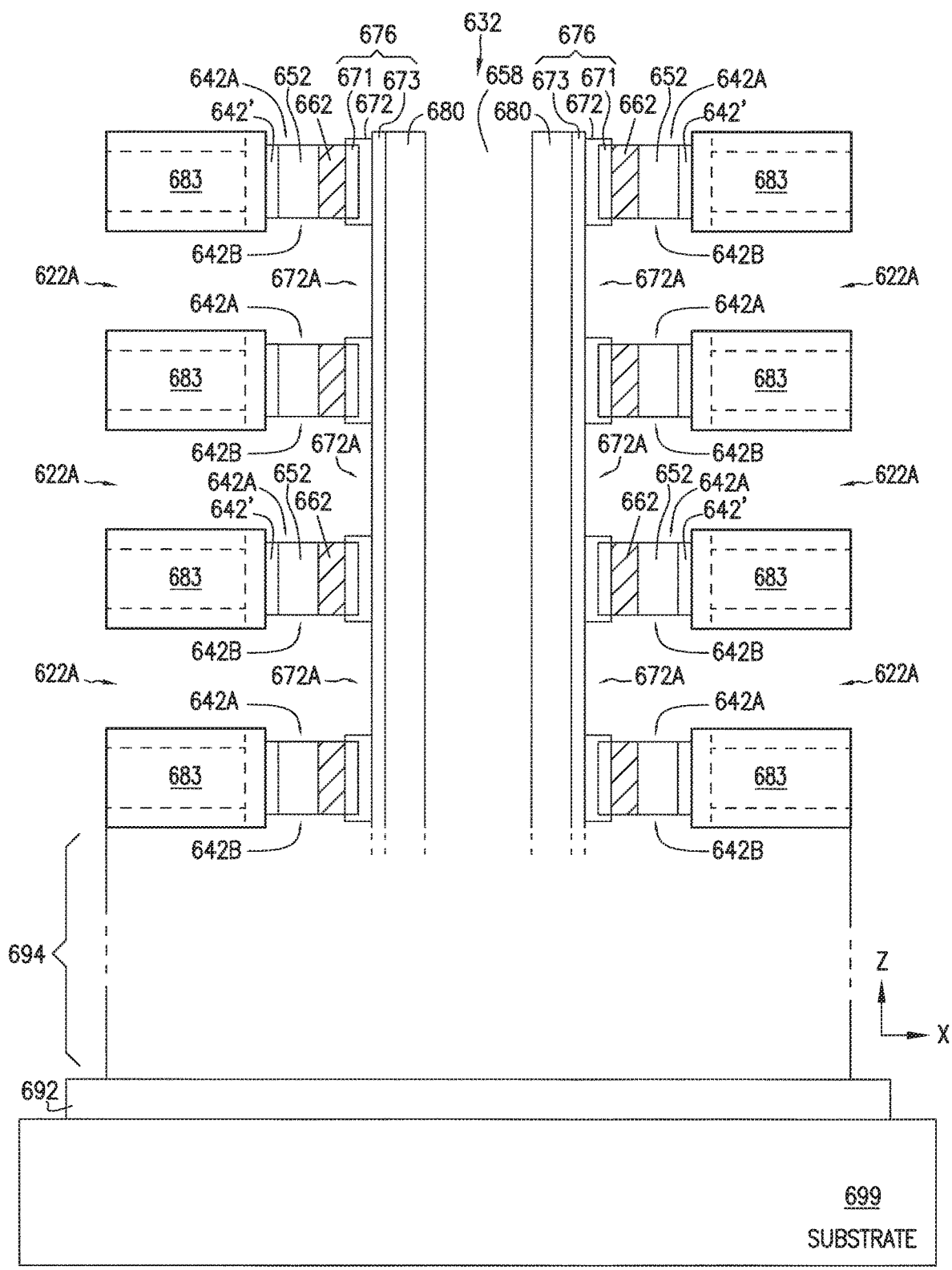
FIG. 9A and FIG. 9B show cross-sectional views of elements during processes of forming a memory device that can be the memory device of FIG. 3D, according to some embodiments of the invention.
Figure 9B:
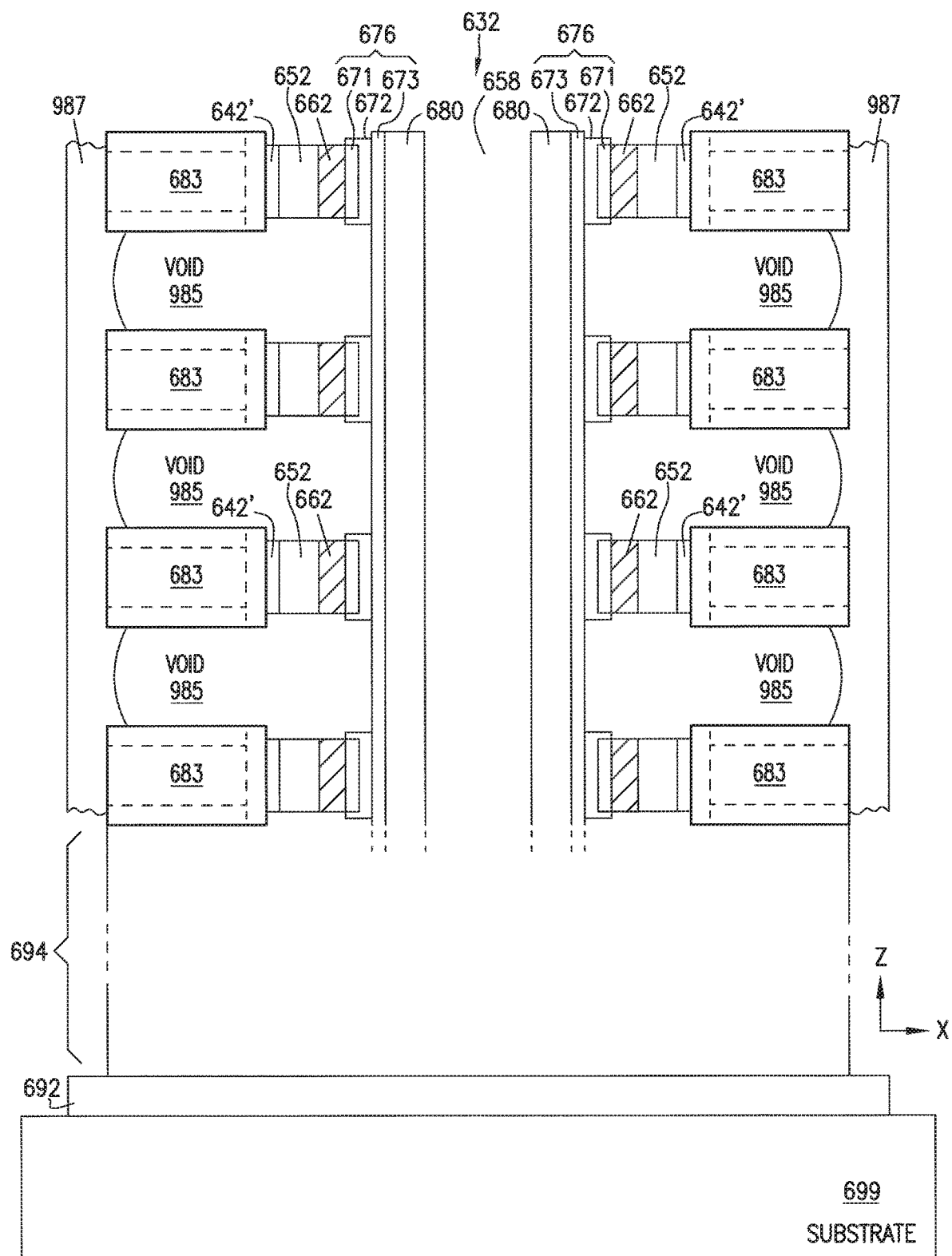

FIG. 9A and FIG. 9B show cross-sectional views of elements during processes of forming memory device 900, according to some embodiments described herein. Memory device 900 can be a variation of memory device 800 (FIG. 8A and FIG. 8B). Thus, some of the processes used to form memory device 800 can be used to form memory device 900 of FIG. 9A and FIG. 9B. For example, the elements of FIG. 9A are the same as the elements of FIG. 8A, except for locations 672A in FIG. 9A. As shown in FIG. 9A, a portion of tunnel dielectric 672 has been removed from locations 672A. Removing a portion of tunnel dielectric 672 (e.g., silicon nitride), from locations 672A can include etching a portion of tunnel dielectric 672 at locations 672A selective to other elements next to locations 672A (e.g., gate 683, dielectric barrier 642', dielectric blocking region 652, memory element 662, and tunnel dielectric 673). Removing the portion of tunnel dielectric 672 from locations 672A can be performed before or after the portion of dielectric barrier 642 is removed from locations 642A and 642B.

FIG. 9B shows memory device 900 after voids 985 and sealing dielectric 987 are formed. Sealing dielectric 987 may be formed by a process similar to that of the process used to form sealing dielectric 887 (FIG. 8B) of memory device 800.

As shown in FIG. 9B, voids 985 can occupy (e.g., can be located at) locations 622A, 642A, 642B, and 672A (labeled in FIG. 9A). Voids 985 can be formed by intentionally leaving empty spaces at locations 622A, 642A, 642B, and 672A after dielectric materials 622' (e.g., silicon oxide), a portion of dielectric barrier 642 (e.g., high-k dielectric material), and a portion of tunnel dielectric 672 (e.g., silicon nitride) are removed from respective locations 622A, 642A, 642B, and 672A. Each of voids 985 (FIG. 9B) contains no conductive material (e.g., metal, conductive polysilicon, or other conductive materials) or no dielectric material (e.g., oxide, nitride, or other dielectric materials). Each of voids 985 may contain air (an air-filled void) or gas (a gas-filled void). Voids 985 (FIG. 9B) remain in memory device 900 after memory device 900 is completed.

After the structure of memory device 900 shown in FIG. 9B is formed, additional processes can be used to complete memory device 900. After completion, memory device 900 can include elements similar to memory device 100 (FIG. 1) and memory device 200 (FIG. 2A through FIG. 2E).

As shown in FIG. 9B, memory device 900 includes elements that are similar to or identical to memory device 300D (FIG. 3D). Thus, the processes used to form memory device 900 can also be used to form memory device 300D.

Figure 10A:
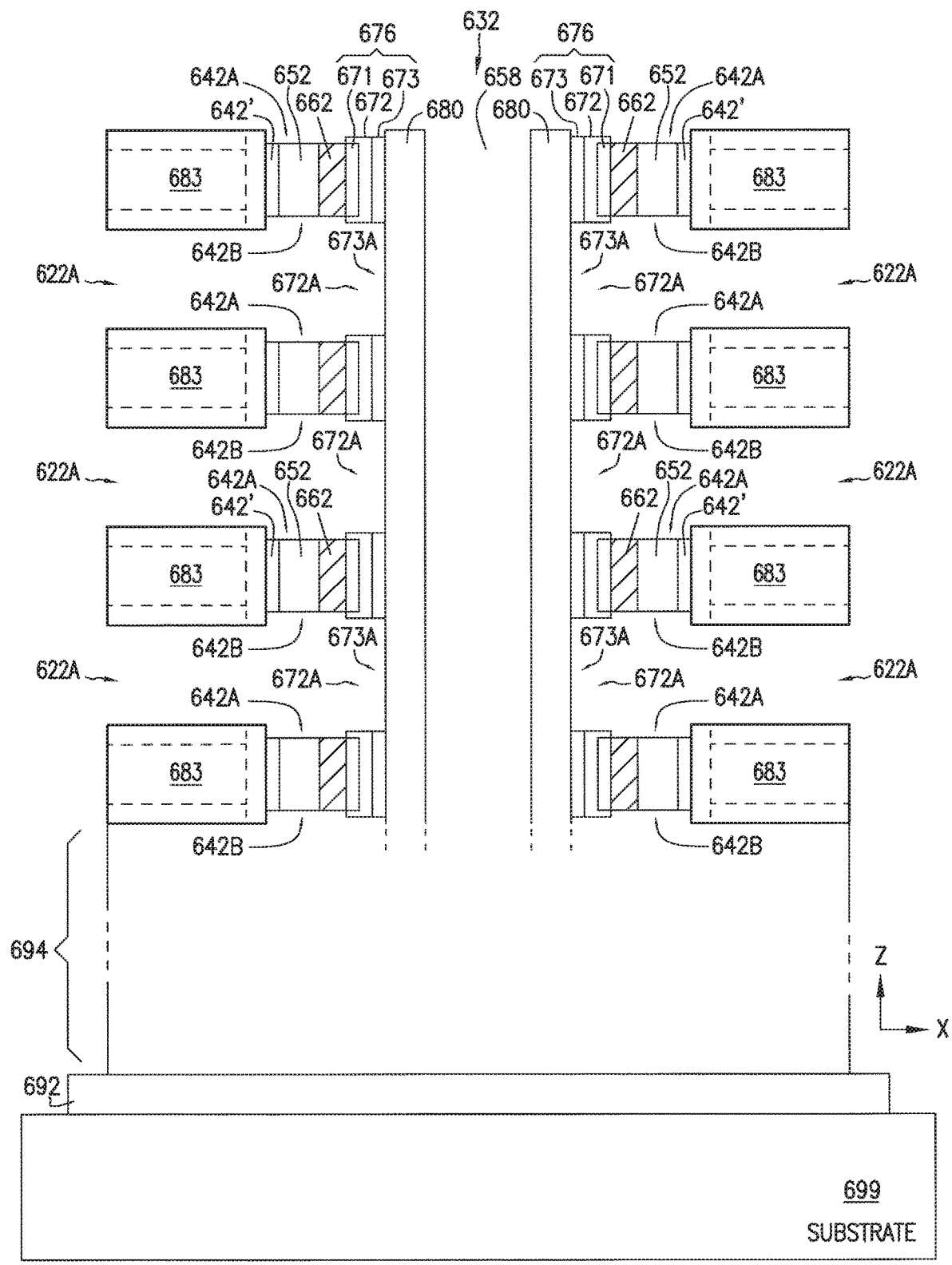
FIG. 10A, FIG. 10B, and FIG. 10C show cross-sectional views of elements during processes of forming a memory device that can be the memory device of FIG. 3E, according to some embodiments of the invention.
Figure 10B:
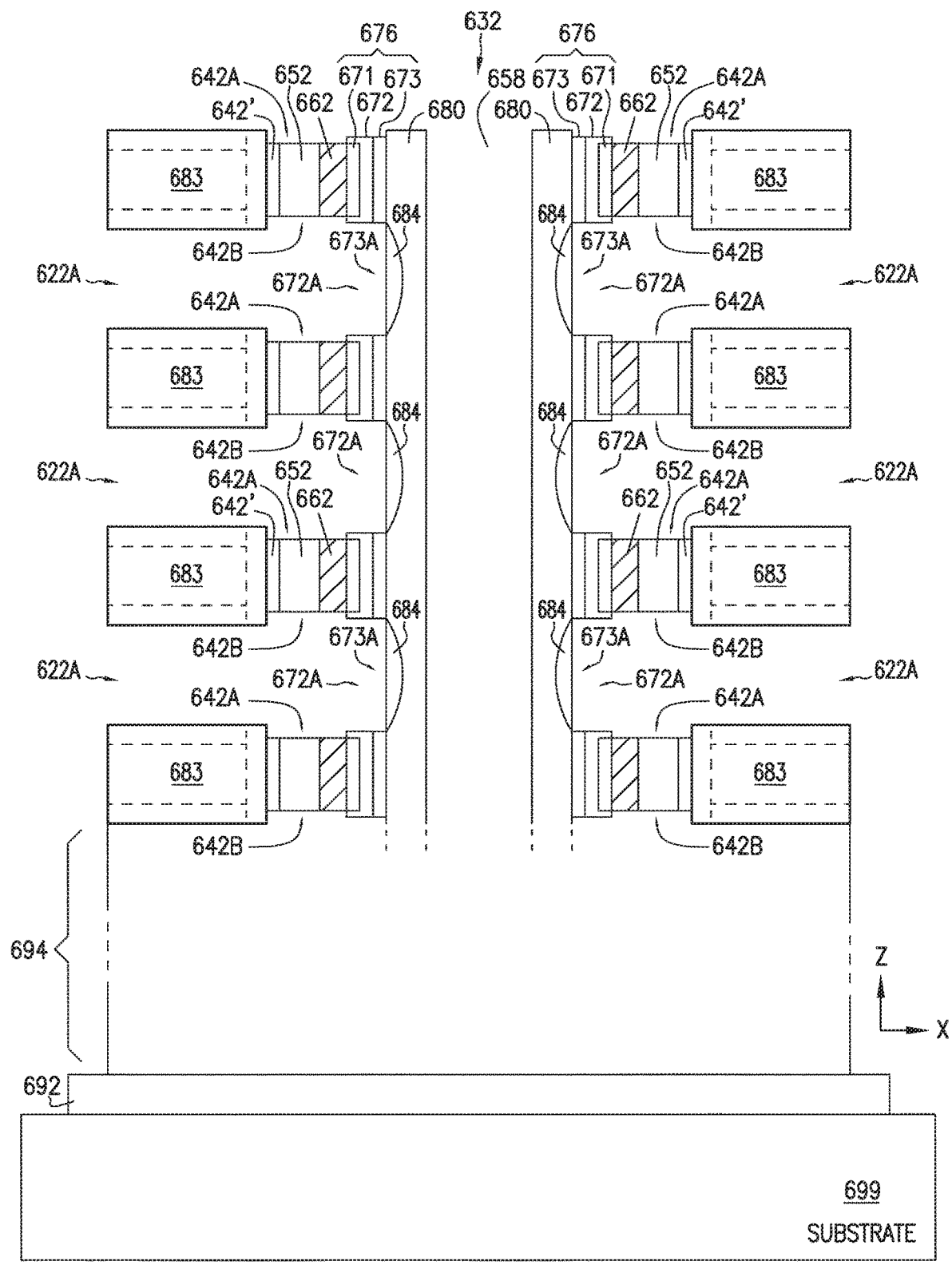
Figure 10C:
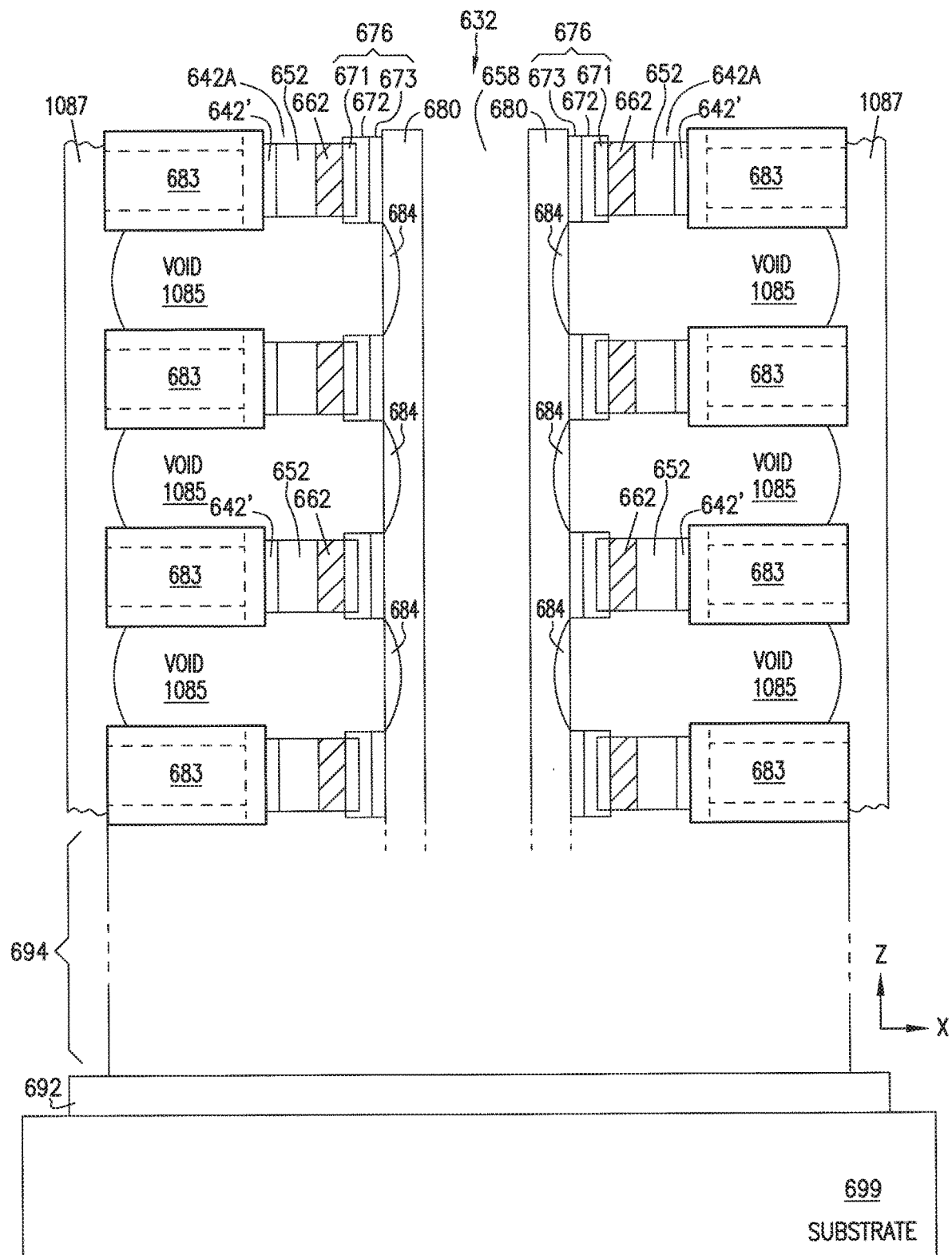

FIG. 10A, FIG. 10B, and FIG. 10C show cross-sectional views of elements during processes of forming memory device 1000, according to some embodiments described herein. Memory device 1000 can be a variation of memory device 900 (FIG. 9A and FIG. 9B). Thus, some of the processes used to form memory device 900 can be used to form memory device 1000 of FIG. 10A, FIG. 10B, and FIG. 10C. For example, the elements of FIG. 10A are the same as the elements of FIG. 9A, except for locations 673A in FIG. 10A. As shown in FIG. 10A, a portion of tunnel dielectric 673 (e.g., silicon oxide) has been removed from locations 673A. Removing a portion of tunnel dielectric 673 from locations 673A can include etching a portion of tunnel dielectric 673 at locations 673A selective to other elements next to locations 673A (e.g., gate 683, dielectric barrier 642', dielectric blocking region 652, memory element 662, tunnel dielectric 672, and channel 680). Removing the portion of tunnel dielectric 673 from locations 673A can be performed after the portion of tunnel dielectric 672 is removed from locations 672A.

FIG. 10B, shows memory device 1000 after a region 684 is formed in a channel portion of channel 680 (the channel portion that is exposed at location 673A. Forming region 684 can include introducing dopants (impurities) into the channel portion of channel 680 at location 673A. Region 684 (e.g., doped region) can be formed such that it can have an amount of dopants (e.g., doping concentration) that is different from an amount of dopants (e.g., doping concentration) in another portion (e.g., in each of channel portions 680.1 and 680.2 (labeled in FIG. 3E)) of channel 680.

FIG. 10C shows memory device 1000 after voids 1085 and sealing dielectric 1087 are formed. Sealing dielectric 1087 may be formed by a process similar to that of the process used to form sealing dielectric 887 (FIG. 8B) of memory device 800.

As shown in FIG. 10C, voids 1085 can occupy (e.g., can be located at) locations 622A, 642A, 642B, 672A, and 673A (labeled in FIG. 10A). Voids 1085 can be formed by intentionally leaving empty spaces at locations 622A, 642A, 642B, 672A, and 673A after dielectric materials 622' (e.g., silicon oxide), a portion of dielectric barrier 642 (e.g., high-k dielectric material), a portion of tunnel dielectric 672 (e.g., silicon nitride), and a portion of tunnel dielectric 673 (e.g., silicon oxide) are removed from respective locations 622A, 642A, 642B, 672A, and 673A. Each of voids 1085 (FIG. 10B) contains no conductive material (e.g., metal, conductive polysilicon, or other conductive materials) or no dielectric material (e.g., oxide, nitride, or other dielectric materials). Each of voids 1085 may contain air (an air-filled void) or gas (a gas-filled void). Voids 1085 (FIG. 10B) remain in memory device 1000 after memory device 1000 is completed.

After the structure of memory device 1000 shown in FIG. 10B is formed, additional processes can be used to complete memory device 1000. After completion, memory device 1000 can include elements similar to memory device 100 (FIG. 1) and memory device 200 (FIG. 2A through FIG. 2E).

As shown in FIG. 10B, memory device 1000 includes elements that are similar to or identical to memory device 300E (FIG. 3D). Thus, the processes used to form memory device 1000 can also be used to form memory device 300E.

Figure 11A:
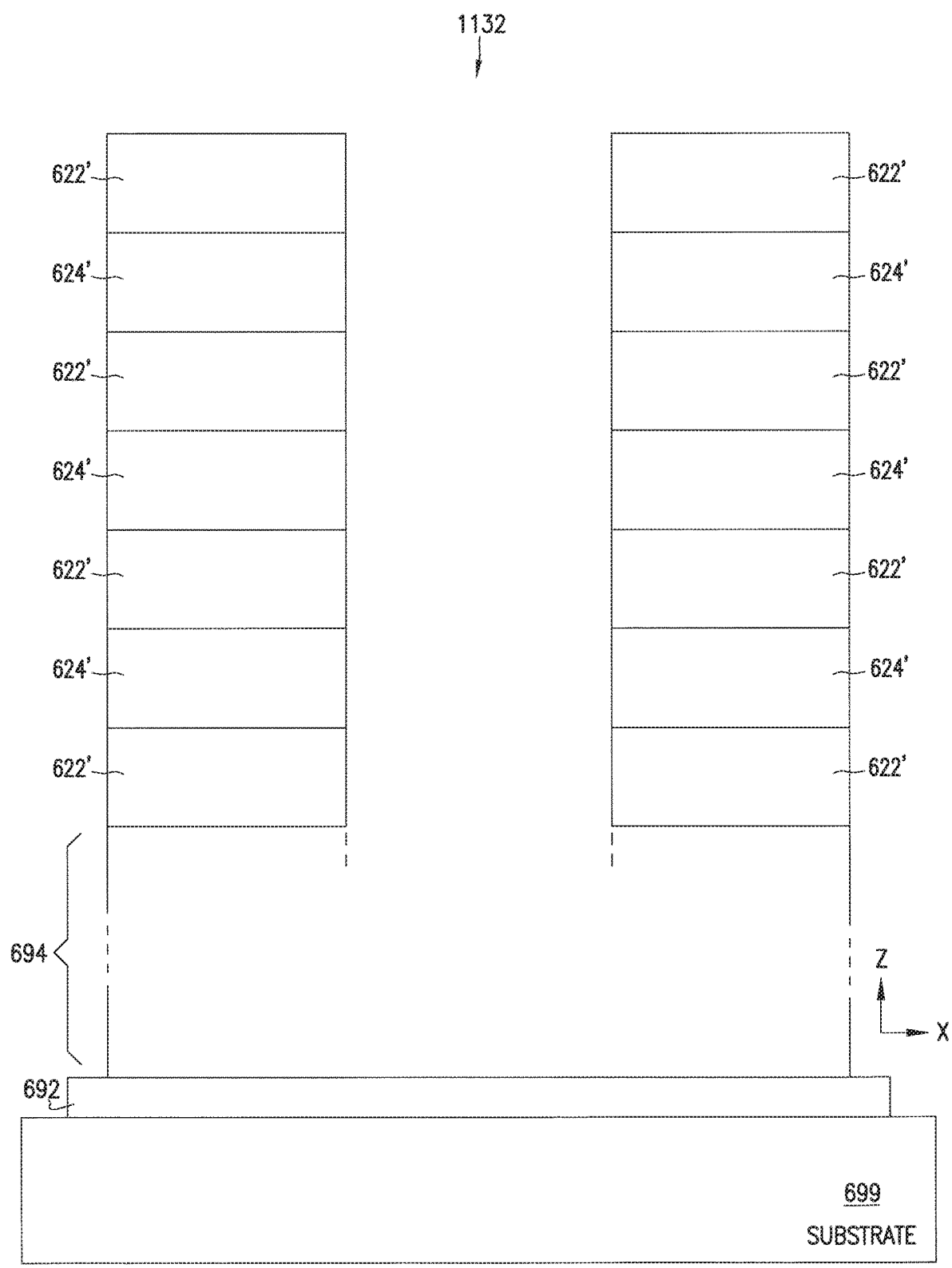
FIG. 11A through FIG. 11P show cross-sectional views of elements during processes of forming a memory device that can be the memory device of FIG. 4A, according to some embodiments of the invention.
Figure 11B:
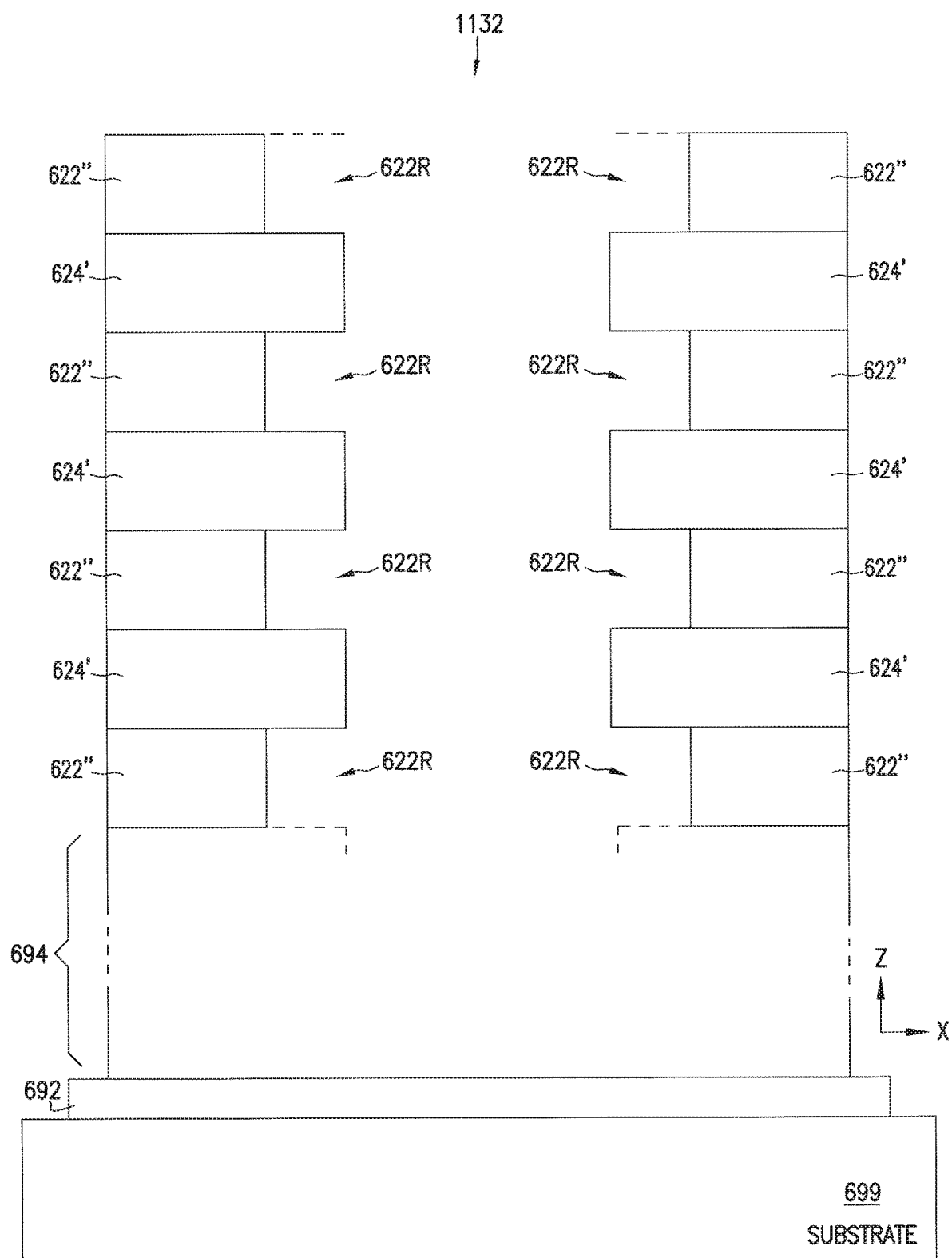
Figure 11C:
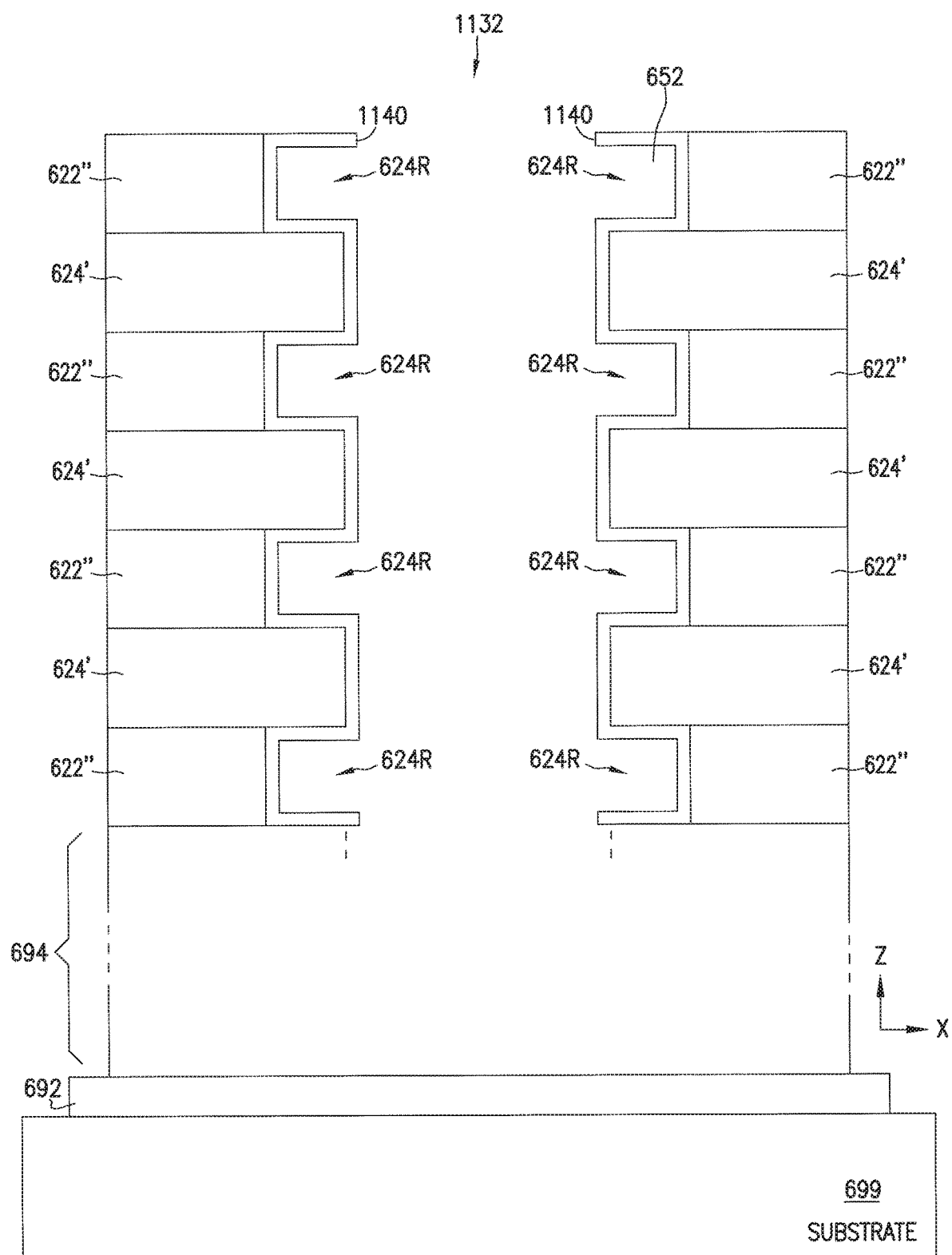
Figure 11D:
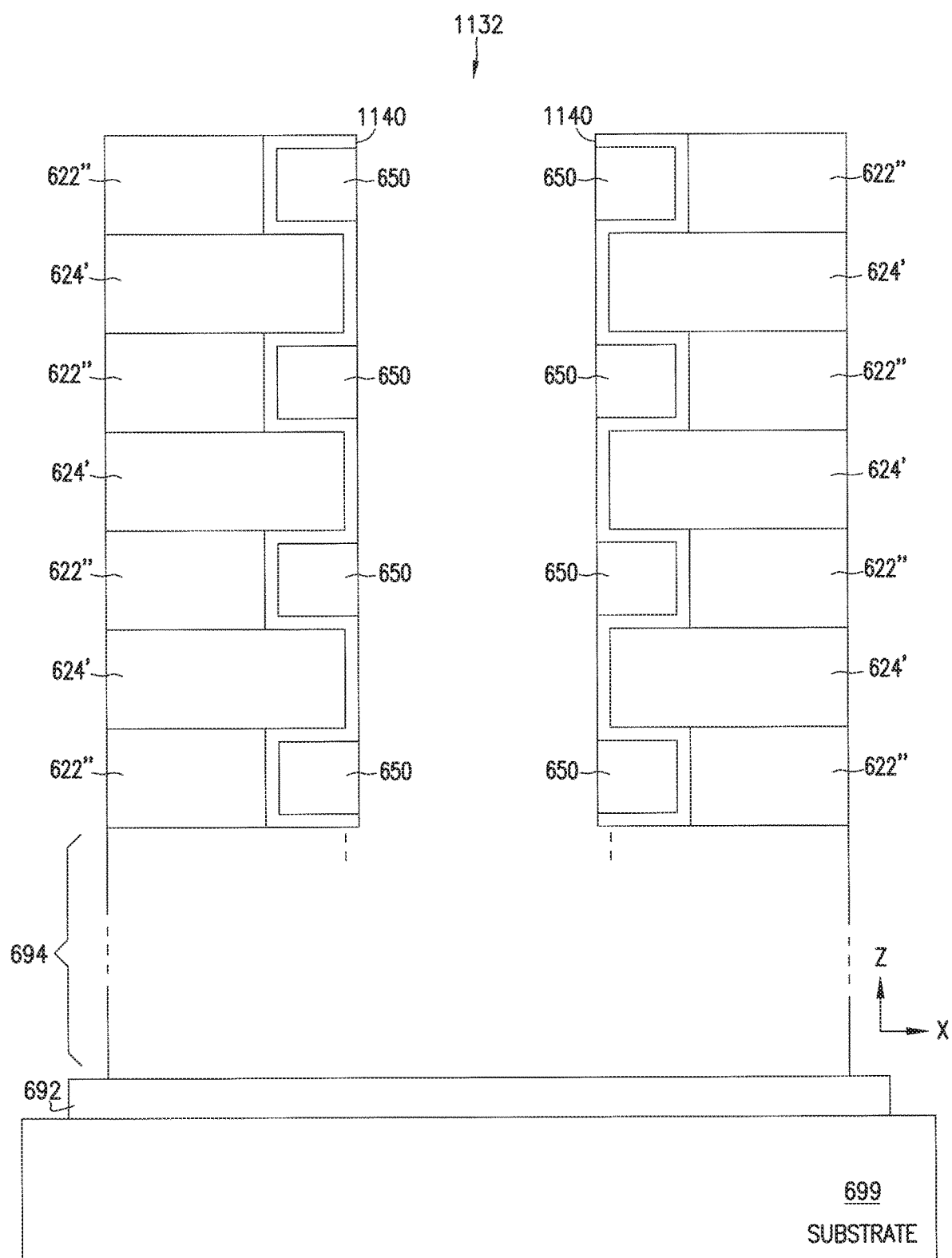
Figure 11E:
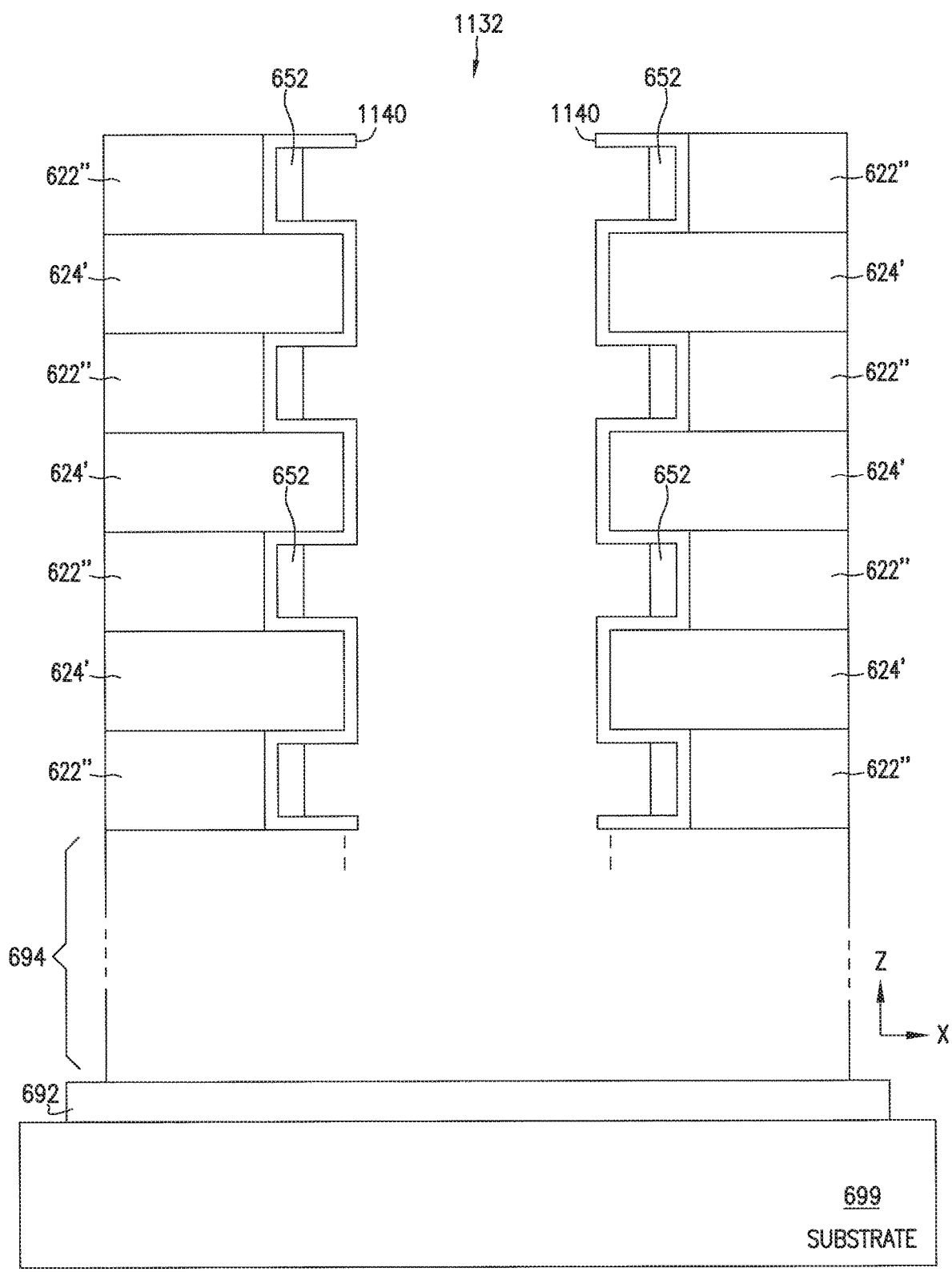
Figure 11F:
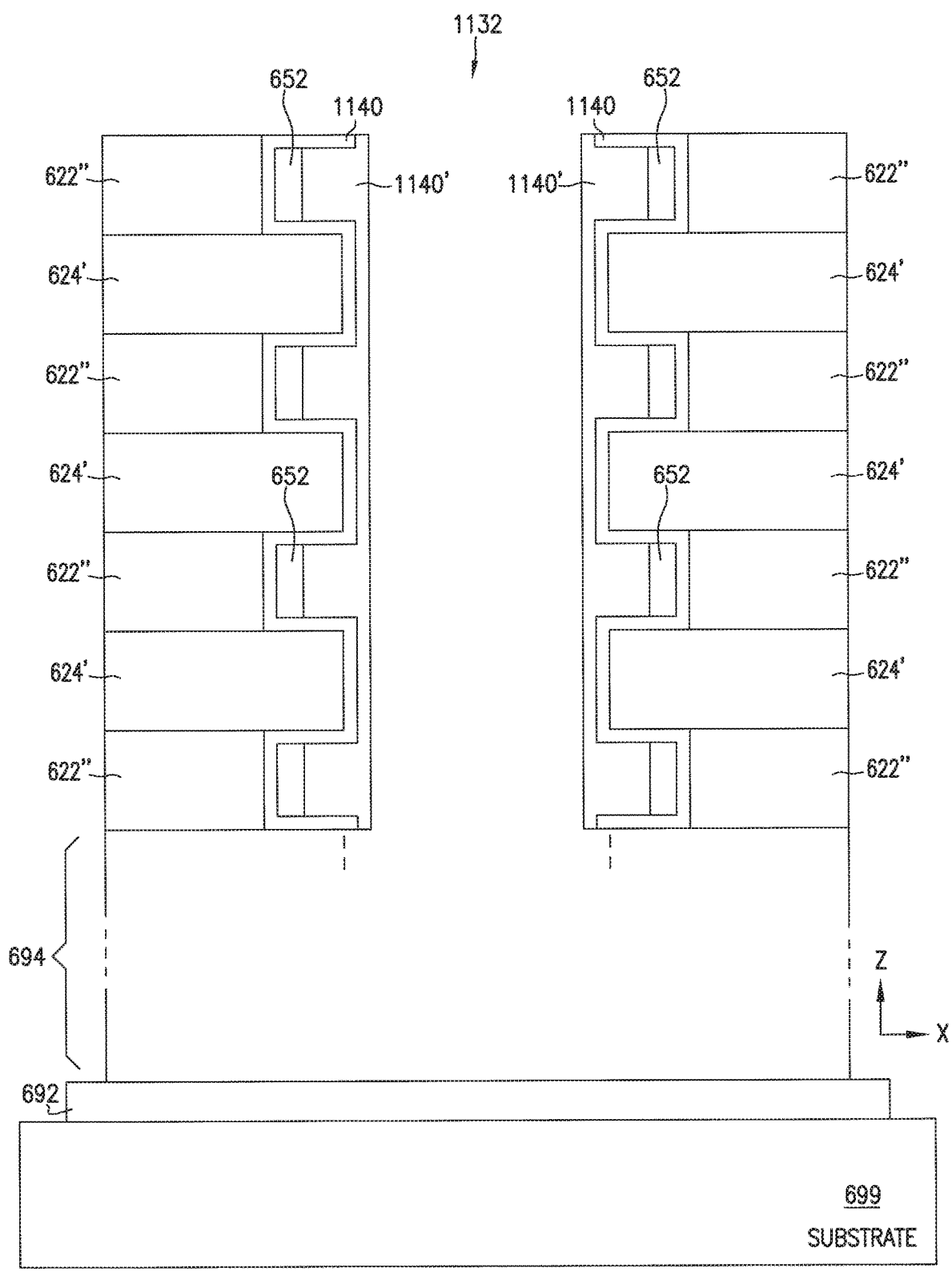
Figure 11G:
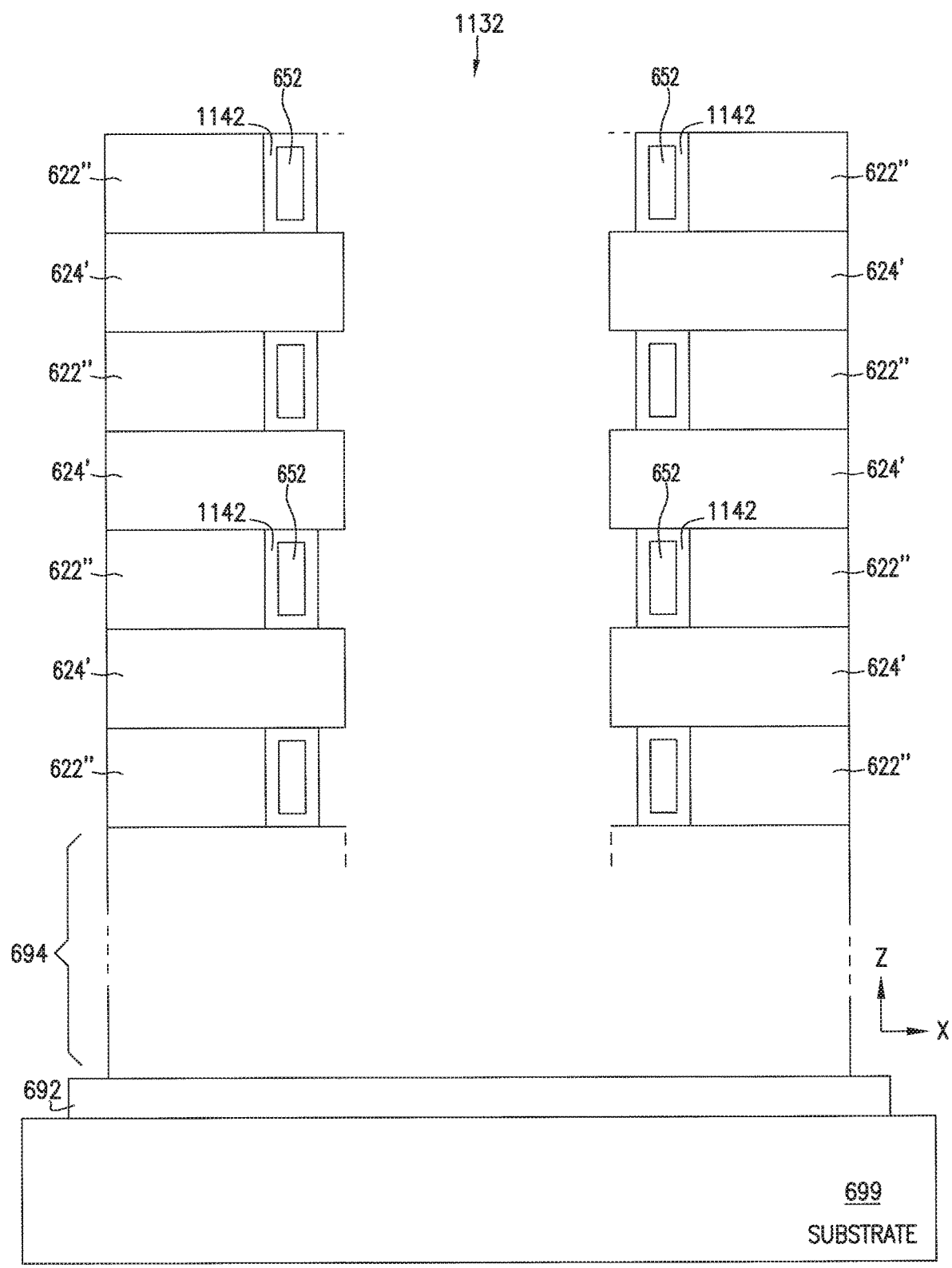
Figure 11H:
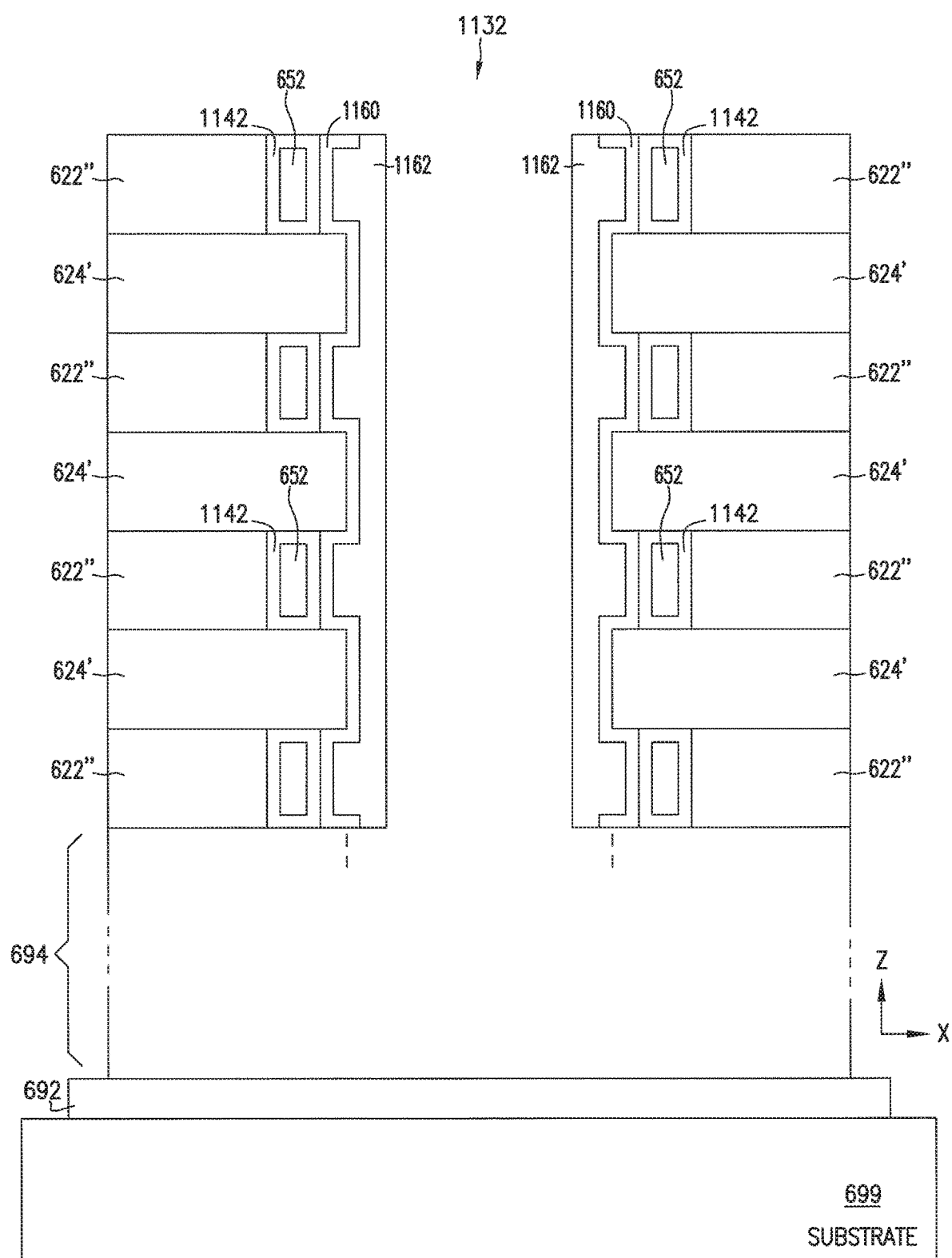
Figure 11I:
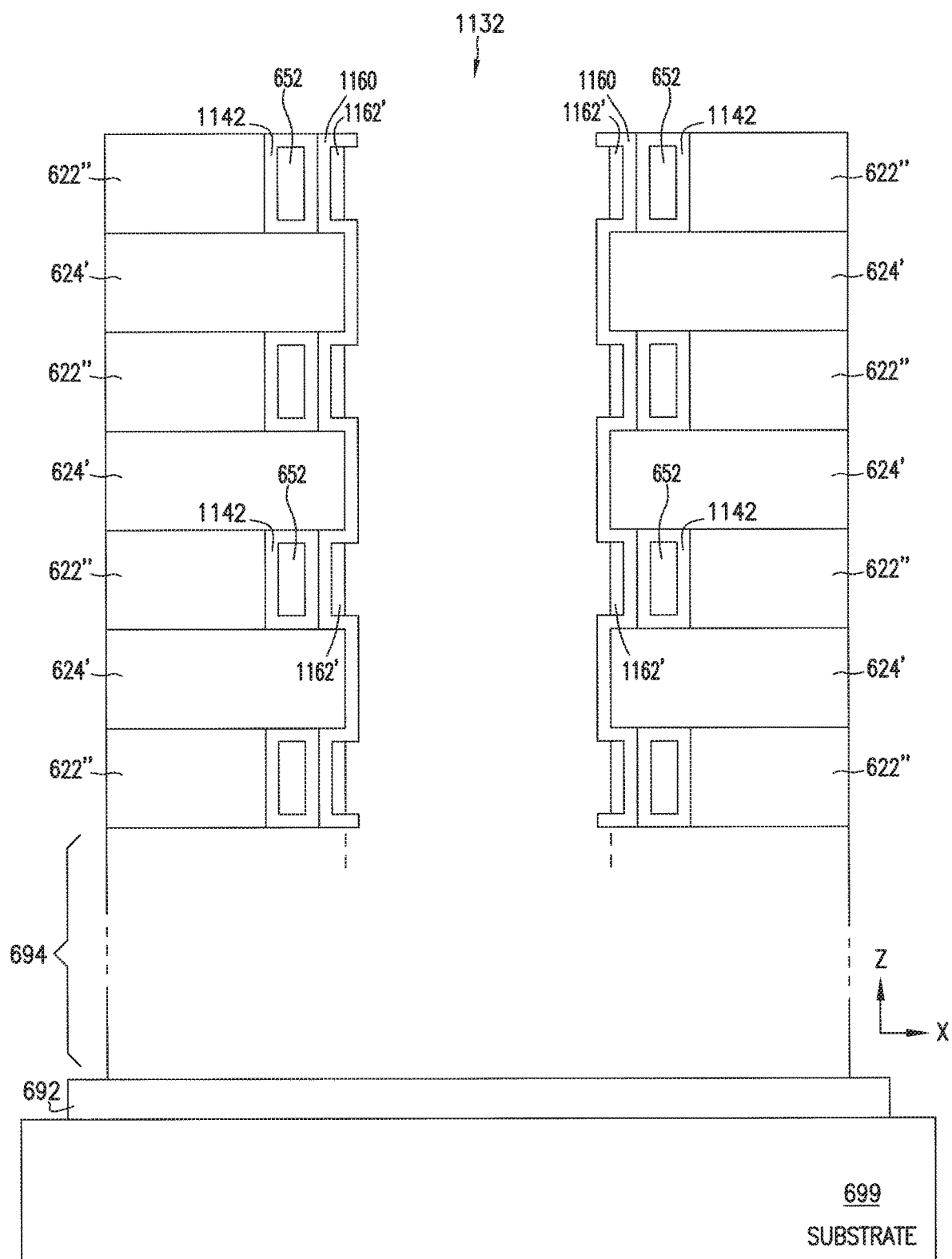
Figure 11J:
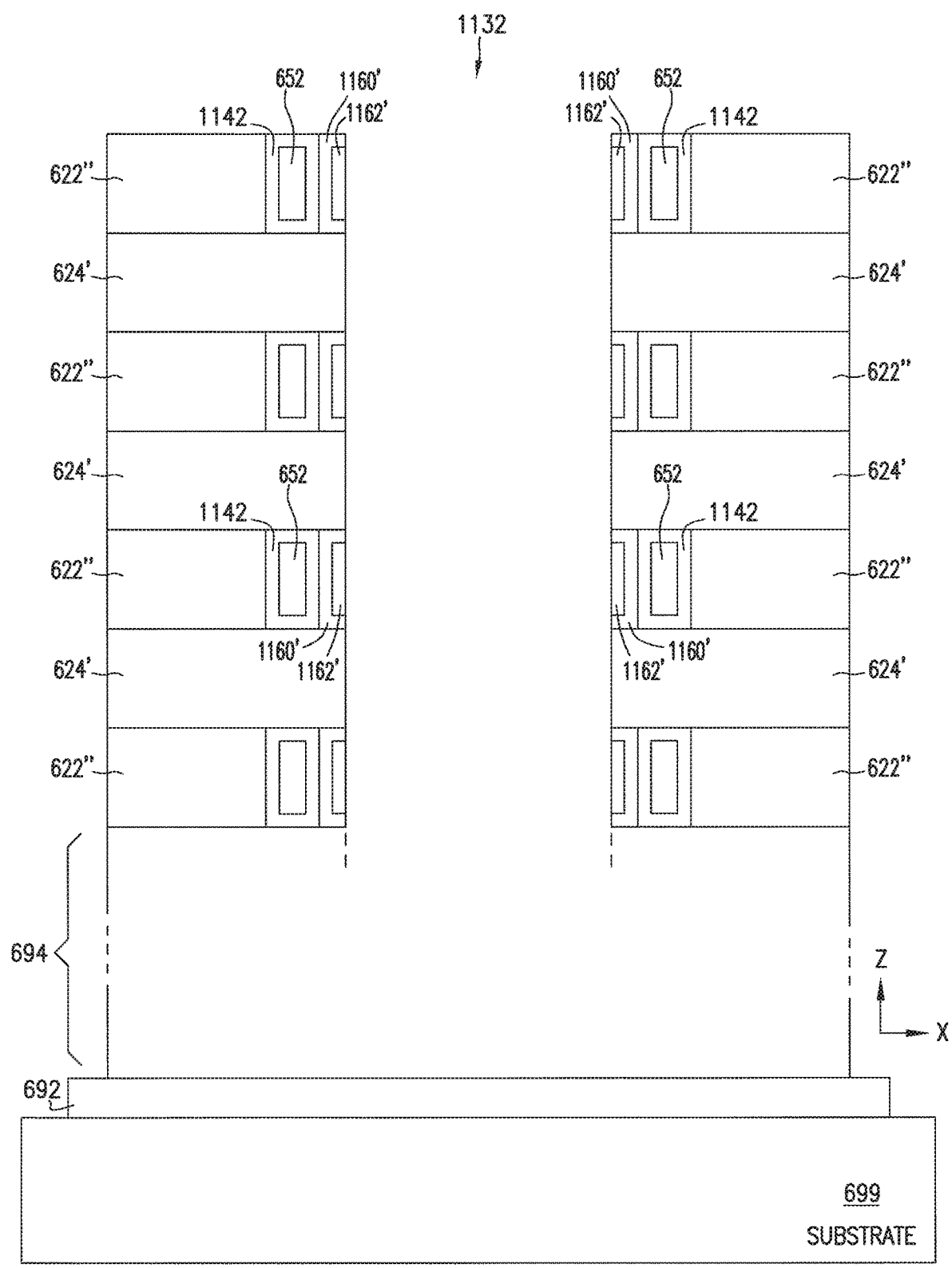
Figure 11K:
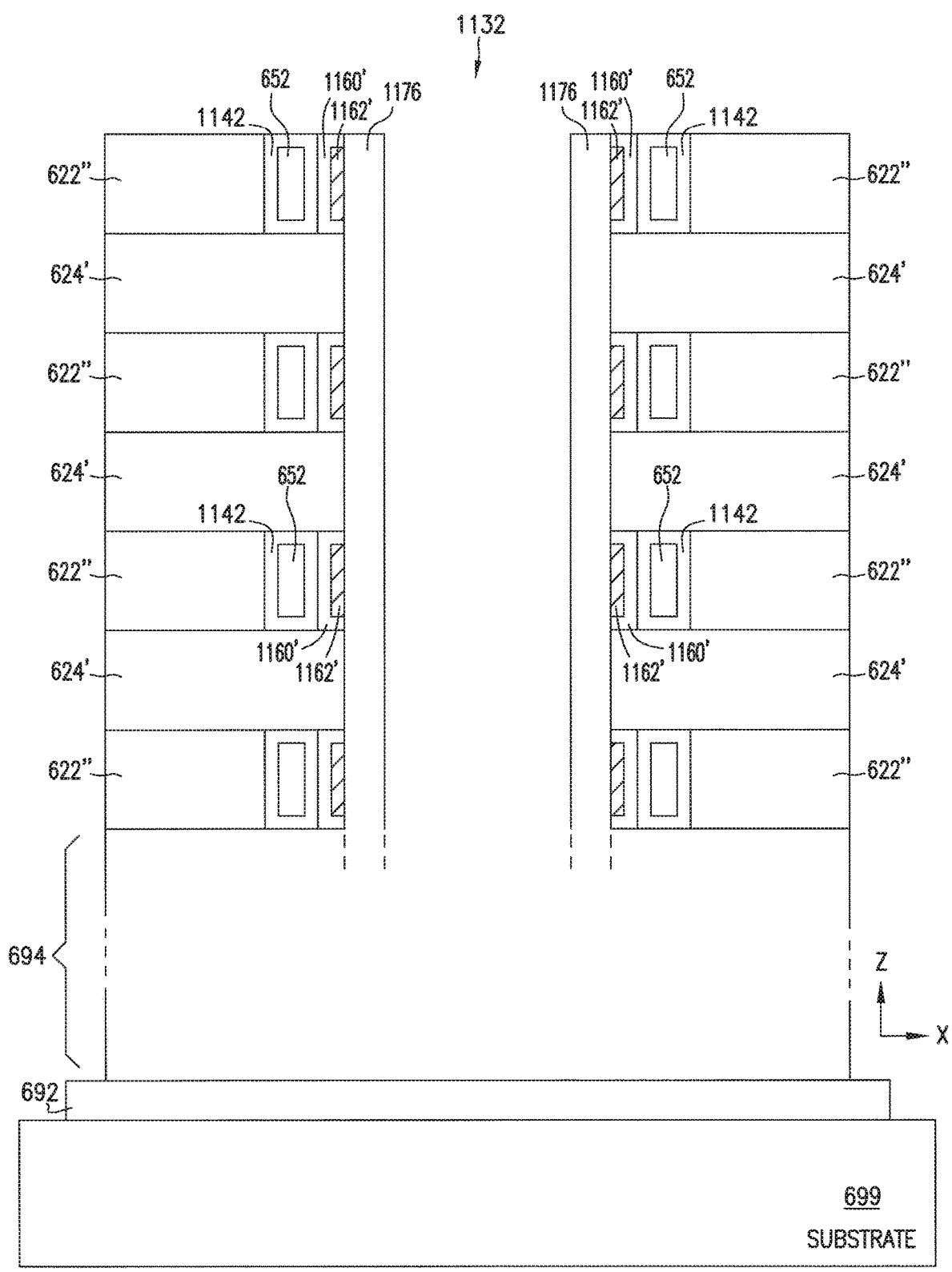
Figure 11L:
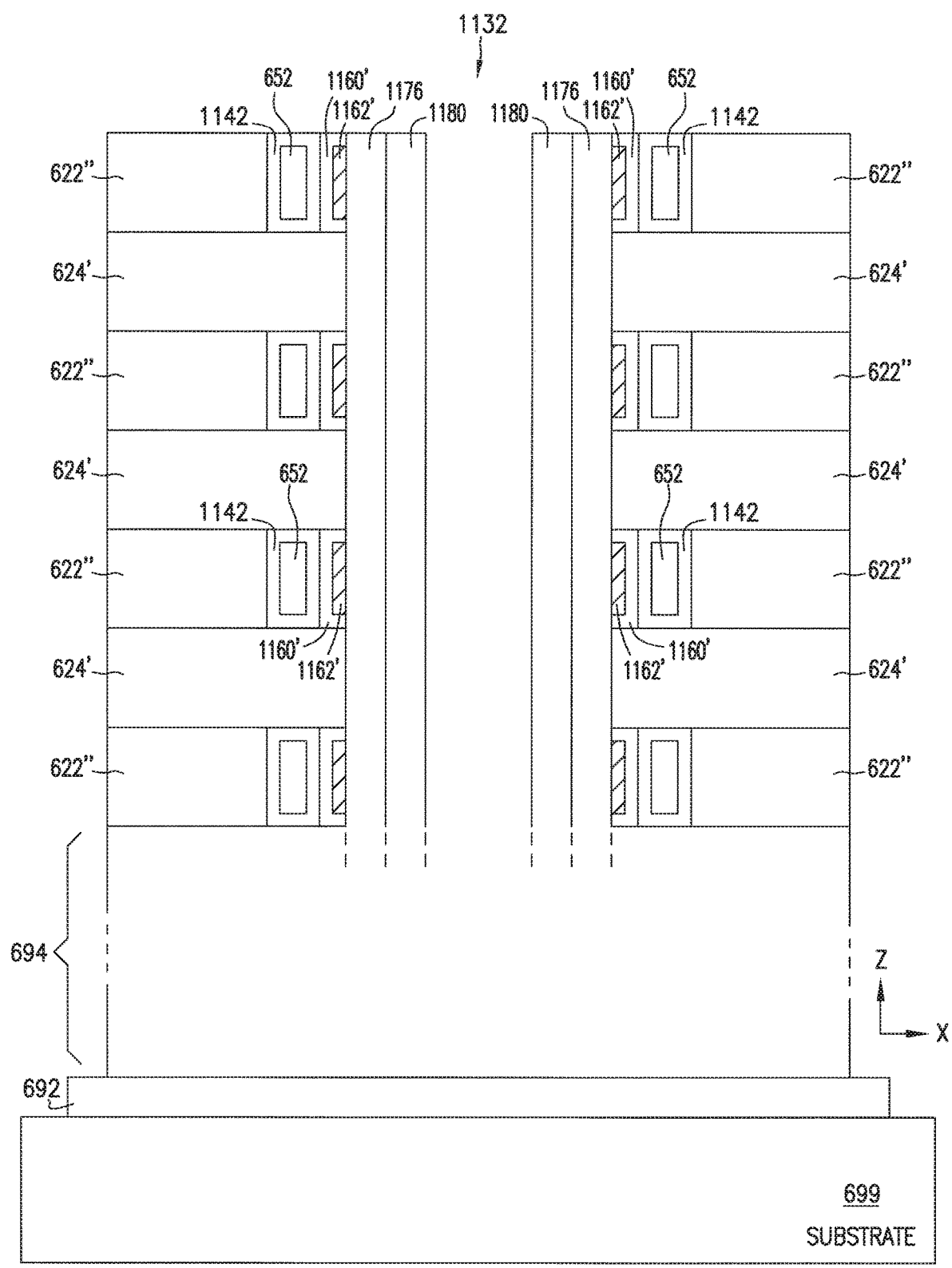
Figure 11M:
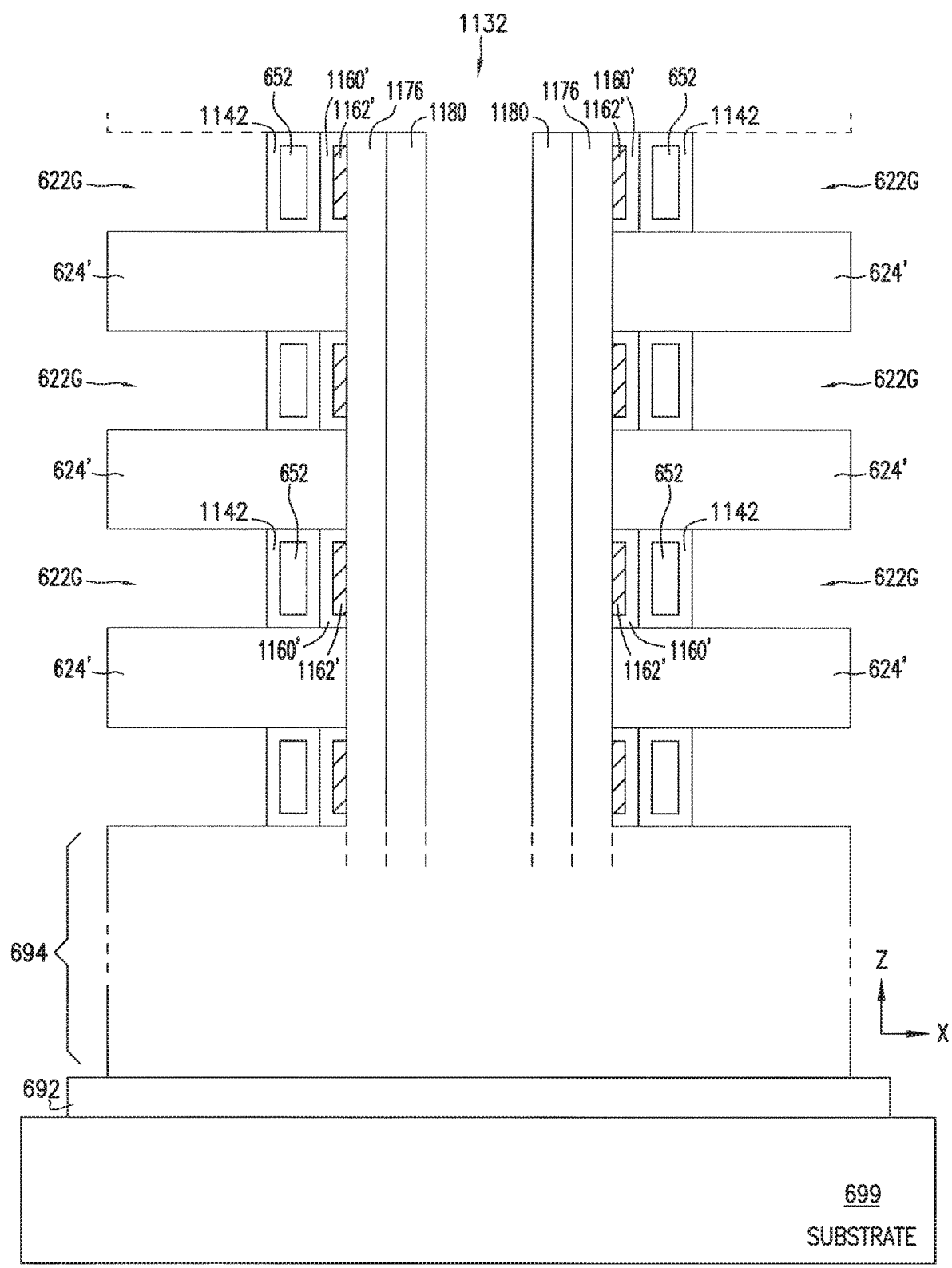
Figure 11N:
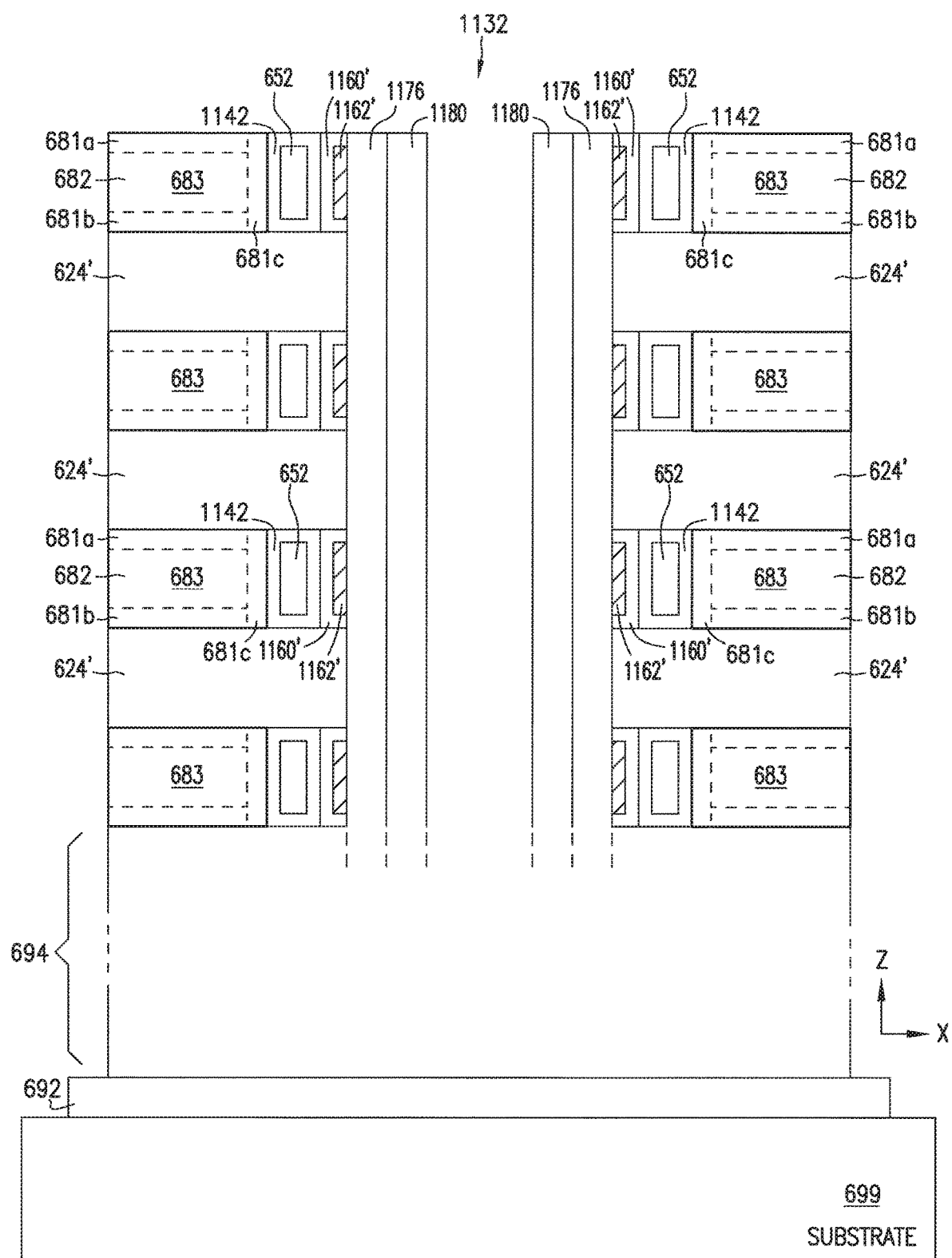
Figure 11O:
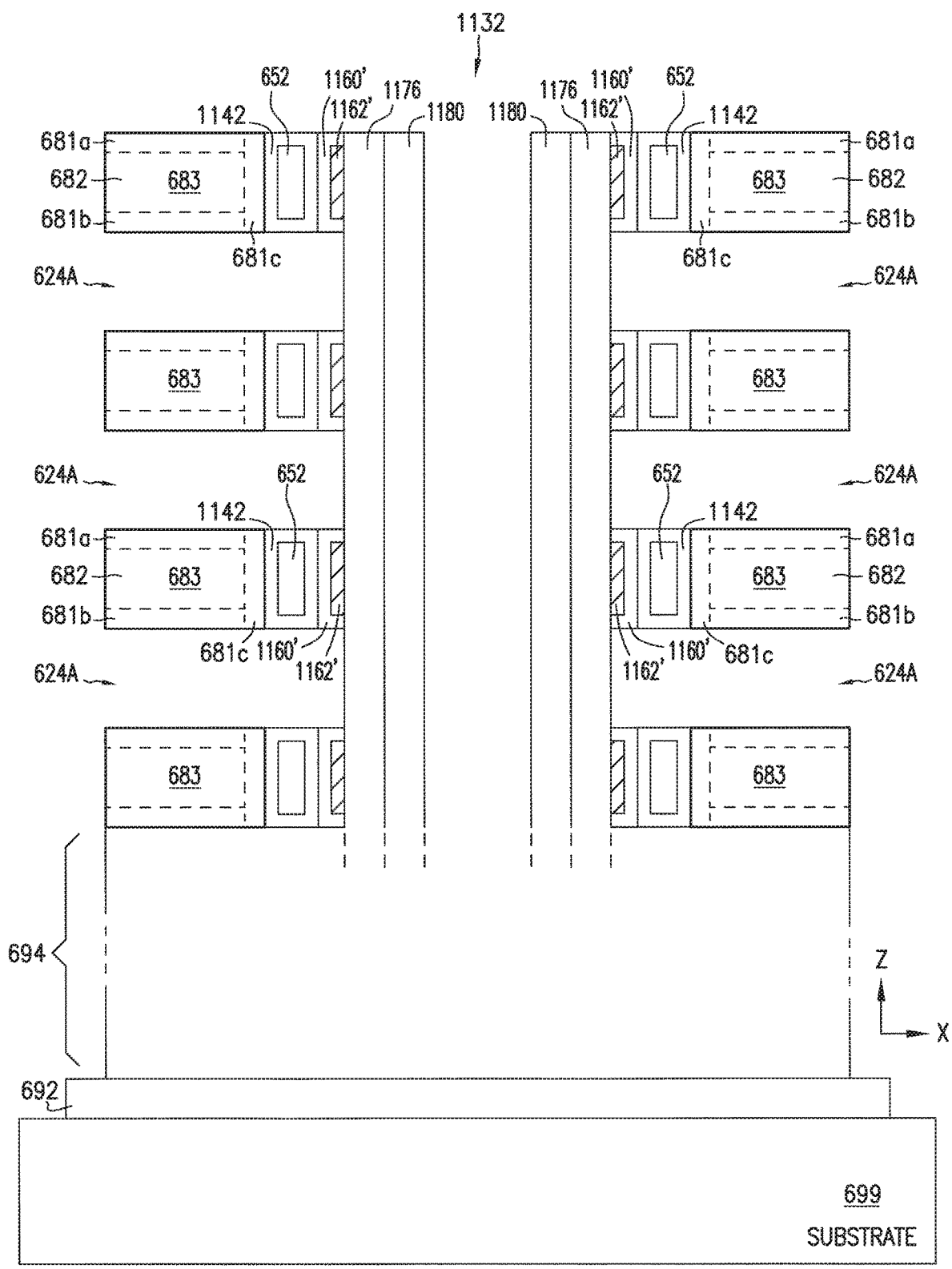
Figure 11P:
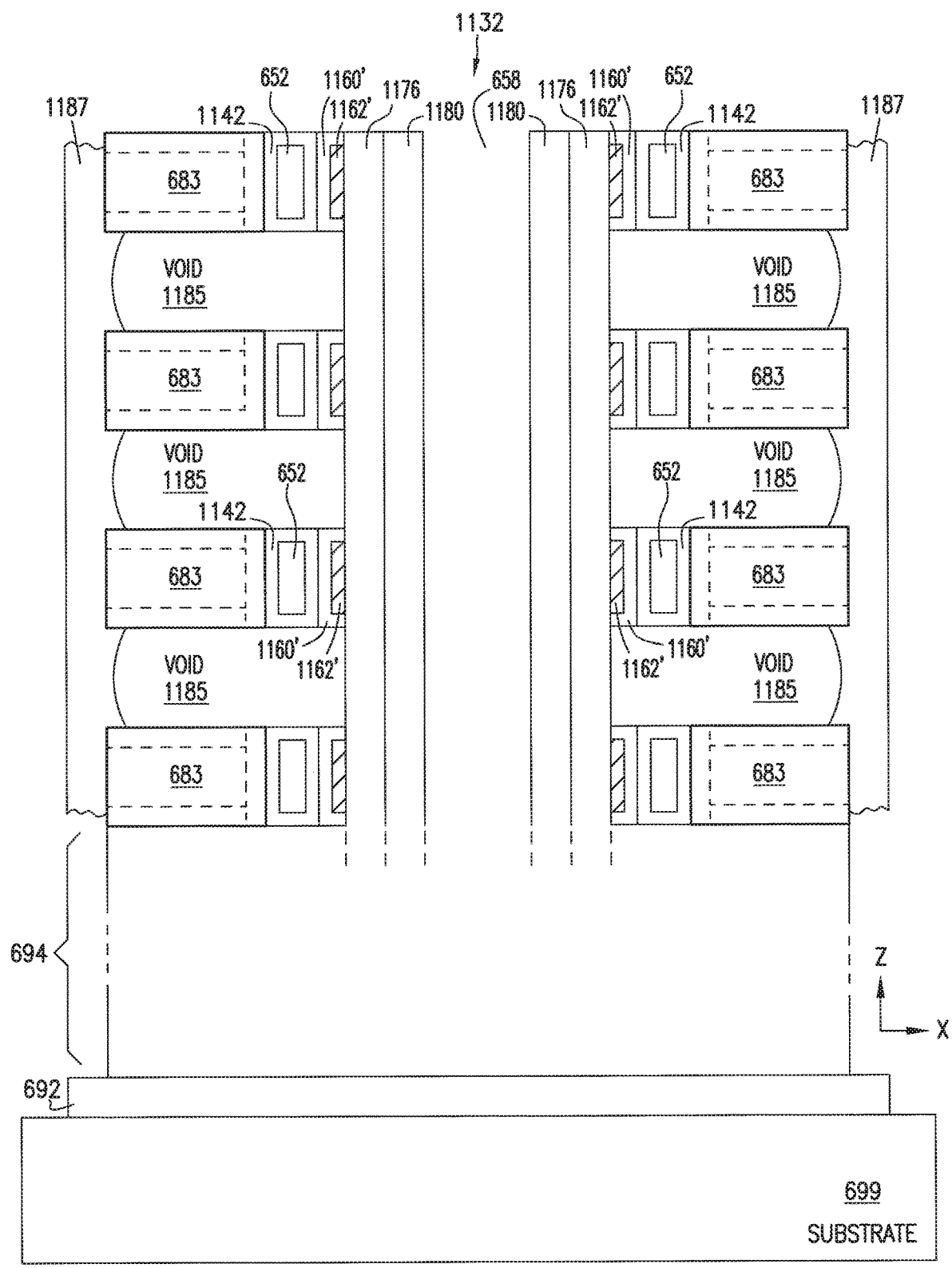

FIG. 11A through FIG. 11P show cross-sectional views of elements during processes of forming a memory device 1100, according to some embodiments described herein. The processes and elements (e.g., materials) for forming memory device 1100 are similar to or identical to processes and elements used to form memory devices 600, 700, 800, 900, and 1100 described above with reference to FIG. 6A through FIG. 6O and FIG. 7A through FIG. 10C. Thus, for simplicity, details of similar or identical processes are not repeated. Also for simplicity, details of similar (or identical) elements (e.g., elements having the same reference labels) between memory device 1100 and memory devices 600, 700, 800, 900, and 1100 (FIG. 6A through FIG. 10C) are not repeated.

FIG. 11A shows memory device 1100 after an opening (e.g., hole) 1132 is formed in dielectric materials 622' and 624' and over portion 694, conductive region (e.g., source region) 692, and substrate 699. As described above, dielectric materials 622' can include an oxide material (e.g., silicon dioxide $SiO_2$), and dielectric materials 624' can include a nitride material (e.g., silicon nitride $SiN_4$).

FIG. 11B shows memory device 1100 after recesses 622R are formed in respective dielectric materials 622'. Forming recesses 622R can include removing a portion of dielectric materials 622' (at the locations of recesses 622R) and leaving a remaining portion of dielectric materials 622" as shown in FIG. 11B. An etch process can be used to remove the portion of dielectric materials 622' (FIG. 11A) to form recesses 622R (FIG. 11B). The etch process can include an atomic layer etching (ALE) process. For comparison purposes, recesses 622R in FIG. 11B are formed by removing a portion of dielectric materials 622' (e.g., silicon dioxide $SiO_2$), whereas recesses 624R in FIG. 6D are formed by removing a portion of dielectric materials 624' (silicon nitride $SiN_4$).

FIG. 11C shows memory device 1100 after a barrier material (or materials) 1140 is formed. A portion of barrier material 1140 can be part of a dielectric barrier for a memory cell of memory device 1100 (as described below in subsequent processes of forming memory device 1100). Similar or identical processes of forming barrier material 640 (FIG. 6E) can be used to form barrier material 1140 of FIG. 11C. Barrier material 1140 can include any of the material (or materials) for barrier material 640 (e.g., high-k dielectric material) described above with reference to FIG. 6E.

FIG. 11D shows memory device 1100 after a blocking material (or materials) 650 (e.g., silicon oxide) is formed in each of recesses 622R. Blocking material 650 can be formed by depositing a dielectric material (e.g., silicon oxide) on barrier material 1140. Then, another process (e.g., an etch process) can be performed to remove (e.g., cut) a portion of the dielectric material (e.g., silicon oxide). The remaining portion of the dielectric material (e.g., silicon oxide) is blocking material 650 in FIG. 11D.

FIG. 11E shows memory device 600 after a dielectric blocking region 652 is formed in each of recesses 622R. Dielectric blocking region 652 in each of recesses 624R can be formed by removing a portion of blocking material 650 (FIG. 11D) in each of recesses 622R.

FIG. 11F shows memory device 1100 after a barrier material 1140' is formed. Barrier material 1140' can include the same material as barrier material 1140. Alternatively, barrier material 1140' can include a dielectric material (e.g., a high-k dielectric material) different from the material of barrier material 1140.

FIG. 11G shows memory device 1100 after dielectric barrier 1142 is formed. Forming dielectric barrier 1142 (e.g., high-k dielectric material) can include removing a portion of barrier material 1140 (FIG. 11F) and a portion of barrier material 1140' (FIG. 11F) leaving a portion of material 1140 and a portion of material 1140' unremoved. The unremoved portions of barrier materials 1140 and 1140' (as shown in FIG. 11G) form dielectric barrier 1142. An ALE process can be used to remove a portion of barrier material 1140 (FIG. 11F) and a portion of material 1140' (FIG. 11F). As shown in FIG. 11G, dielectric barrier 1142 (e.g., high-k dielectric material) can surround dielectric blocking region 652 (e.g., silicon oxide).

FIG. 11H shows memory device 1100 after a material 1160 and a memory material 1162 are formed. Material 1160 can be formed (e.g., by using ALD, CVD, or other processes) before memory material 1162 is formed. Material 1162 can include metal, a metallic compound, or a combination of metals and metallic compounds. Memory material 1162 can be polysilicon or other materials capable of trapping charge to represent the value of information stored in a memory cell that includes memory material 1162. Memory material 1162 can be used to form a memory element of a memory cell of memory device 1100 (as described below in subsequent processes of forming memory device 1100). In an alternative structure of memory device 1100, the process of forming material 1160 can be omitted. Thus, material 1160 may or may not be present in memory device 1100.

FIG. 11I shows memory device 1100 after a portion of memory material 1162 is removed to form a memory element 1162' in each of recesses 622R. Removing the portion of memory material 1162 to form memory element 1162' can include using an etch process. Alternatively, an oxidization process can be used to oxidize a portion of memory material 1162 and leave a portion of memory material 1162 unoxidized. The unoxidized portion of memory material 1162 becomes memory element 1162'. The oxidized portion of memory material 1162 can be removed. Thus, either an etch process or an oxidization process can be used to form the structures of memory element 1162' and material 1160 shown in FIG. 11I.

FIG. 11J shows memory device 1100 after a portion of material 1160 is removed (e.g., by using an etch process), leaving portion of material 1160 unremoved, which is material 1160'. As shown in FIG. 11J, material 1160' can surround the top, the bottom, and a side of memory element 1162'.

FIG. 11K shows memory device 1100 after a tunnel region 1176 is formed. Tunnel region 1176 can include a dielectric material (e.g., silicon oxide). FIG. 11K shows tunnel region 1176 including a single tunnel dielectric (e.g., a layer of silicon oxide) as an example. Alternatively, tunnel region 1176 can include more than one tunnel dielectrics (e.g., more than one different layers of dielectric materials). For example, tunnel region 1176 can include three different tunnel dielectrics (e.g., a dielectric nitride region (e.g., a layer of silicon nitride) sandwiched between two dielectric oxide regions (e.g., two layers of silicon oxide)).

FIG. 11L shows memory device 600 after a channel 1180 is formed. Channel 1180 can be similar to (or identical to) a portion (e.g., portion between levels 202 through 208) of channel 280M of FIG. 2D. Channel 1180 in FIG. 11L includes polysilicon (e.g., undoped to doped polysilicon).

FIG. 11M shows memory device 1100 after dielectric materials 622'' (FIG. 11L) is removed from locations 622G. As described below, gates of memory device 1100 can be formed in locations 622G where dielectric materials 622'' were removed.

FIG. 11N shows memory device 1100 after gates 683 are formed in each of locations 622G. Gates 683 can be formed by similar or identical processes used to form gate 683 (FIG. 6M). As described above, one or more of gate portions 681a, 681b, and 681c can be omitted from gates 683.

FIG. 11O shows memory device 1100 after dielectric materials 624' (FIG. 6M) are removed from locations 624A. As described below, voids of memory device 1100 can be formed in locations 624A where dielectric materials 624' were removed.

FIG. 11P shows memory device 1100 after voids 1185 and sealing dielectric 1187 are formed. Sealing dielectric 1187 may be formed by a process similar to that of the process used to form sealing dielectric 687 (FIG. 6O) of memory device 600. As shown in FIG. 11P, voids 1185 can occupy (e.g., can be located at) locations 624A. Voids 1185 can be formed by intentionally leaving empty spaces at locations 624A (FIG. 11O) after dielectric materials 624' (FIG. 11N) are removed from respective locations 624A (FIG. 11O). Each of voids 1185 (FIG. 11P) contains no conductive material (e.g., metal, conductive polysilicon, or other conductive materials) or no dielectric material (e.g., oxide, nitride, or other dielectric materials). Each of voids 1185 may contain air (an air-filled void) or gas (a gas-filled void). Voids 1185 (FIG. 11P) remain in memory device 1100 after memory device 1100 is completed. FIG. 11P also shows portion 658 of memory device 1100. The process of forming memory device 1100 can include forming (e.g., by using a deposition process) a dielectric material (e.g., silicon oxide) or a conductive material in portion 658. Alternatively, the process of forming memory device 600 may leave portion 658 empty (e.g., not fill portion 658 with a material).

After the structure of memory device 1100 shown in FIG. 11P is formed, additional processes can be used to complete memory device 1100. After completion, memory device 1100 can include elements similar to memory device 100 (FIG. 1) and memory device 200 (FIG. 2A through FIG. 2E).

Figure 12A:
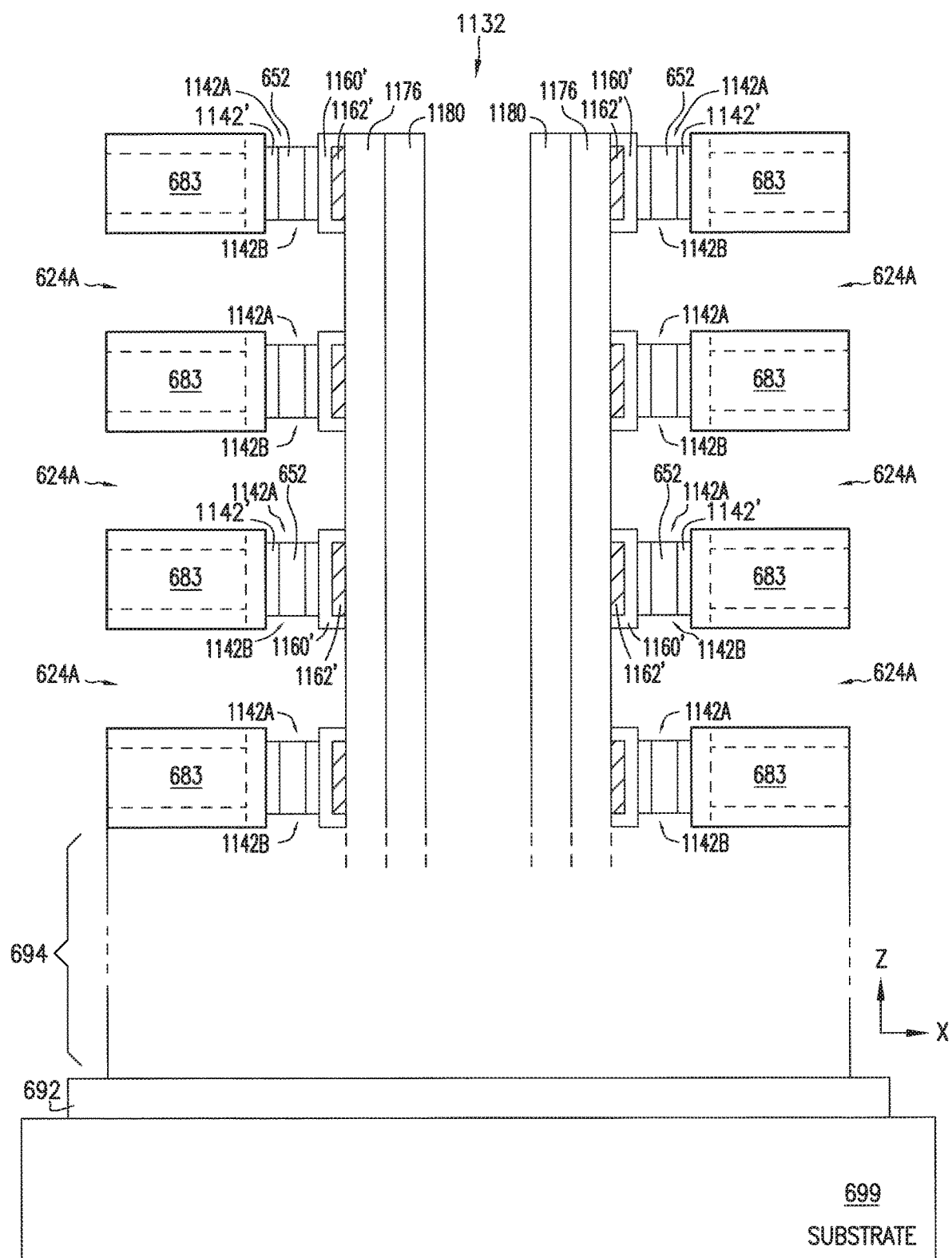
FIG. 12A and FIG. 12B show cross-sectional views of elements during processes of forming a memory device that can be the memory device of FIG. 4B, according to some embodiments of the invention.
Figure 12B:
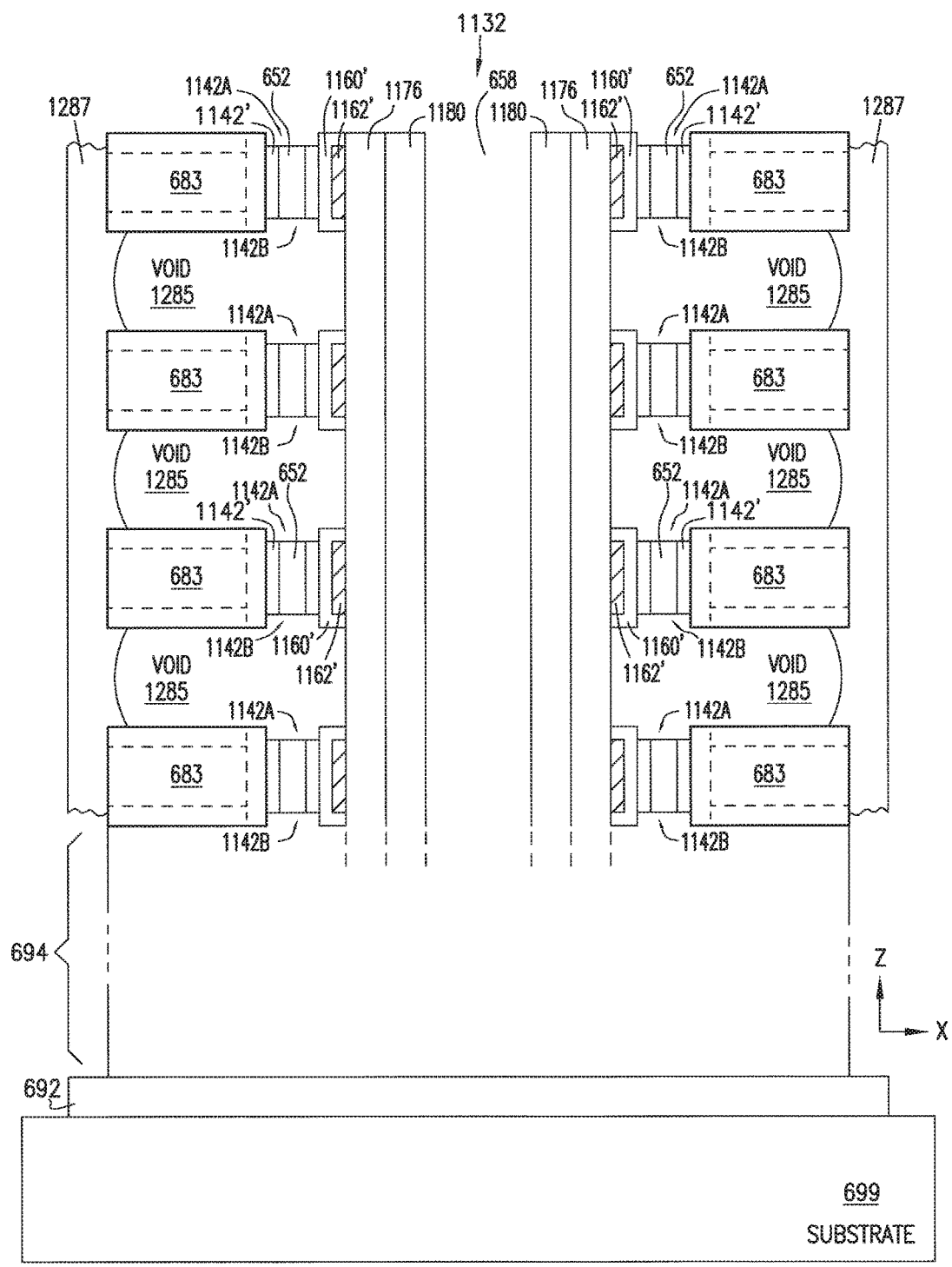

FIG. 12A and FIG. 12B show cross-sectional views of elements during processes of forming memory device 1200, according to some embodiments described herein. Memory device 1200 can be a variation of memory device 1100. Thus, some of the processes (described above with reference to FIG. 11A through FIG. 11P) used to form memory device 1100 can be used to form memory device 1200 of FIG. 12A and FIG. 12B. For example, the elements of FIG. 12A are the same as the elements of FIG. 11O, except for locations 1142A and 1142B in FIG. 12A. In FIG. 12A, dielectric barrier 1142' (e.g., high-k dielectric material) is a remaining (unremoved) portion of dielectric barrier 1142 (e.g., high-k dielectric material) of FIG. 11O after a portion of dielectric barrier 1142 has been removed from locations 1142A and 1142B. Removing a portion of dielectric barrier 1142 from locations 1142A and 1142B can include etching (e.g., using an ALE process) a portion of dielectric barrier 1142 at locations 1142A and 1142B selective to other elements next to locations 1142A and 1142B (e.g., gate 683, dielectric blocking region 652, material 1160', memory element 1162', and tunnel region 1176).

FIG. 12B shows memory device 1100 after voids 1285 and sealing dielectric 1287 are formed. Sealing dielectric 1287 may be formed by a process similar to that of the process used to form sealing dielectric 1187 (FIG. 11P) of memory device 1100.

As shown in FIG. 12B, voids 1285 can occupy (e.g., can be located at) locations 624A, 1142A, and 1142B (labeled in FIG. 12A). Voids 1285 can be formed by intentionally leaving empty spaces at locations 624A, 1142A, and 1142B after dielectric materials 624' (e.g., silicon nitride), and a portion of dielectric barrier 1142 (e.g., high-k dielectric material) are removed from respective locations 624A, 1142A, and 1142B. Each of voids 1285 (FIG. 12B) contains no conductive material (e.g., metal, conductive polysilicon, or other conductive materials) or no dielectric material (e.g., oxide, nitride, or other dielectric materials). Each of voids

1285 may contain air (an air-filled void) or gas (a gas-filled void). Voids 1285 (FIG. 12B) remain in memory device 1200 after memory device 1200 is completed.

After the structure of memory device 1200 shown in FIG. 12B is formed, additional processes can be used to complete memory device 1200. After completion, memory device 1200 can include elements similar to memory device 100 (FIG. 1) and memory device 200 (FIG. 2A through FIG. 2E).

As shown in FIG. 12B, memory device 1200 includes elements that are similar to or identical to memory device 400B (FIG. 4B). Thus, the processes used to form memory device 1200 can also be used to form memory device 400B.

Figure 13:
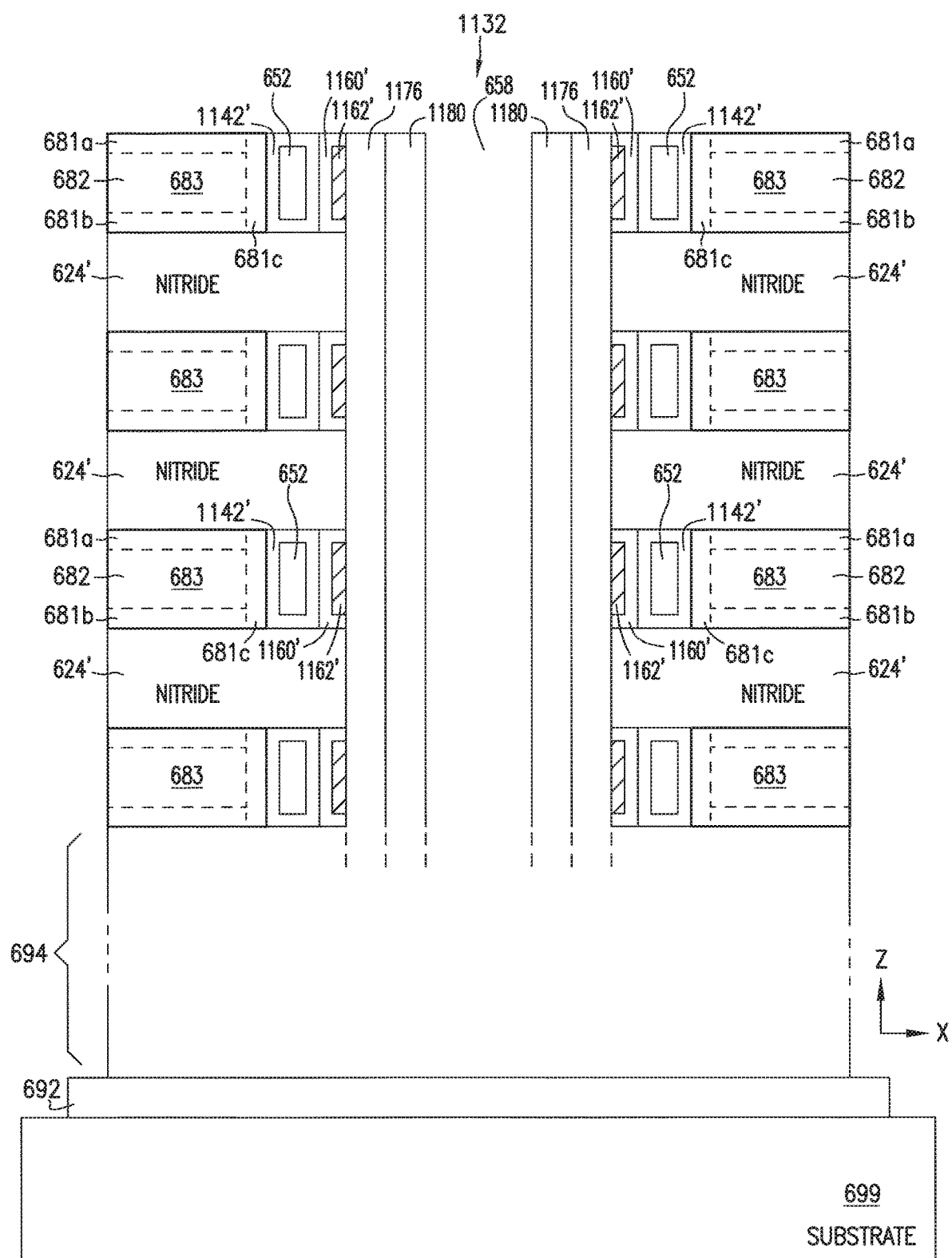
FIG. 13 shows cross-sectional views of elements during processes of forming a memory device that can be the memory device of FIG. 5A, according to some embodiments of the invention.

FIG. 13 shows cross-sectional views of elements during processes of forming memory device 1300, according to some embodiments described herein. Memory device 1300 can be a variation of memory device 1100 of FIG. 11P. Thus, some of the processes (e.g., the process described above with reference to FIG. 11A through FIG. 11N) used to form memory device 1100 can be used to form memory device 1300 of FIG. 13. For example, the elements of memory device 1300 in FIG. 13 are the same as the elements of memory device 1100 of FIG. 11N. As shown in FIG. 13, memory device 1300 has no voids. Thus, the process of forming voids (e.g., voids 1185 in FIG. 11P) can be omitted from the processes of forming memory device 1300. After the structure of memory device 1300 shown in FIG. 13 is formed, additional processes can be used to complete memory device 1300. After completion, memory device 1300 can include elements similar to memory device 100 (FIG. 1) and memory device 200 (FIG. 2A through FIG. 2E, except for voids). As shown in FIG. 13, memory device 1300 includes elements that are similar to or identical to memory device 500A (FIG. 5A). Thus, the processes used to form memory device 1300 can also be used to form memory device 500A.

Figure 14:
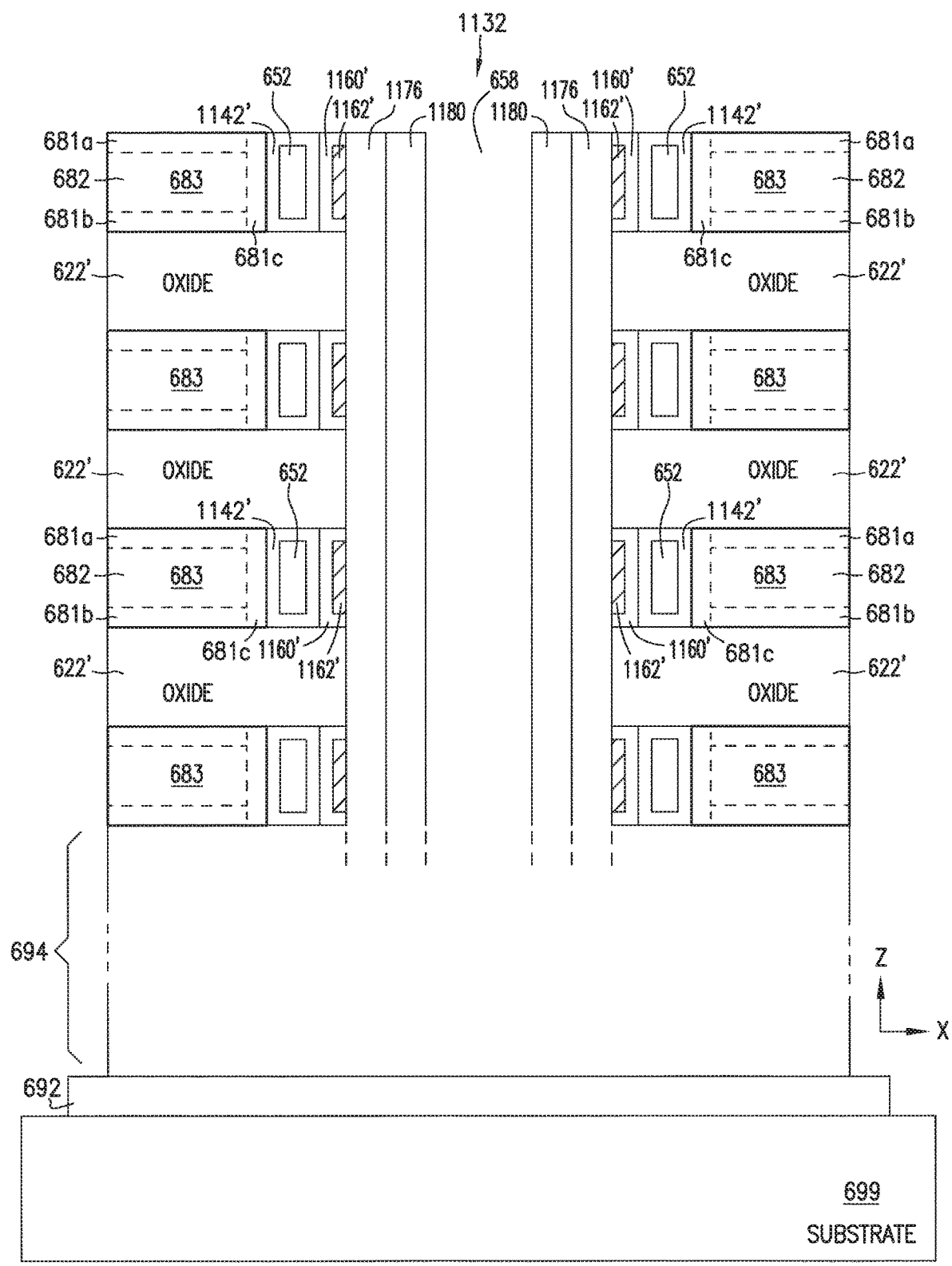
FIG. 14 shows cross-sectional views of elements during processes of forming a memory device that can be the memory device of FIG. 5B, according to some embodiments of the invention.

FIG. 14 shows cross-sectional views of elements during processes of forming memory device 1400, according to some embodiments described herein. Memory device 1400 can be a variation of memory device 1300 of FIG. 13. Thus, some of the processes (e.g., the process described above with reference to FIG. 11A through FIG. 11N) used to form memory device 1100 can be used to form memory device 1400 of FIG. 14. For example, the elements of memory device 1400 in FIG. 14 are the same as the elements of memory device 1100 of FIG. 11N except that memory device 1400 has no voids. Thus, the process of forming voids (e.g., voids 1185 in FIG. 11P) can be omitted from the processes of forming memory device 1400. Further, as shown in FIG. 14, memory device 1400 can include dielectric materials 622' (e.g., silicon oxide), whereas memory device 1100 in the processes associated with FIG. 11N include dielectric material 624' (e.g., silicon nitride). Thus, forming memory device 1400 can include the processes of forming memory device 1100 with a modification. For example, memory cell structures and gates 683 of memory device 1400 can be formed in the levels where dielectric materials 624 (e.g., silicon nitride, which can be similar to dielectric materials 624' in FIG. 11A) were formed. Thus, as shown in FIG. 14, dielectric materials 622' (e.g., silicon oxide) can be a remaining portion of dielectric materials 622 (e.g., silicon oxide, which can be similar to dielectric materials 622' in FIG. 11A).

In FIG. 14, after the structure of memory device 1400 shown in FIG. 14 is formed, additional processes can be used to complete memory device 1400. After completion, memory device 1400 can include elements similar to memory device 100 (FIG. 1) and memory device 200 (FIG. 2A through FIG. 2E, except for voids). As shown in FIG. 14, memory device 1400 includes elements that are similar to or identical to memory device 500B (FIG. 5B). Thus, the processes used to form memory device 1400 can also be used to form memory device 500B.

Figure 15:
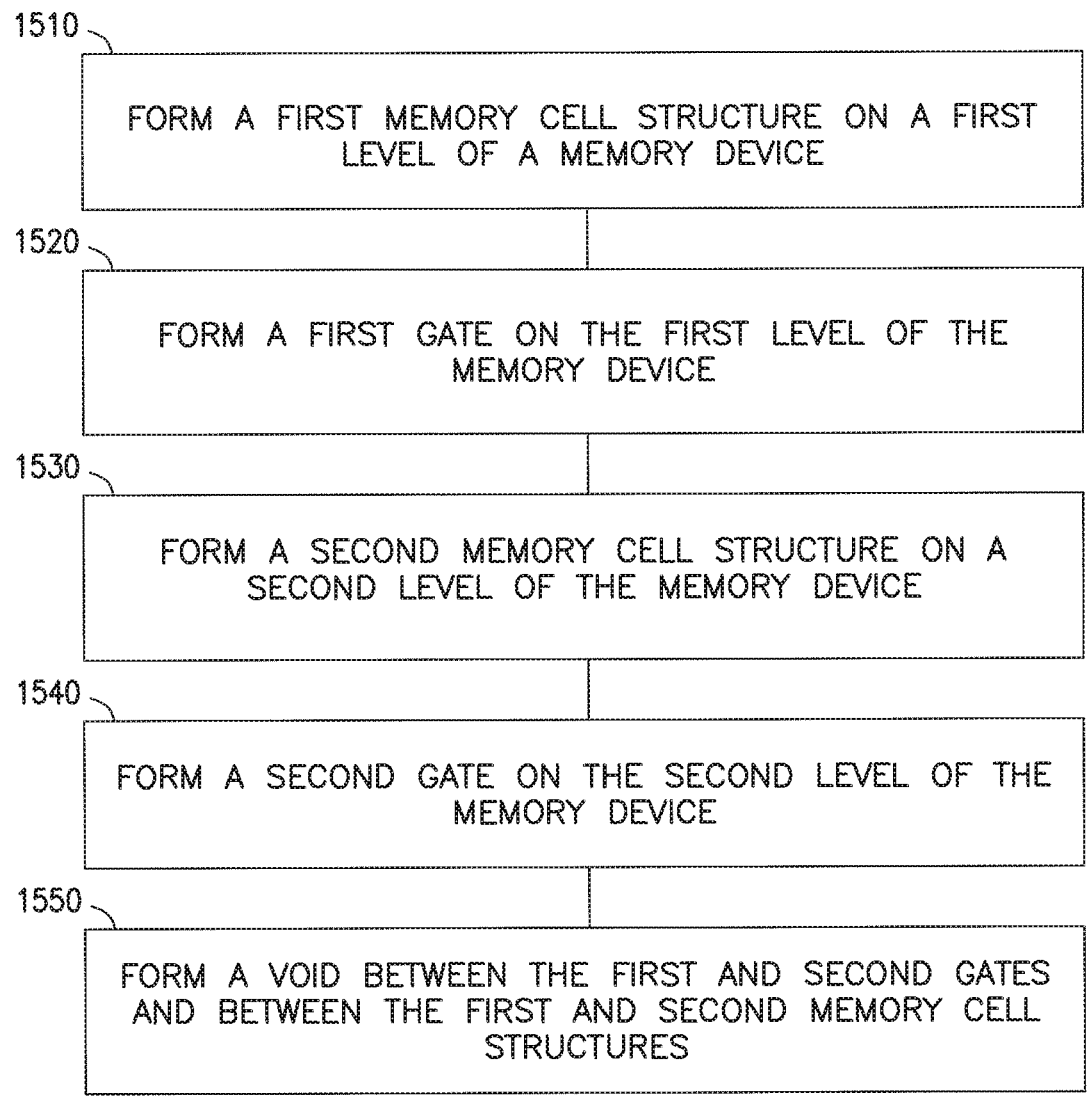
FIG. 15 is a flow chart showing processes of forming a memory device including voids between gates and between memory cell structures, according to some embodiments described herein.

FIG. 15 is a flow chart showing a method 1500 of forming a memory device, according to some embodiments described herein. Method 1500 can be used to form the memory devices described above with reference to FIG. 1 through FIG. 14. As shown in FIG. 15, activity 1510 of method 1500 can include forming a first memory cell structure on a first level of a memory device. Activity 1520 can include forming a first gate on the first level of the memory device. Activity 1530 can include forming a second memory cell structure on a second level of the memory device. Activity 1540 can include forming a second gate on the second level of the memory device. Activity 1550 can include forming a void between the first and second gate and between the first and second memory cell structures.

Method 1500 described above can include fewer or more activities relative to activities 1510, 1520, 1530, 1540, and 1550 shown in FIG. 15. For example, method 1500 can include processes of forming the memory devices described above with reference to FIG. 2A through FIG. 14.

The illustrations of apparatuses (e.g., memory devices 100, 200, 300A, 300B, 300C, 300D, 300E, 400A, 400B, 500A, 500B, 600, 700, 800, 900, 1000, 1100, 1200, 1300, and 1400) and methods (e.g., processes associated with forming memory devices 200, 300A, 300B, 300C, 300D, 300E, 400A, 400B, 500A, 500B, 600, 700, 800, 900, 1000, 1100, 1200, 1300, and 1400, and method 1500) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 300A, 300B, 300C, 300D, 300E, 400A, 400B, 500A, 500B, 600, 700, 800, 900, 1000, 1100, 1200, 1300, and 1400) or a system (e.g., a computer, a cellular phone, or other electronic systems) that includes a device such as any of memory devices 100, 200, 300A, 300B, 300C, 300D, 300E, 400A, 400B, 500A, 500B, 600, 700, 800, 900, 1000, 1100, 1200, 1300, and 1400.

Any of the components described above with reference to FIG. 1 through FIG. 15 can be implemented in a number of ways, including simulation via software. Thus, apparatuses, e.g., memory devices 100, 200, 300A, 300B, 300C, 300D, 300E, 400A, 400B, 500A, 500B, 600, 700, 800, 900, 1000, 1100, 1200, 1300, and 1400, or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 300A, 300B, 300C, 300D, 300E, 400A, 400B, 500A, 500B, 600, 700, 800, 900, 1000, 1100, 1200, 1300, and 1400 may be included in apparatuses (e.g., electronic circuitry) such as high-speed computers, communication and signal processing circuitry, single- or multi-processor modules, single or multiple embedded processors, multicore processors, message information switches, and application-specific modules including multi-layer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 15 include apparatuses, and methods of forming the apparatuses. One of the apparatuses includes a channel to conduct current, the channel including a first channel portion and a second channel portion, a first memory cell structure located between a first gate and the first channel portion, a second memory cell structure located between a second gate and the second channel portion, and a void located between the first and second gates and between the first and second memory cell structures. Other embodiments including additional apparatuses and methods are described.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A method comprising:
   forming a first memory cell structure on a first level of a memory device;
   forming a first gate on the first level of the memory device;
   forming a second memory cell structure on a second level of the memory device;
   forming a second gate on the second level of the memory device; and
   forming a void between the first and second gates and between the first and second memory cell structure, wherein forming the first memory cell structure includes:
      forming an opening through a first dielectric material, a second dielectric material, and a third dielectric material, the second dielectric material being between the first and third dielectric materials, and the second dielectric material including silicon nitride;
      forming a recess in the second dielectric material; and
      forming a portion of the first memory cell structure in the recess.

2. A method comprising:
   forming a first memory cell structure on a first level of a memory device;
   forming a first gate on the first level of the memory device;
   forming a second memory cell structure on a second level of the memory device;
   forming a second gate on the second level of the memory device; and
   forming a void between the first and second gates and between the first and second memory cell structures wherein forming the first memory cell structure includes:
      forming an opening through a first dielectric material, a second dielectric material, and a third dielectric material the second dielectric material being between the first and third dielectric materials;
      forming a recess in the second dielectric material; and
      forming a portion of the first memory cell structure in the recess, and, wherein forming the portion of the first memory cell structure includes forming a dielectric material in the recess, the dielectric material having a dielectric constant at least equal to a dielectric constant of aluminum oxide.

3. The method of claim 2, wherein forming the dielectric material in the recess includes depositing the dielectric material through the opening.

4. The method of claim 2, wherein forming the portion of the first memory cell structure includes forming a memory element in the recess after the dielectric material is formed, and the memory element is an additional dielectric material.

5. The method of claim 2, wherein forming the portion of the first memory cell structure includes forming a memory element in the recess after the dielectric material is formed, and the memory element is polysilicon.

6. The method of claim 5, wherein forming the portion of the first memory cell structure includes forming a metal in the recess after the dielectric material is formed and before the memory element is formed.

7. A method comprising:
   forming a first memory cell structure on a first level of a memory device;
   forming a first gate on the first level of the memory device;
   forming a second memory cell structure on a second level of the memory device;
   forming a second gate on the second level of the memory device; and
   forming a void between the first and second gates and between the first and second memory cell structures, wherein forming the first and second memory cell structures and the first and second gates includes:
      forming an opening through a first dielectric material, a second dielectric material, and a third dielectric material, the second dielectric material being between the first and third dielectric materials;
forming a first recess in the first dielectric material;
forming a second recess in the third dielectric material;
forming a dielectric material in each of first and second recesses, the dielectric material having a dielectric constant at least equal to a dielectric constant of aluminum oxide;
removing a portion of the dielectric material and leaving a first remaining portion of the dielectric material in the first recess, and a second remaining portion of the dielectric material in the second recess, wherein,
the first remaining portion of the dielectric material is part of the first memory cell structure;
the second remaining portion of the dielectric material is part of the second memory cell structure; and
forming the first and second gates after the portion of the dielectric material is removed.

8. The method of claim 7, wherein forming the dielectric material in each of first and second recesses includes depositing the dielectric material in each of first and second recesses through the opening.

9. A method comprising:
forming a channel having a length extending in a direction perpendicular to a substrate, the channel including a first channel portion and a second channel portion;
forming a first memory cell structure including forming a first dielectric barrier, such that the first dielectric barrier has a length extending in the direction perpendicular to the substrate;
forming a first gate contacting the first dielectric barrier, such that the first memory cell structure is between the first gate and the first channel portion, wherein the first gate is formed to have a thickness extending in the direction perpendicular to the substrate, and the length of the first dielectric barrier is at most equal to the thickness of the first gate;
forming a second memory cell structure including forming a second dielectric barrier, such that the second dielectric barrier has a length extending in the direction perpendicular to the substrate; and
forming a second gate contacting the second dielectric barrier, such that the second memory structure is between the second gate and the second channel portion, wherein the second gate is formed to have a thickness extending in the direction perpendicular to the substrate, and the length of the second dielectric barrier is at most equal to the thickness of the second gate, wherein forming the first and second dielectric barriers includes:
forming an opening through a first dielectric material, a second dielectric material, and a third dielectric material, the second dielectric material being between the first and third dielectric materials, and each of the first and third dielectric materials including silicon nitride;
forming a first recess in the first dielectric material;
forming a second recess in the third dielectric material;
forming the first dielectric barrier in the first recess; and
forming the second dielectric barrier in the second recess.

10. The method of claim 9, further comprising:
forming a sealing material between the first and second gates, such that a void is between the sealing material and the channel.

11. A method comprising:
forming a channel having a length extending in a direction perpendicular to a substrate, the channel including a first channel portion and a second channel portion;
forming a first memory cell structure including forming a first dielectric barrier, such that the first dielectric barrier has a length extending in the direction perpendicular to the substrate;
forming a first gate contacting the first dielectric barrier, such that the first memory cell structure is between the first gate and the first channel portion, wherein the first gate is formed to have a thickness extending in the direction perpendicular to the substrate, and the length of the first dielectric barrier is at most equal to the thickness of the first gate;
forming a second memory cell structure including forming a second dielectric barrier, such that the second dielectric barrier has a length extending in the direction perpendicular to the substrate; and
forming a second gate contacting the second dielectric barrier, such that the second memory structure is between the second gate and the second channel portion, wherein the second gate is formed to have a thickness extending in the direction perpendicular to the substrate, and the length of the second dielectric barrier is at most equal to the thickness of the second gate, wherein forming the first and second dielectric barriers includes:
forming an opening through a first dielectric material, a second dielectric material, and a third dielectric material, the second dielectric material being between the first and third dielectric materials;
forming a first recess in the first dielectric material;
forming a second recess in the third dielectric material;
forming the first dielectric barrier in the first recess; and
forming the second dielectric barrier in the second recess, wherein forming the first and second dielectric barriers includes depositing a dielectric material in each of the first and second recesses, the dielectric material having a dielectric constant at least equal to a dielectric constant of aluminum oxide.

12. The method of claim 11, wherein forming the first and second memory cell structures includes forming a memory element in each of the first and second recesses after the dielectric material is formed, and the memory element is an additional dielectric material.

13. The method of claim 11, wherein forming the first and second memory cell structures includes forming a memory element in each of the first and second recesses after the dielectric material is formed, and the memory element is polysilicon.

14. A method comprising:
forming an opening through a first dielectric material, a second dielectric material, and a third dielectric material, the second dielectric material being between the first and third dielectric materials;
forming a first recess in the first dielectric material;
forming a second recess in the third dielectric material;
forming a dielectric material in each of first and second recesses, the dielectric material having a dielectric constant at least equal to a dielectric constant of aluminum oxide;
removing a portion of the dielectric material and leaving a first remaining portion of the dielectric material in the first recess, and a second remaining portion of the dielectric material in the second recess;
forming a memory element in each of the first and second recesses;

forming a first metal gate contacting the first remaining portion of the dielectric material; and forming a second metal gate contacting the second remaining portion of the dielectric material.

15. The method of claim 14, wherein forming the memory element in each of the first and second recesses includes:

forming a material in each of the first and second recesses; and removing a portion of the material and leaving a first remaining portion of the material in the first recess, and a second remaining portion of the material in the second recess, wherein the first remaining portion of the material is part of the first memory element, and the second remaining portion of the material is part of the second memory element.

16. The method of claim 15, wherein removing the portion of the material is performed before removing the portion of the dielectric material is performed.

17. The method of claim 15, wherein removing the portion of the material is performed after removing the portion of the dielectric material is performed.

18. The method of claim 14, wherein forming the first and second metal gates includes:

removing a portion of the first dielectric material at a first location to expose the first remaining portion of the dielectric material at the first location;

removing a portion of the third dielectric material at a second location to expose the second remaining portion of the dielectric material at the second location;

forming a first conductive material at the first location, such that the first conductive material contacts the first remaining portion of the dielectric material, wherein the first conductive material is part of the first metal gate; and forming a second conductive material at the second location, such that the second conductive material contacts the second remaining portion of the dielectric material, wherein the second conductive material is part of the second metal gate.

* * * * *